United States Patent
Hase et al.

(10) Patent No.: US 11,955,931 B2
(45) Date of Patent: Apr. 9, 2024

(54) POWER AMPLIFIER UNIT

(71) Applicant: Murata Manufacturing Co., Ltd., Kyoto-fu (JP)

(72) Inventors: Masatoshi Hase, Nagaokakyo (JP); Mitsunori Samata, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 8 days.

(21) Appl. No.: 18/045,134

(22) Filed: Oct. 7, 2022

(65) Prior Publication Data

US 2023/0053456 A1 Feb. 23, 2023

Related U.S. Application Data

(63) Continuation of application No. PCT/JP2021/015087, filed on Apr. 9, 2021.

(30) Foreign Application Priority Data

Apr. 10, 2020 (JP) ................................ 2020-071307

(51) Int. Cl.
*H03F 1/08* (2006.01)
*H03F 1/26* (2006.01)
*H03F 1/56* (2006.01)

(52) U.S. Cl.
CPC ............... *H03F 1/083* (2013.01); *H03F 1/26* (2013.01); *H03F 1/56* (2013.01)

(58) Field of Classification Search
CPC ............... H03F 1/083; H03F 1/26; H03F 1/56
See application file for complete search history.

(56) References Cited

U.S. PATENT DOCUMENTS 9,083,282 B2 * 7/2015 Zhang ...................... H03F 3/21
9,294,056 B2 * 3/2016 Nobbe .................... H03F 3/195
(Continued)

FOREIGN PATENT DOCUMENTS

JP H04-183008 A 6/1992
JP H07-86851 A 3/1995
(Continued)

OTHER PUBLICATIONS

International Search Report issued in PCT/JP2021/015087; dated Jul. 13, 2021.

*Primary Examiner* — David B Lugo
(74) *Attorney, Agent, or Firm* — Studebaker & Brackett PC

(57) ABSTRACT

A power amplifier unit includes a power amplifier circuit that amplifies a radio-frequency input signal, a first impedance matching circuit that performs impedance matching for an output signal of the power amplifier circuit, a second-order harmonic termination circuit on an output side of the first impedance matching circuit and that reflects at least part of even-ordered and odd-ordered harmonics contained in a signal input from the first impedance matching circuit to output the at least part of the harmonics from an input terminal as a radio-frequency signal and outputs a radio-frequency signal containing a fundamental and the remainder of the harmonics from an output terminal, and a filter that is on a subsequent stage of the second-order harmonic termination circuit, that attenuates at least part of the even-ordered and odd-ordered harmonics, and that outputs a radio-frequency signal including the fundamental and the remainder of the even-ordered and odd-ordered harmonics.

20 Claims, 54 Drawing Sheets

(56) References Cited

U.S. PATENT DOCUMENTS

| | | | |
|---|---|---|---|
| 9,882,587 B2 | 1/2018 | Feng et al. | |
| 2002/0105384 A1* | 8/2002 | Dent | H03H 7/1758 |
| | | | 330/306 |
| 2007/0290769 A1* | 12/2007 | Stuebing | H03H 9/0014 |
| | | | 333/189 |
| 2018/0083583 A1* | 3/2018 | Tsutsui | H03F 3/72 |

FOREIGN PATENT DOCUMENTS

| | | |
|---|---|---|
| JP | 2008-244521 A | 10/2008 |
| JP | 2016-149751 A | 8/2016 |
| JP | 2017-195536 A | 10/2017 |
| JP | 2020-038957 A | 3/2020 |

\* cited by examiner

POWER AMPLIFIER UNIT

CROSS-REFERENCE TO RELATED APPLICATIONS

This application claims benefit of priority to International Patent Application No. PCT/JP2021/015087, filed Apr. 9, 2021, and to Japanese Patent Application No. 2020-071307, filed Apr. 10, 2020, the entire contents of each are incorporated herein by reference.

BACKGROUND

Technical Field

The present disclosure relates to a power amplifier unit.

Background Art

U.S. Pat. No. 9,882,587 describes a technology for implementing the broadband operation of a radio-frequency power amplifier circuit used in a power amplifier unit. In U.S. Pat. No. 9,882,587, a programmable harmonic termination circuit is provided between an output terminal of an output stage and an output matching circuit. In U.S. Pat. No. 9,882,587, harmonics are reflected, and reflected wave components of the harmonics are superposed on a fundamental.

SUMMARY

In U.S. Pat. No. 9,882,587, since the harmonic termination circuit is connected to a terminal with a low impedance (for example, several ohms), it is difficult to increase the amplitude of reflected wave components of harmonics due to the internal resistance of switches of the programmable harmonic termination circuit, so it is difficult to implement the broadband operation. Therefore, there is room for improvement in implementing the broadband operation by increasing the amplitude of reflected wave components of harmonics.

The present disclosure is made in view of the above situation, and provides a power amplifier unit capable of implementing the broadband operation of a radio-frequency power amplifier circuit.

Therefore, a power amplifier unit according to an aspect of the present disclosure includes a power amplifier circuit that has a first input terminal and a first output terminal, wherein the power amplifier circuit amplifies a first radio-frequency signal containing a fundamental and input to the first input terminal and outputs a second radio-frequency signal, containing the fundamental, an even-ordered harmonic, and an odd-ordered harmonic, from the first output terminal. The power amplifier unit also includes a first impedance matching circuit that has a second input terminal and a second output terminal, wherein the second input terminal is connected to the first output terminal of the power amplifier circuit, the first impedance matching circuit outputs the second radio-frequency signal, input to the second input terminal, from the second output terminal as a third radio-frequency signal and converts an impedance between the second input terminal and the second output terminal. The power amplifier unit further includes a harmonic termination circuit that has a third input terminal and a third output terminal, wherein the third input terminal is connected to the second output terminal of the first impedance matching circuit, the harmonic termination circuit reflects at least part of the even-ordered harmonic and the odd-ordered harmonic contained in the third radio-frequency signal input to the third input terminal to output the at least part of the even-ordered harmonic and the odd-ordered harmonic from the third input terminal as a fourth radio-frequency signal and outputs a fifth radio-frequency signal containing the fundamental and the remainder of the even-ordered harmonic and the odd-ordered harmonic from the third output terminal. The power amplifier unit also includes a filter that has a fourth input terminal and a fourth output terminal, wherein the fourth input terminal is connected to the third output terminal of the harmonic termination circuit, the filter attenuates at least part of the even-ordered harmonic and the odd-ordered harmonic contained in the fifth radio-frequency signal input to the fourth input terminal and outputs a sixth radio-frequency signal containing the fundamental and the remainder of the even-ordered harmonic and the remainder of the odd-ordered harmonic from the fourth output terminal. The fourth radio-frequency signal includes at least a second-order harmonic. The second-order harmonic reaches the first output terminal of the power amplifier circuit with a first phase via the first impedance matching circuit.

A power amplifier unit according to another aspect of the present disclosure includes a power amplifier circuit that has a first input terminal and a first output terminal, wherein the power amplifier circuit amplifies a first radio-frequency signal containing a fundamental and input to the first input terminal, and outputs a second radio-frequency signal, containing the fundamental, an even-ordered harmonic, and an odd-ordered harmonic, from the first output terminal. The power amplifier unit also includes a first impedance matching circuit that has a second input terminal and a second output terminal, wherein the second input terminal is connected to the first output terminal of the power amplifier circuit, the first impedance matching circuit outputs the second radio-frequency signal, input to the second input terminal, from the second output terminal as a third radio-frequency signal and converts an impedance between the second input terminal and the second output terminal. The power amplifier unit further includes a band select switch that has a fifth input terminal and a plurality of fifth output terminals, wherein the fifth input terminal is connected to an output terminal of the first impedance matching circuit, and the band select switch selects a propagation path of the third radio-frequency signal by connecting the fifth input terminal to at least one of the fifth output terminals in accordance with the frequency of the fundamental contained in the third radio-frequency signal. The power amplifier unit also includes a plurality of harmonic termination circuits respectively provided in association with the plurality of fifth output terminals of the band select switch, wherein each of the plurality of harmonic termination circuits has a third input terminal and a third output terminal, the third input terminal is connected to an associated one of the fifth output terminals, each of the plurality of harmonic termination circuits reflects at least part of the even-ordered harmonic and the odd-ordered harmonic contained in the third radio-frequency signal input to the third input terminal to output the at least part of the even-ordered harmonic and the odd-ordered harmonic from the third input terminal as a fourth radio-frequency signal and outputs a fifth radio-frequency signal containing the fundamental and the remainder of the even-ordered harmonic and the odd-ordered harmonic from the third output terminal. In addition, the power amplifier unit includes a plurality of filters respectively provided in association with the plurality of harmonic termination circuits, wherein each of the plurality of filters has a fourth input terminal and a fourth output terminal, the fourth input terminal is connected to the third output terminal of an associated one of the harmonic termination circuits, each of the plurality of filters attenuates at least part of the even-ordered harmonic and the odd-ordered harmonic input to the fourth input terminal and contained in the fifth radio-frequency signal and outputs a sixth radio-frequency signal, containing the fundamental and the remainder of the even-ordered harmonic and the odd-ordered harmonic, from the fourth output terminal. Furthermore, the power amplifier unit includes a plurality of duplexers respectively provided in association with the plurality of filters, wherein each of the duplexers has a seventh input terminal, a seventh output terminal, and an input/output terminal, the seventh input terminal is connected to the fourth output terminal of an associated one of the second impedance matching circuits, an eighth radio-frequency signal is output from the input/output terminal in accordance with the frequency of a sixth radio-frequency signal input to the seventh input terminal, and a tenth radio-frequency signal is output from the seventh output terminal in accordance with the frequency of a ninth radio-frequency signal input to the input/output terminal. The fourth radio-frequency signal includes at least a second-order harmonic. The second-order harmonic reaches the first output terminal of the power amplifier circuit with a first phase via the first impedance matching circuit. Each of the plurality of harmonic termination circuits operates at a different frequency, and each of the plurality of filters operates at a different frequency. Each of the plurality of duplexers operates at a different frequency.

According to the present disclosure, it is possible to implement the broadband operation of the radio-frequency power amplifier circuit.

DETAILED DESCRIPTION

Hereinafter, embodiments of the present disclosure will be described in detail with reference to the accompanying drawings. In the description of each of the following embodiments, like reference signs denote the same or similar components to those of the other embodiments, and the description thereof is simplified or omitted. The present disclosure is not limited to the embodiments. The component elements of the embodiments encompass ones that are easily replaceable by persons skilled in the art and substantially the same ones. The components described below may be combined as needed. Omissions, replacements, or changes of components are possible without departing from the scope of the disclosure. Any combination of a plurality of modifications described in the embodiments is possible within the range obvious to persons skilled in the art.

Before the description of the embodiments, harmonic termination and harmonic rejection in the present disclosure will be described.

(Harmonic Termination)

Figure 1:
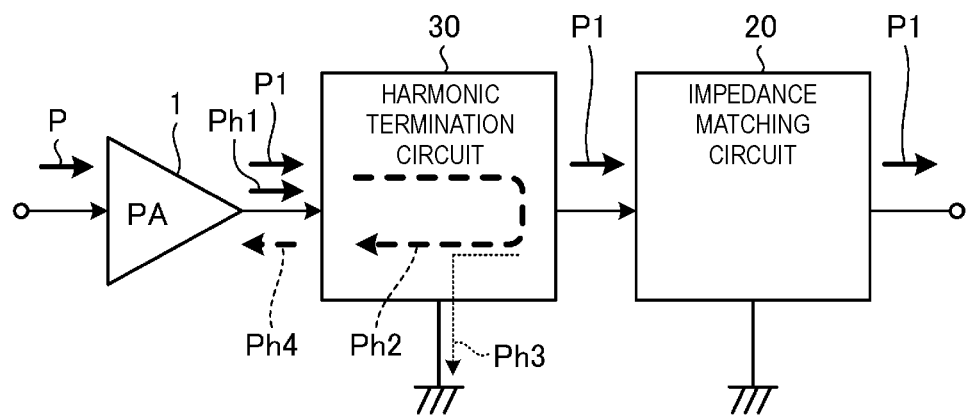
FIG. 1 is a diagram that illustrates the operation of harmonic termination by a harmonic termination circuit.

Harmonic termination is a technology to, by using a harmonic termination circuit, reflect harmonics generated in an amplifier in a circuit component element subsequent to the amplifier and then input the harmonics to the amplifier in a specific phase to cause the amplifier to perform amplification operation in a switching mode. FIG. 1 is a diagram that illustrates the operation of harmonic termination by a harmonic termination circuit. In FIG. 1, a harmonic termination circuit 30 is provided in a subsequent stage of a power amplifier circuit (power amplifier) 1, and an impedance matching circuit 20 is provided in a subsequent stage of the harmonic termination circuit 30.

In FIG. 1, for an input signal P of the power amplifier circuit 1, an output signal from the output end of the power amplifier circuit 1 contains a fundamental P1 and harmonics Ph1. The fundamental P1 passes through the harmonic termination circuit 30 and the impedance matching circuit 20 and is output.

In contrast, the harmonics Ph1 become a reflected wave component Ph2 turned around toward the input side of the harmonic termination circuit 30. A reflected wave component Ph3 that is part of the reflected wave component Ph2 flows into a reference potential to be consumed. A reflected wave component Ph4 that is the remainder of the reflected wave component Ph2 is input to the output end of the power amplifier circuit 1 in a specific phase. A specific phase is a first phase for a traveling wave component of even-ordered harmonics or a second phase for a traveling wave component of odd-ordered harmonics. The first phase is, for example, an opposite phase. In other words, the first phase is a phase in which a reflected wave component of even-ordered harmonics destructively interfere with at least part of a traveling wave component of the even-ordered harmonics at the output end of the power amplifier circuit. The second phase is, for example, the same phase. In other words, the second phase is a phase in which a reflected wave component of odd-ordered harmonics constructively interferes with at least part of a traveling wave component of the odd-ordered harmonics at the output end of the power amplifier circuit 1. In such a phase, at the output terminal of the power amplifier circuit 1, the power amplifier circuit 1 performs amplification operation in a switching mode as a result of superposing the output signal of the power amplifier circuit 1 on the reflected wave component Ph4.

In the power amplifier circuit 1, amplification operation is performed in a switching mode by a signal obtained by superposing the fundamental P1 on the reflected wave component Ph4. In theory, in the process in which part of the reflected wave component Ph2 enters the power amplifier circuit 1 as the reflected wave component Ph4, the attenuation of harmonics is small, and, as the amplitude increases, a signal close to an ideal rectangular wave is obtained as will be described later, so the effect of improving the performance is large. The reference potential is illustrated as a ground potential; however, the present disclosure is not limited thereto.

(Example of Harmonic Termination Circuit)

Figure 2:
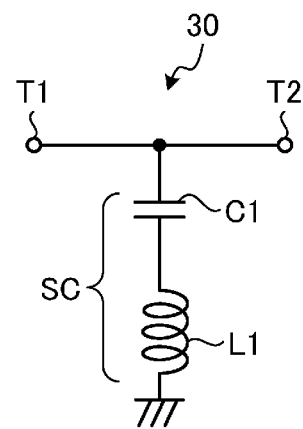
FIG. 2 is a diagram that shows an example of the harmonic termination circuit.
Figure 3:
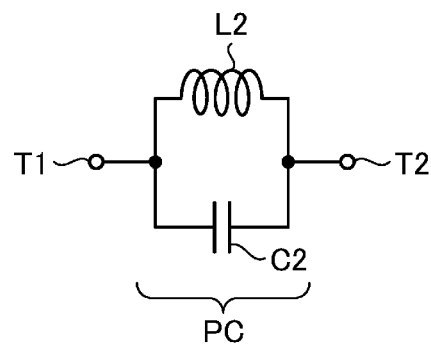
FIG. 3 is a diagram that shows an example of the harmonic termination circuit.

FIGS. 2 and 3 are diagrams that show an example of the harmonic termination circuit. The circuit shown in FIG. 2 is made up of a series resonant circuit SC of a capacitor C1 and an inductor L1 connected in series. The series resonant circuit SC shown in FIG. 2 is provided between a transmission line and the reference potential. In FIG. 2, the series resonant circuit SC is provided between a first terminal T1 and a second terminal T2 of the harmonic termination circuit 30. One end of the series resonant circuit SC is connected to the reference potential, and the other end of the series resonant circuit SC is connected to both the first terminal T1 and the second terminal T2. The circuit shown in FIG. 2 has an impedance of zero at the resonant frequency of the capacitor C1 and inductor L1. Therefore, the circuit of FIG. 2 terminates a signal with a specific harmonic frequency to operate as a harmonic termination circuit that generates a reflected wave component with that frequency. In FIG. 2, the capacitance value of the capacitor C1 is defined as "C", and the inductance value of the inductor L1 is defined as "L". Then, the circuit shown in FIG. 2 is approximated to a circuit in which a capacitive element is provided in a line to the reference potential at a frequency $(f<1/2\pi(LC)^{1/2})$ lower than a resonant frequency $f_R$ $(f_R=1/2\pi(LC)^{1/2})$. The circuit shown in FIG. 2 is approximated to a circuit in which an inductive element is provided in a line to the reference potential at a frequency $(f>1/2\pi(LC)^{1/2})$ higher than the resonant frequency $f_R$. Therefore, the circuit shown in FIG. 2 is able to adjust the phase of a reflected wave component by setting the resonant frequency $f_R$ to a frequency different from the specific harmonic frequency.

The circuit shown in FIG. 3 is made up of a parallel resonant circuit PC of a capacitor C2 and an inductor L2 connected in parallel. The parallel resonant circuit PC shown in FIG. 3 is inserted in a transmission line. In FIG. 3, the parallel resonant circuit PC is provided between the first terminal T1 and the second terminal T2 of the harmonic termination circuit 30. One end of the parallel resonant circuit PC is connected to the first terminal T1, and the other end of the parallel resonant circuit PC is connected to the second terminal T2. The circuit shown in FIG. 3 has an infinite impedance at the resonant frequency of the capacitor C2 and inductor L2. Therefore, the circuit of FIG. 3 operates as a harmonic termination circuit that terminates a signal with a specific harmonic frequency. In FIG. 3, the capacitance value of the capacitor C2 is defined as "C", and the inductance value of the inductor L2 is defined as "L". Then, in the circuit of FIG. 3, as in the case of the circuit of FIG. 2, the overall circuit of FIG. 3 is approximated as an inductive element at the frequency $(f<1/2\pi(LC)^{1/2})$ lower than the resonant frequency $f_R$ $(f_R=1/2\pi(LC)^{1/2})$. In the circuit shown in FIG. 3, the overall circuit of FIG. 3 is approximated as a capacitive element at the frequency $(f>1/2\pi(LC)^{1/2})$ higher than the resonant frequency $f_R$. Therefore, the circuit shown in FIG. 3 is able to adjust the phase of a reflected wave component by setting the resonant frequency $f_R$ to a frequency different from the specific harmonic frequency.

A circuit that provides an impedance to establish a short circuit at a harmonic frequency that is the resonant frequency as shown in FIG. 2 or a circuit that provides an impedance to establish an open circuit at a harmonic frequency that is the resonant frequency as shown in FIG. 3 is provided somewhere in a signal transmission line. Thus, a harmonic termination circuit that terminates a signal with a specific harmonic frequency is implemented.

(Harmonic Rejection)

Figure 4:
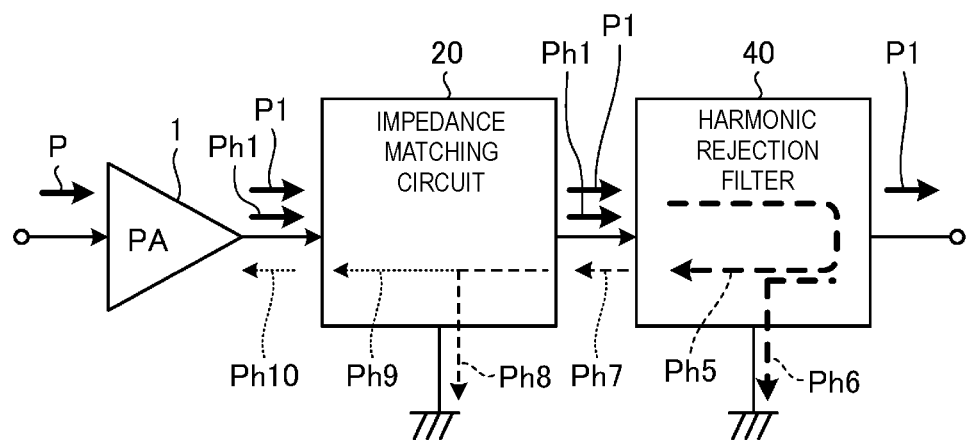
FIG. 4 is a diagram that illustrates the operation of harmonic rejection by a harmonic rejection filter.

Harmonic rejection is a technology to cause the output terminal of a harmonic rejection filter not to output harmonics by attenuating the harmonics using a harmonic rejection filter. FIG. 4 is a diagram that illustrates the operation of harmonic rejection by a harmonic rejection filter. In FIG. 4, an impedance matching circuit 20 is provided in a subsequent stage (that is, an output side) of the power amplifier circuit 1, and a harmonic rejection filter 40 is provided in a subsequent stage (that is, an output side) of the impedance matching circuit 20.

In FIG. 4, for an input signal P of the power amplifier circuit 1, an output signal of the power amplifier circuit 1 and an output signal of the impedance matching circuit 20 each contain a fundamental P1 and harmonics Ph1. The fundamental P1 is not rejected by the harmonic rejection filter 40, and the fundamental P1 passes through the harmonic rejection filter 40.

In contrast, the harmonics Ph1 do not pass through the harmonic rejection filter 40. Part of the harmonics Ph1 are turned around to the input side of the harmonic rejection filter 40 as a reflected wave component Ph5, and a remaining reflected wave component Ph6 flows into the reference potential to be consumed. The reflected wave component Ph5 turned around to the input side of the harmonic rejection filter 40 is input to the impedance matching circuit 20 as a reflected wave component Ph7 that flows back through the transmission line. A reflected wave component Ph8 that is part of the reflected wave component Ph7 input to the impedance matching circuit 20 flows into the reference potential to be consumed. The remainder becomes a reflected wave component Ph9 that further flows back through the transmission line. The reflected wave component Ph9 becomes a reflected wave component Ph10 that flows back through the transmission line. The reflected wave components Ph5, Ph6, Ph7, Ph8, Ph9, Ph10 are consumed as thermal energy by parasitic resistances and the like. In this way, the harmonic rejection filter 40 passes a fundamental and rejects and does not allow harmonics other than the fundamental to be output.

First Embodiment

Figure 5:
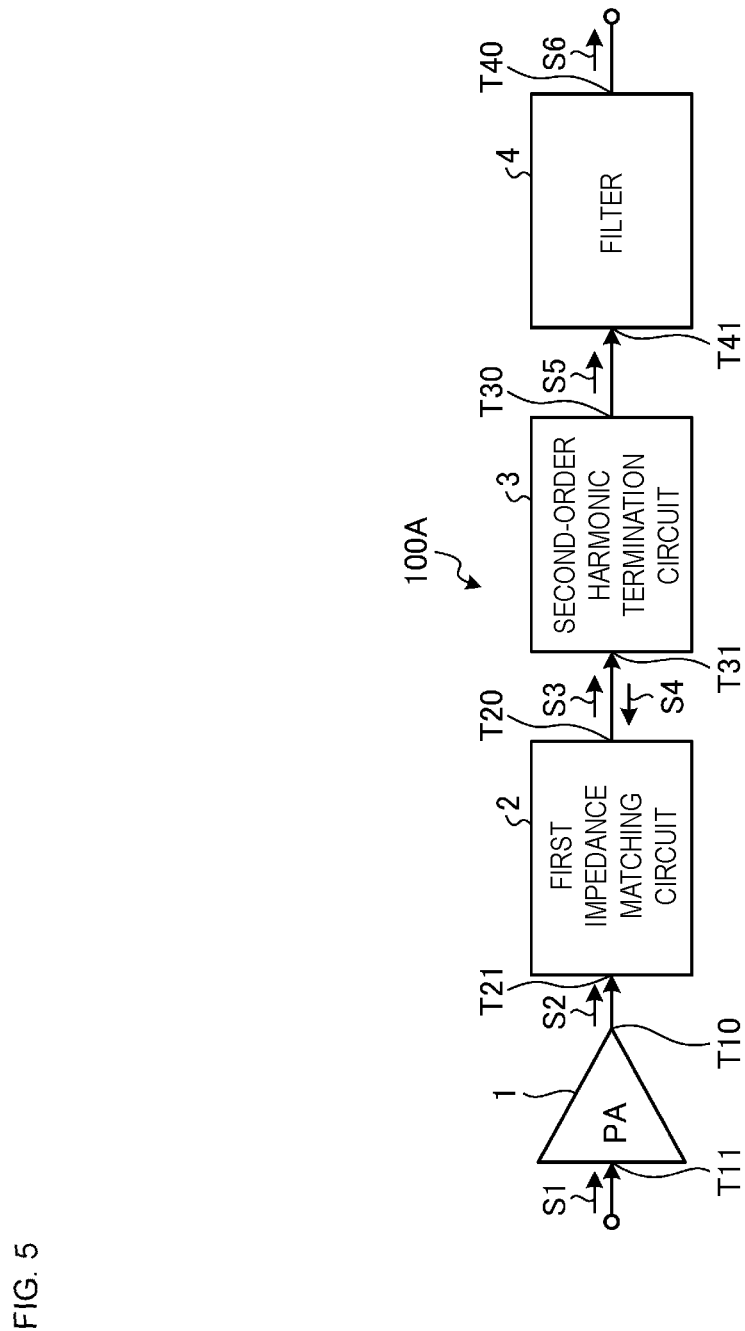
FIG. 5 is a diagram that shows the configuration of a power amplifier unit according to a first embodiment.

FIG. 5 is a diagram that shows the configuration of a power amplifier unit 100A according to a first embodiment. As shown in FIG. 5, the power amplifier unit 100A according to the first embodiment includes a power amplifier circuit 1, a first impedance matching circuit 2, a second-order harmonic termination circuit 3, and a filter 4. The power amplifier circuit 1 has a first input terminal T11 and a first output terminal T10. The power amplifier circuit 1 amplifies a first radio-frequency signal S1 input to the first input terminal T11. The first radio-frequency signal S1 contains a fundamental. The power amplifier circuit 1 outputs a second radio-frequency signal S2 from the first output terminal T10. The second radio-frequency signal S2 contains the fundamental, even-ordered harmonics, and odd-ordered harmonics.

The first impedance matching circuit 2 has a second input terminal T21 and a second output terminal T20. The second input terminal T21 is connected to the first output terminal T10 of the power amplifier circuit 1. The first impedance matching circuit 2 outputs the second radio-frequency signal S2 input to the second input terminal T21, from the second output terminal T20 as a third radio-frequency signal S3. The first impedance matching circuit 2 converts an impedance between the second input terminal T21 and the second output terminal T20. In other words, the first impedance matching circuit 2 converts the input impedance of an element connected to the second output terminal T20 of the first impedance matching circuit 2 and provides a load impedance for the power amplifier circuit 1. In other words, in FIG. 5, the first impedance matching circuit 2 functions such that the one obtained by converting the input impedance of the second-order harmonic termination circuit 3 becomes the input impedance of the first impedance matching circuit 2. The first impedance matching circuit 2 functions as a low-loss impedance conversion circuit for not only the frequency of the fundamental but also the frequency of at least one harmonic. The characteristics of the first impedance matching circuit 2 are not low-pass characteristics. The first impedance matching circuit 2 is not an LC ladder circuit and is, for example, a transmission line transformer.

The second-order harmonic termination circuit 3 is a harmonic termination circuit. The second-order harmonic termination circuit 3 has a third input terminal T31 and a third output terminal T30. The third input terminal T31 is connected to the second output terminal T20 of the first impedance matching circuit 2. The second-order harmonic termination circuit 3 reflects at least part of the even-ordered harmonics and the odd-ordered harmonics contained in the third radio-frequency signal S3 input to the third input terminal T31. With this configuration, the second-order harmonic termination circuit 3 outputs the at least part of the even-ordered harmonics and the odd-ordered harmonics from the third input terminal T31 as a fourth radio-frequency signal S4 and outputs a fifth radio-frequency signal S5, containing the fundamental and the remainder of the even-ordered harmonics and the odd-ordered harmonics, from the third output terminal T30. The filter 4 rejects harmonics contained in a signal.

The filter 4 has a fourth input terminal T41 and a fourth output terminal T40. The fourth input terminal T41 is connected to the third output terminal T30 of the second-order harmonic termination circuit 3. The filter 4 attenuates at least part of the even-ordered harmonics and the odd-ordered harmonics, contained in the fifth radio-frequency signal S5 input to the fourth input terminal T41. The filter 4 outputs a sixth radio-frequency signal S6, containing the fundamental and the remainder of the even-ordered harmonics and the odd-ordered harmonics, from the fourth output terminal T40. As will be described later, a signal processing unit that combines the function of the second-order harmonic termination circuit 3 with the function of the filter 4 may be used.

In the above configuration, the second radio-frequency signal S2 output from the first output terminal T10 of the power amplifier circuit 1 is converted in impedance in the first impedance matching circuit 2 and then input to the second-order harmonic termination circuit 3. The fundamental contained in the second radio-frequency signal S2 output from the first output terminal T10 of the power amplifier circuit 1 passes through the second-order harmonic termination circuit 3. The fundamental having passed through the second-order harmonic termination circuit 3 passes through the filter 4. As will be described later, a band select switch that selects a frequency band is provided in a subsequent stage, that is, on the fourth output terminal T40 side, of the filter 4, and a signal with the fundamental having passed through the filter 4 is output to an antenna via an antenna switch or the like.

As described above, a second-order harmonic contained in the second radio-frequency signal S2 output from the first output terminal T10 of the power amplifier circuit 1 will be a reflected wave component that is reflected in the second-order harmonic termination circuit 3 and turned around from the third input terminal T31 of the second-order harmonic termination circuit 3 to the first impedance matching circuit 2 side. In other words, the second-order harmonic termination circuit 3 outputs a fourth radio-frequency signal S4, containing at least the second-order harmonic, from the third input terminal T31. The reflected wave component of the second-order harmonic changes by a certain phase by passing through the first impedance matching circuit 2, then reaches the first output terminal T10 of the power amplifier circuit 1, and is input with a first phase. The first phase of the reflected wave component of the second-order harmonic is a phase in which, at the first output terminal T10 of the power amplifier circuit 1, the reflected wave component of the second-order harmonic destructively interferes with at least part of a traveling wave component of the second-order harmonic. Thus, at the first output terminal T10 of the power amplifier circuit 1, amplification operation in a switching mode is performed as a result of superposition of the traveling wave component and reflected wave component of the second-order harmonic on the fundamental. Harmonics other than the second-order harmonic pass through the second-order harmonic termination circuit 3 and are input to the filter 4 to be consumed.

The second-order harmonic termination circuit 3 can output a fourth radio-frequency signal S4 containing a third-order harmonic. The third-order harmonic reaches the first output terminal T10 of the power amplifier circuit 1 via the first impedance matching circuit 2 with a second phase. The second radio-frequency signal S2 output from the power amplifier circuit 1 contains a third-order harmonic and at least part of the third-order harmonic contained in the second radio-frequency signal S2 constructively interferes at the first output terminal T10 of the power amplifier circuit 1. In other words, the second phase is a phase in which at least part of the third-order harmonic contained in the second radio-frequency signal S2 constructively interferes at the first output terminal T10 of the power amplifier circuit 1.

Figure 6:
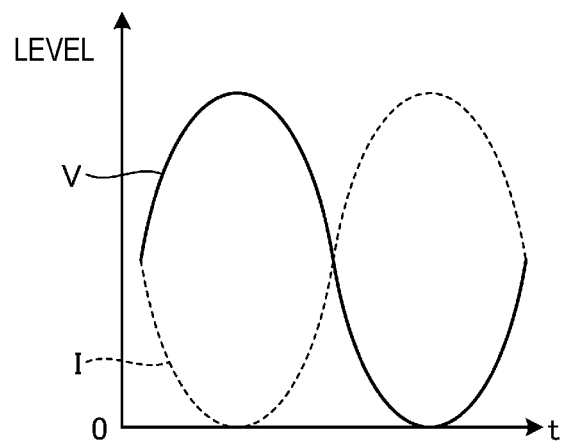
FIG. 6 is a graph that shows an example of the voltage waveform and current waveform of a signal output from the power amplifier unit of FIG. 5.
Figure 7:
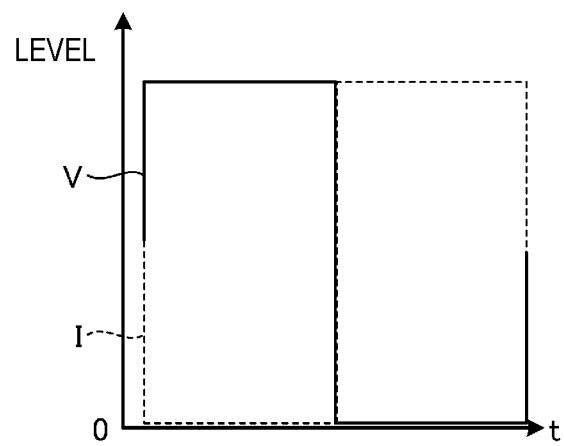
FIG. 7 is a graph that shows an example of the voltage waveform and current waveform of a signal output from the power amplifier unit of FIG. 5.

FIGS. 6 and 7 are graphs that respectively show examples of the voltage waveform V and current waveform I of a signal output from the power amplifier unit 100A of FIG. 5. It is assumed that, as shown in FIG. 6, both the voltage waveform V and the current waveform I are sinusoidal waves and have a phase difference of 180°. In this case, the loss of electric power occurs in a time domain in which the voltage waveform V overlaps the current waveform I.

In contrast, as shown in FIG. 7, when the voltage waveform V and the current waveform I both have rectangular waves and have a phase difference of 180°, one of the voltage waveform V and the current waveform I is at high level in a time domain in which the other is at low level, so the waveforms do not overlap, and no loss of electric power occurs. For this reason, in the power amplifier unit 100A according to the present embodiment, an output signal of the power amplifier unit 100A is approximated to a rectangular wave by reflecting harmonics contained in a signal to be transmitted and turning around the harmonics to be superposed on the fundamental. Thus, the loss of electric power is reduced.

Here, the harmonics Ph1 contained in the output signal of the power amplifier circuit 1 are separately considered for even-ordered harmonics containing a second-order harmonic and odd-ordered harmonics containing a third-order harmonic. A rectangular wave is obtained by superposing the odd-ordered harmonics on the fundamental. Superposing the even-ordered harmonics on the fundamental prevents approximation of a waveform to a rectangular shape. Therefore, the influence of the even-ordered harmonics on the fundamental needs to be suppressed. Particularly, for a second-order harmonic of which the amplitude is the greatest among those of the other harmonics, the influence is preferably suppressed. For a third-order harmonic of which the amplitude is the second greatest subsequently to the second-order harmonic, the third-order harmonic is preferably superposed on the fundamental in a state where the amplitude is large.

Figure 8:
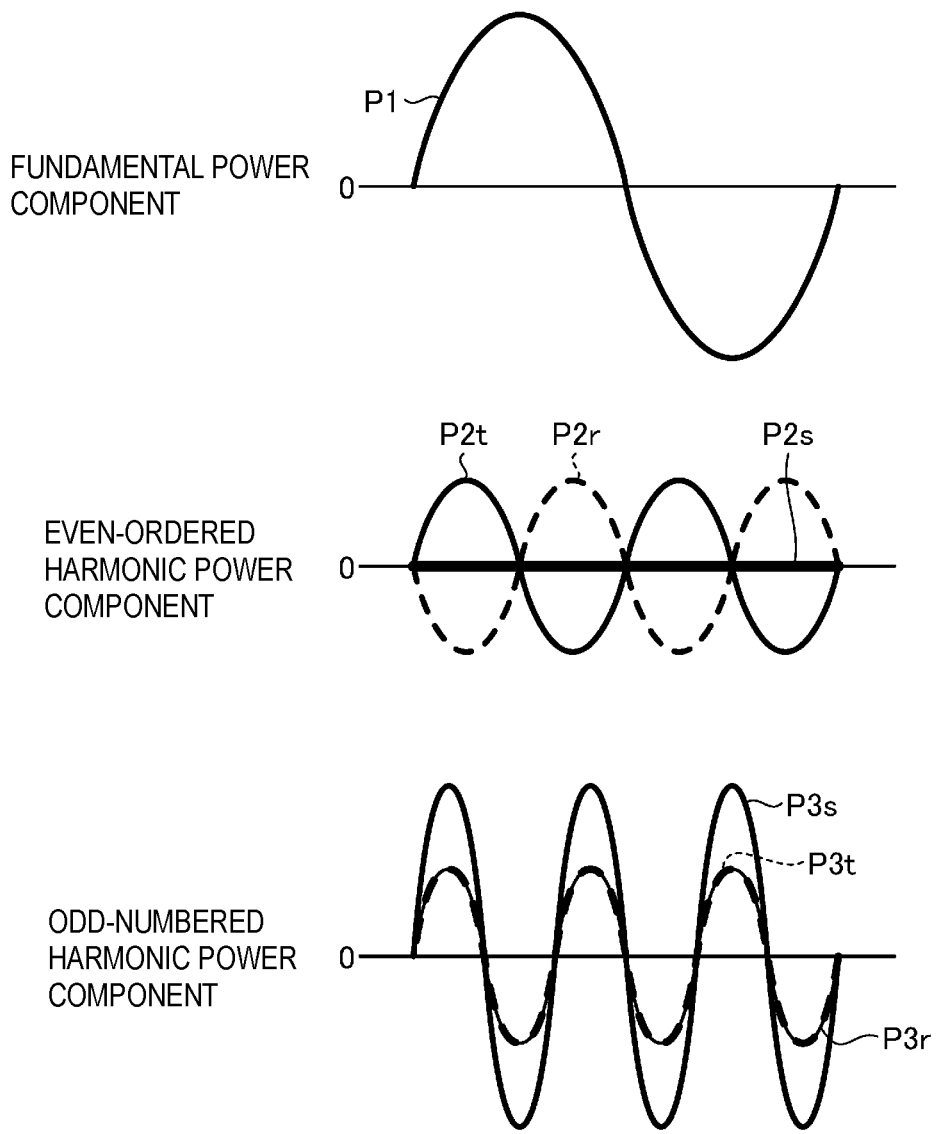
FIG. 8 shows graphs that show an example of the waveform of a fundamental, an example of the waveform of an even-ordered harmonic, and an example of the waveform of an odd-ordered harmonic.

FIG. 8 shows graphs that show an example of the waveform of an even-ordered harmonic and an example of the waveform of an odd-ordered harmonic with respect to the fundamental P1. FIG. 8 shows a second-order harmonic as an example of the even-ordered harmonic and shows a third-order harmonic as an example of the odd-ordered harmonic.

In FIG. 8, the frequency of a traveling wave component P2$t$ of the second-order harmonic is twice the frequency of the fundamental P1. As shown in FIG. 8, with respect to the phase of the traveling wave component P2$t$ (indicated by the continuous line) of the second-order harmonic, a reflected wave component P2$r$ (indicated by the dashed line) of the second-order harmonic is in an opposite phase. In other words, it is assumed that the phase difference between the traveling wave component P2$t$ and the reflected wave component P2$r$ is 180°. By setting the phase of the traveling wave component P2$t$ and the phase of the reflected wave component P2$r$ to such a relationship, the traveling wave component P2$t$ and the reflected wave component P2$r$ cancel out each other. Therefore, the amplitude of a synthetic wave P2$s$ obtained by superposing the traveling wave component P2$t$ and the reflected wave component P2$r$ on each other will be zero. Therefore, even when the synthetic wave P2$s$ is input to the output end of the power amplifier circuit 1, there is no influence on the fundamental P1. The same applies to the even-ordered harmonics other than the second-order harmonic. In other words, at the output end of the power amplifier circuit 1, a traveling wave component P2$t$ and a reflected wave component P2$r$ are in opposite phase for the even-ordered harmonics. Thus, the amplitude of the synthetic wave P2$s$ becomes zero, with the result that the loss of electric power is reduced.

In FIG. 8, the frequency of a traveling wave component P3$t$ of the third-order harmonic is three times the frequency of the fundamental P1. As shown in FIG. 8, with respect to the phase of the traveling wave component P3$t$ (indicated by the wide dashed line) of the third-order harmonic, a reflected wave component P3$r$ (indicated by the narrow continuous line) of the third-order harmonic is in the same phase. In other words, it is assumed that the phase difference between the traveling wave component P3$t$ and the reflected wave component P3$r$ is 0°. Therefore, as shown in FIG. 8, the waveform of the traveling wave component P3$t$ overlaps the waveform of the reflected wave component P3$r$. By setting the phase of the traveling wave component P3$t$ and the phase of the reflected wave component P3$r$ to such a relationship, a synthetic wave P3$s$ that is the addition of the traveling wave component P3$t$ and the reflected wave component P3$r$ is obtained. The synthetic wave P3$s$ is input to the output end of the power amplifier circuit 1 to be superposed on the fundamental P1. With this configuration, a signal with a waveform closer to a rectangular wave than the fundamental P1 is obtained. Thus, the loss of electric power is reduced. The same applies to the odd-ordered harmonics other than the third-order harmonic. In other words, at the output end of the power amplifier circuit 1, a traveling wave component P3$t$ and a reflected wave component P3$r$ are in the same phase for the odd-ordered harmonics. Thus, the loss of electric power is reduced.

Here, parasitic resistances that are allowed in the harmonic termination circuit 30 or the second-order harmonic termination circuit 3 will be described with reference to FIGS. 9 to 11.

Figure 9:
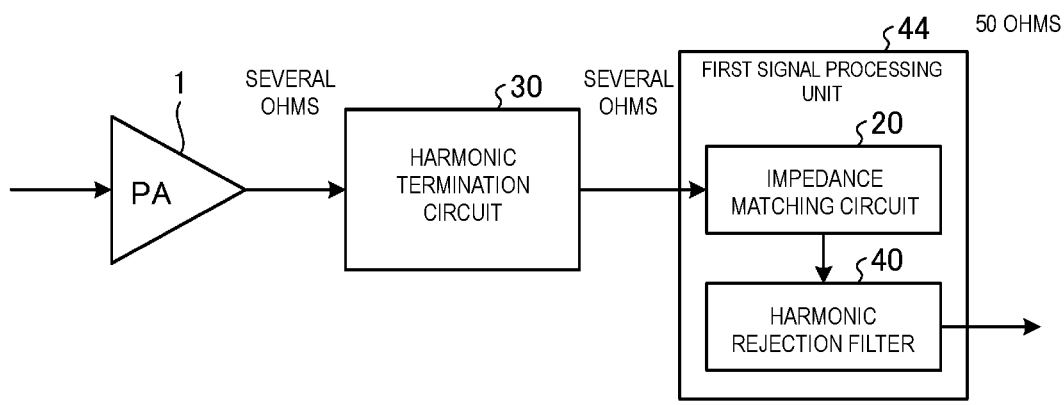
FIG. 9 is a diagram that shows a circuit configuration according to a comparative example.

FIG. 9 is a diagram that shows a circuit configuration according to a comparative example. As shown in FIG. 9, in the comparative example, the harmonic termination circuit 30 is provided in a subsequent stage of the power amplifier circuit 1, and a first signal processing unit 44 is provided in a subsequent stage of the harmonic termination circuit 30. The first signal processing unit 44 has the function of the impedance matching circuit 20 and the function of the harmonic rejection filter 40.

The fundamental input impedance of the harmonic termination circuit 30 is several ohms (for example, 3 [Ω]), and the input impedance of the first signal processing unit 44 is also several ohms (for example, 3 [Ω]). The input impedance of a subsequent stage of the first signal processing unit 44 is, for example, 50 [Ω]. Therefore, in the harmonic termination circuit 30 according to the comparative example, a reflected wave with a sufficiently high amplitude for an input impedance of several ohms is needed. If a parasitic resistance in the harmonic termination circuit 30 is large, it is difficult to generate a reflected wave with a sufficiently high amplitude.

Figure 10:
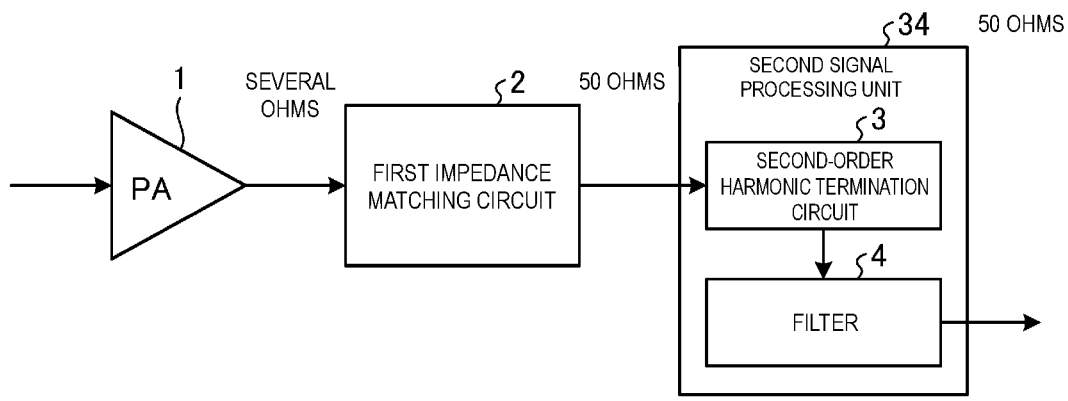
FIG. 10 is a diagram that shows a circuit configuration in which a second signal processing unit is provided in a subsequent stage of the power amplifier circuit.

FIG. 10 is a diagram that shows a circuit configuration in which a second signal processing unit 34 is provided in a subsequent stage of the power amplifier circuit 1. The second signal processing unit 34 of FIG. 10 has the functions of the second-order harmonic termination circuit 3 and filter 4 shown in FIG. 5. According to the circuit configuration shown in FIG. 10, the input impedance of the second signal processing unit 34 is, for example, 50 [Ω]. Therefore, in the second signal processing unit 34 shown in FIG. 10, a reflected wave component just needs to be generated for an input impedance of 50 [Ω] that is sufficiently greater than the above-described several ohms. Therefore, a reflected wave with a sufficiently high amplitude is able to be generated. This means that the value of parasitic resistance allowed in the second signal processing unit 34 is relieved. In other words, a parasitic resistance greater than that of the comparative example is allowed. This will be described with reference to FIG. 11.

Figure 11:
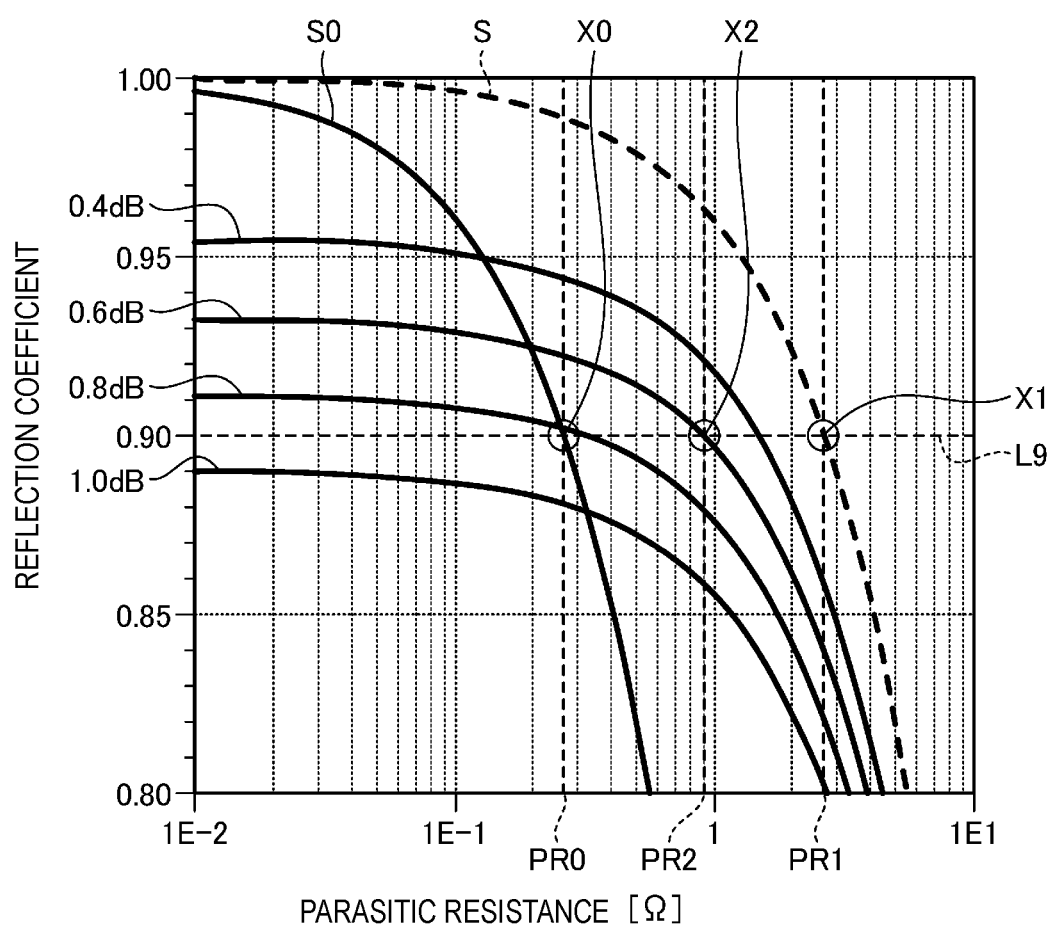
FIG. 11 is a graph that illustrates a parasitic resistance allowed for a reflection coefficient.

FIG. 11 is a graph that illustrates a parasitic resistance that is allowed for the harmonic termination circuit 30 of FIG. 9 and the second-order harmonic termination circuit 3 of FIG. 1n FIG. 11, the curve S0 is a curve that shows the relationship between the parasitic resistance of the harmonic termination circuit 30 and the reflection coefficient of reflected wave generated in the harmonic termination circuit 30 at the output end of the power amplifier circuit 1 with the circuit configuration of FIG. 9. The curve S is a curve that shows the relationship between the parasitic resistance of the second-order harmonic termination circuit 3 and the reflection coefficient of reflected wave generated in the second-order harmonic termination circuit 3 at the output end of the power amplifier circuit 1 with the circuit configuration of FIG. 10.

FIG. 11 is a graph obtained by plotting the magnitude of a reflected wave component at the output end of the power amplifier circuit 1 as a reflection coefficient for the value of parasitic resistance. FIG. 11 shows the relationship between a parasitic resistance and the reflection coefficient of a reflected wave component. In FIG. 11, the abscissa axis represents the value of parasitic resistance of the harmonic termination circuit 30, and the ordinate axis represents the value of reflection coefficient. As shown in FIG. 11, as the value of parasitic resistance increases, the value of reflection coefficient reduces. Therefore, to obtain a reflected wave component with an amplitude as large as possible, the power amplifier circuit 1 is operated in a region on the left side in FIG. 11, with the result that a reflection coefficient as high as possible is obtained.

Here, when a necessary reflection coefficient is assumed as 0.90, a parasitic resistance PRO allowed for an intersection X0 between the curve S0 representing the characteristics of the harmonic termination circuit 30 of FIG. 9 and the line L9 for a reflection coefficient of 0.90 is about 0.18 [Ω]. In contrast, a parasitic resistance PR allowed for an intersection X1 between the curve S representing the characteristics of the second signal processing unit 34 of FIG. 10 and the line L9 for a reflection coefficient of 0.90 is about 3 [Ω]. Therefore, the second signal processing unit 34 of FIG. 10 has a greater value of allowable parasitic resistance than the harmonic termination circuit 30 of FIG. 9.

In FIG. 10, when inputting generated reflection into the power amplifier circuit 1 is taken into consideration, a power loss in the first impedance matching circuit 2 needs to be considered. FIG. 11 shows curves in the case where assumed values of power loss between the power amplifier circuit 1 and the first impedance matching circuit 2 are 1.0 dB, 0.8 dB, dB, and 0.4 dB. In the line L9 for a necessary reflection coefficient of 0.90, when an assumed value of power loss is set to 0.8 dB, the intersection between the curve for 0.8 dB and the line L9 is close to the intersection X0, so a parasitic resistance equivalent to the curve S0 is allowed.

In the line L9 for a necessary reflection coefficient of 0.90, when the power loss is dB or 0.4 dB lower than 0.8 dB, a parasitic resistance with a value shifted to a region on the right side in FIG. 11 and greater than the parasitic resistance PRO is allowed. When, for example, an assumed value of power loss is set to 0.6 dB, a parasitic resistance PR2 is allowed for an intersection X2 between the curve for 0.6 dB and the line L9. The parasitic resistance PR2 is a value about four times the parasitic resistance PRO.

As described with reference to FIG. 11, the second signal processing unit 34 of FIG. 10 has a greater allowable parasitic resistance value than the harmonic termination circuit 30 of FIG. 9, so the second signal processing unit 34 is capable of generating a reflected wave component with a further higher amplitude. Therefore, the amplitude of harmonics is able to be increased.

(Relationship Between Fundamental and Harmonics)

Figure 12:
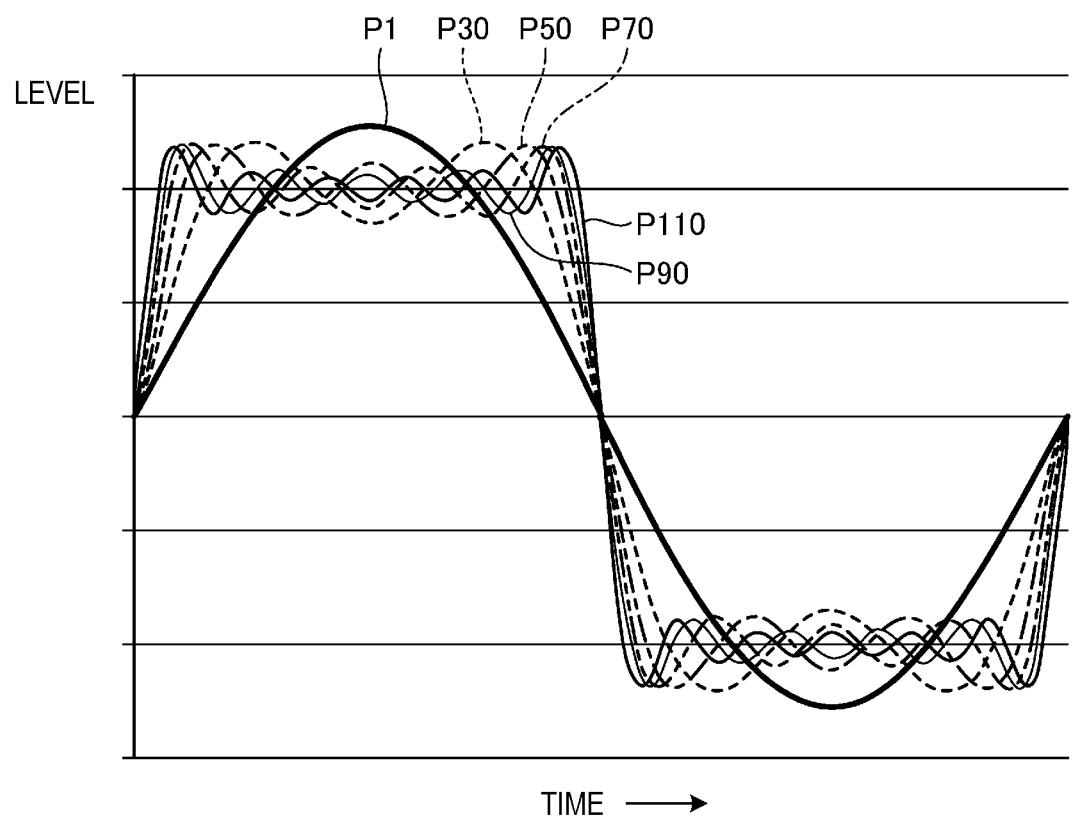
FIG. 12 is a graph that illustrates the relationship between a fundamental and harmonics.

FIG. 12 is a graph that shows the relationship between a fundamental and harmonics. In FIG. 12, the fundamental P1 is a sinusoidal wave with level "0" at the center. The waveform P30 is a waveform obtained by superposing a third-order harmonic on the fundamental P1 in the same phase. The waveform P50 is a waveform obtained by superposing a third-order harmonic and a fifth-order harmonic on the fundamental P1 in the same phase. The waveform P70 is a waveform obtained by superposing a third-order harmonic, a fifth-order harmonic, and a seventh-order harmonic on the fundamental P1 in the same phase. The waveform P90 is a waveform obtained by superposing a third-order harmonic, a fifth-order harmonic, a seventh-order harmonic, and a ninth-order harmonic on the fundamental P1 in the same phase. The waveform P110 is a waveform obtained by superposing a third-order harmonic, a fifth-order harmonic, a seventh-order harmonic, a ninth-order harmonic, and an eleventh-order harmonic on the fundamental P1 in the same phase.

As is understood with reference to FIG. 12, a synthetic wave obtained by superposing the traveling wave component and the reflected wave component of odd-ordered harmonics on the fundamental P1 in the same phase, a waveform further close to a rectangular wave is obtained. Therefore, as will be described with reference to FIGS. 6 and 7, the loss of electric power is reduced. In the first embodiment shown in FIG. 5, a synthetic wave obtained by superposing the traveling wave component and the reflected wave component of a second-order harmonic that is an even-ordered harmonic in opposite phase is superposed on the fundamental P1. As described above, the amplitude of the synthetic wave is zero, so the influence of a second-order harmonic that is an even-ordered harmonic on the fundamental P1 is reduced.

(First Impedance Matching Circuit)

Figure 13:
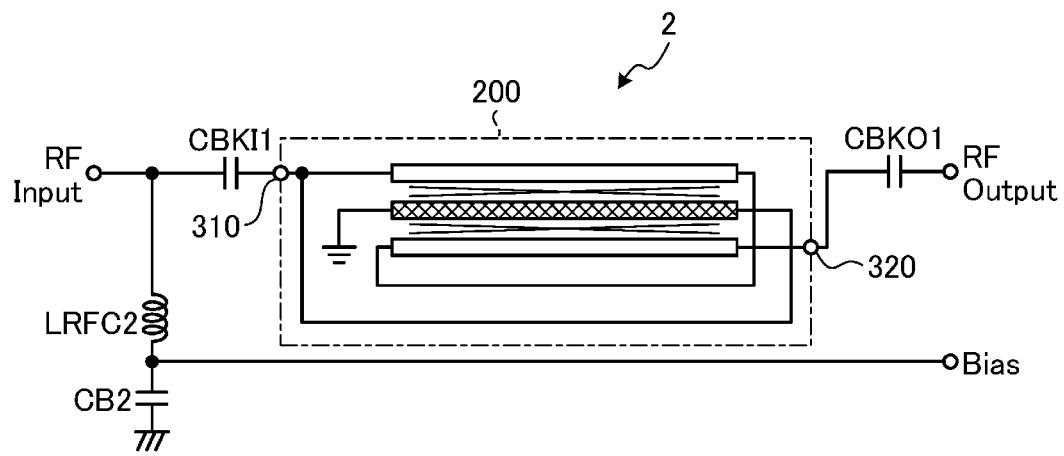
FIG. 13 is a diagram that shows a configuration example of a first impedance matching circuit.

FIG. 13 is a diagram that shows a configuration example of the first impedance matching circuit 2. The first impedance matching circuit 2 shown in FIG. 13 includes a transmission line transformer 200, a DC-cut capacitor CBKI1 provided on an input terminal side, a DC-cut capacitor CBKO1 provided on an output terminal side, and an inductor LRFC2 and a capacitor CB2 provided on the input terminal side and connected in series. A bias is applied between the inductor LRFC2 and one end of the capacitor CB2. The other end of the capacitor CB2 is connected to the reference potential.

An example of the transmission line transformer 200 will be described with reference to FIGS. 14, 15, and 16.

Figure 14:
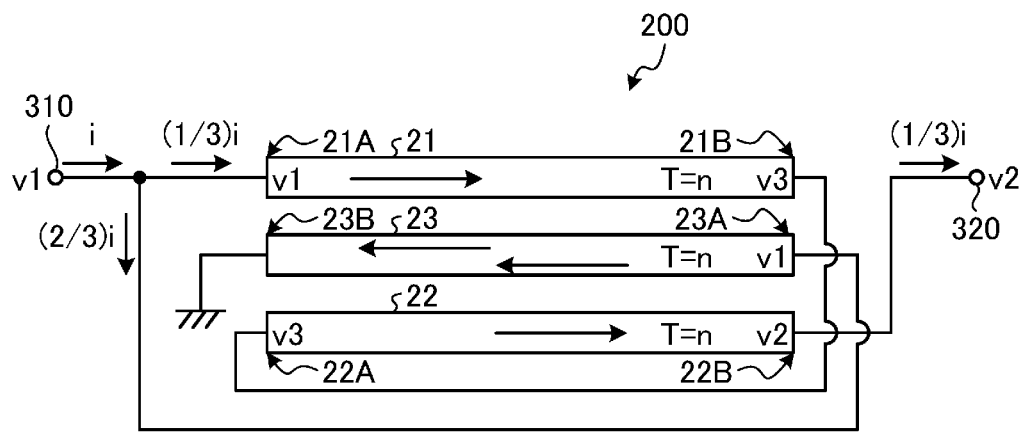
FIG. 14 is a schematic diagram for illustrating the operation principle of a transmission line transformer.

FIG. 14 is a schematic diagram for illustrating the operation principle of the transmission line transformer 200. The transmission line transformer 200 includes a first transmission line 21, a second transmission line 22, and a third transmission line 23 provided on the surface of a substrate or in the internal layer of the substrate. The vertical direction of FIG. 14 corresponds to the thickness direction of the substrate. The first transmission line 21 and the second transmission line 22 are disposed at different locations in the thickness direction of the substrate. The third transmission line 23 is disposed between the first transmission line 21 and the second transmission line 22 in the thickness direction of the substrate.

One end portion of the third transmission line 23 is referred to as first end portion 23A, and the other end portion is referred to as second end portion 23B. One end portion of the first transmission line 21 is referred to as third end portion 21A, and the other end portion is referred to as fourth end portion 21B. One end portion of the second transmission line 22 is referred to as fifth end portion 22A, and the other end portion is referred to as sixth end portion 22B. The first end portion 23A of the third transmission line 23 is connected to the third end portion 21A of the first transmission line 21, and the second end portion 23B is connected to the reference potential. Here, "connected to the reference potential" includes both the case of connected to the reference potential in a direct-current manner or connected to the reference potential in an alternating-current manner. The third end portion 21A of the first transmission line 21 is connected to a first terminal 310 for connection with an external circuit. The fourth end portion 21B of the first transmission line 21 is connected to the fifth end portion 22A of the second transmission line 22. The sixth end portion 22B of the second transmission line 22 is connected to a second terminal 320 for connection with an external circuit. In other words, the first transmission line 21 and the second transmission line 22 are connected in series, and both ends of the transmission lines connected in series respectively correspond to the first terminal 310 and the second terminal 320.

The first transmission line 21 and the second transmission line 22 are electromagnetically coupled to the third transmission line 23. In the present embodiment, the first transmission line 21 and the third transmission line 23 correspond to coupling of coils having equal number of turns T, and the second transmission line 22 and the third transmission line 23 also correspond to coupling of coils having equal number of turns T. For example, each of the number of turns T of each of the first transmission line 21, the second transmission line 22, and the third transmission line 23 is equal to n.

Next, the definition of the number of turns T in the specification will be described with reference to FIGS. 17 and 18.

Figure 17:
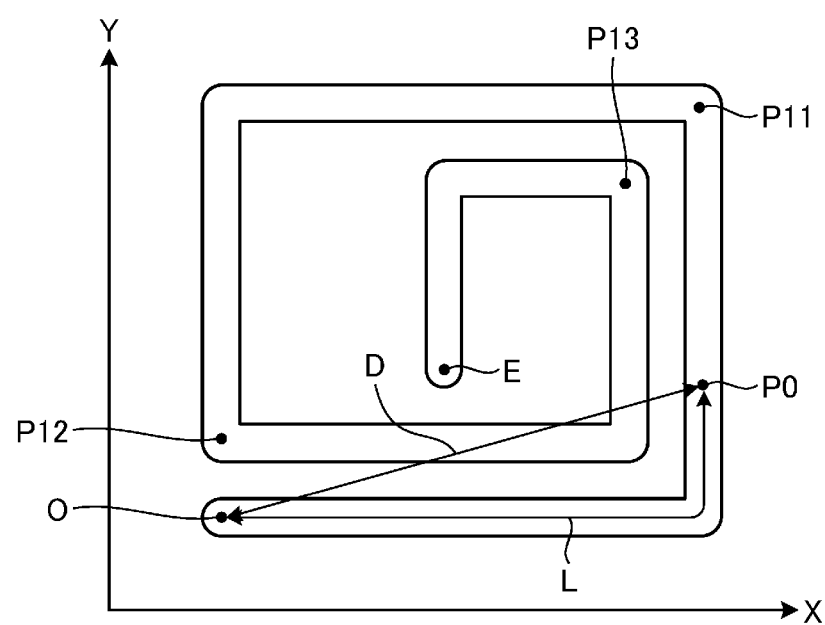
FIG. 17 is a diagram that shows an example of a coil pattern.

FIG. 17 is a diagram that shows an example of a coil pattern. An XY orthogonal coordinate system with the outer peripheral end portion of the coil pattern set to the origin O is defined. The coil pattern passes through a selected line from the origin O and reaches an inner peripheral end point E. A line length to a selected point P0 on the coil pattern is denoted by L. A Euclidean distance of the coordinates of point P0 is denoted by D.

Figure 18:
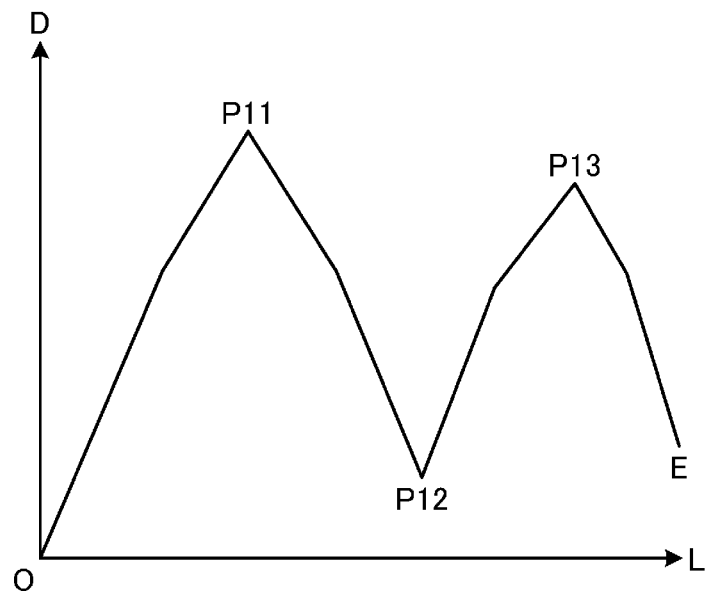
FIG. 18 is a graph that shows the relationship between line length and Euclidean distance when tracing from an origin to an end point along the coil pattern.

FIG. 18 is a graph that shows the relationship between line length L and Euclidean distance D when tracing from the origin O to the end point E along the coil pattern. In the case of the coil pattern shown in FIG. 17, the Euclidean distance D indicates the first local maximum value at point P11, then indicates a local minimum value at point P12, indicates the second maximum value at point P13, and reaches the end point E. The number of local maximum values that appear in the graph showing the relationship between the line length L and the Euclidean distance D is defined as the number of turns T of the coil pattern. The number of turns T of the coil pattern shown in FIG. 17 is two.

Initially, an alternating current that flows through the first transmission line 21, the second transmission line 22, and the third transmission line 23 will be described. A current flowing from the first terminal 310 toward the second terminal 320 initially flows from the third end portion 21A of the first transmission line 21 toward the fourth end portion 21B and then flows from the fifth end portion 22A of the second transmission line 22 toward the sixth end portion 22B. The magnitude of alternating current flowing through the first transmission line 21 is equal to the magnitude of alternating current flowing through the second transmission line 22. An odd mode current is induced in the third transmission line 23 from the first end portion 23A toward the second end portion 23B by alternating current flowing through the first transmission line 21, and an odd mode current is induced in the third transmission line 23 from the first end portion 23A toward the second end portion 23B by alternating current flowing through the second transmission line 22. The direction of odd mode current induced in the third transmission line 23 is opposite to the direction of alternating current flowing through the first transmission line 21 and the second transmission line 22. An odd mode current caused by a current flowing through the first transmission line 21 and an odd mode current caused by a current flowing through the second transmission line 22 are equal in magnitude and direction.

An odd mode current from the first transmission line 21 and an odd mode current from the second transmission line 22 flow through the third transmission line 23 in a superposed manner. Therefore, an odd mode current with a magnitude twice the magnitude of current flowing through a series circuit made up of the first transmission line 21 and the second transmission line 22 is induced in the third transmission line 23. When the magnitude of current flowing from the first terminal 310 into the transmission line transformer 200 is denoted by i, a current of $(1/3)i$ flows through the series circuit of the first transmission line 21 and the second transmission line 22, and a current of $(2/3)i$ flows through the third transmission line 23. The magnitude of current output from the second terminal 320 is $(1/3)i$.

Next, voltages will be described. The voltage at the first terminal 310 is denoted by v1, and the voltage at the second terminal 320 is denoted by v2. The voltage at the third end portion 21A of the first transmission line 21 and the voltage at the first end portion 23A of the third transmission line 23 both are equal to the voltage v1 at the first terminal 310. The voltage at the sixth end portion 22B of the second transmission line 22 is equal to the voltage v2 at the second terminal 320. The voltage at the fourth end portion 21B of the first transmission line 21 is denoted by v3. The voltage at the fifth end portion 22A of the second transmission line 22 is equal to v3 that is the voltage at the fourth end portion 21B of the first transmission line 21. The voltage at the second end portion 23B of the third transmission line 23 is 0 V.

Since the potential difference between the third end portion 21A and fourth end portion 21B of the first transmission line 21 is equal to the potential difference between the second end portion 23B and first end portion 23A of the third transmission line 23, v1−v3=0−v1 holds. Similarly, between the second transmission line 22 and the third transmission line 23, v3−v2=0−v1 holds. When the simultaneous equations are solved, 3×v1=v2 is obtained. In this way, the voltage v2 at the second terminal 320 is three times the voltage v1 at the first terminal 310.

When a load with an impedance R2 is connected to the second terminal 320, v2=(1/3)i×R2 holds. When the impedance at the time when a load side is viewed from the first terminal 310 is denoted by R1, v1=R1×i holds. When these expressions are solved, R1=(1/9)R2 is obtained. In this way, the impedance R1 when a load side is viewed from the first terminal 310 is (1/9) times the impedance R2 of the load connected to the second terminal 320. Conversely, when a load is connected to the first terminal 310, the impedance at the time when a load side is viewed from the second terminal 320 is nine times the impedance of the load connected to the first terminal 310. In this way, the transmission line transformer 200 functions as an impedance conversion circuit with an impedance conversion ratio of nine.

Figure 15:
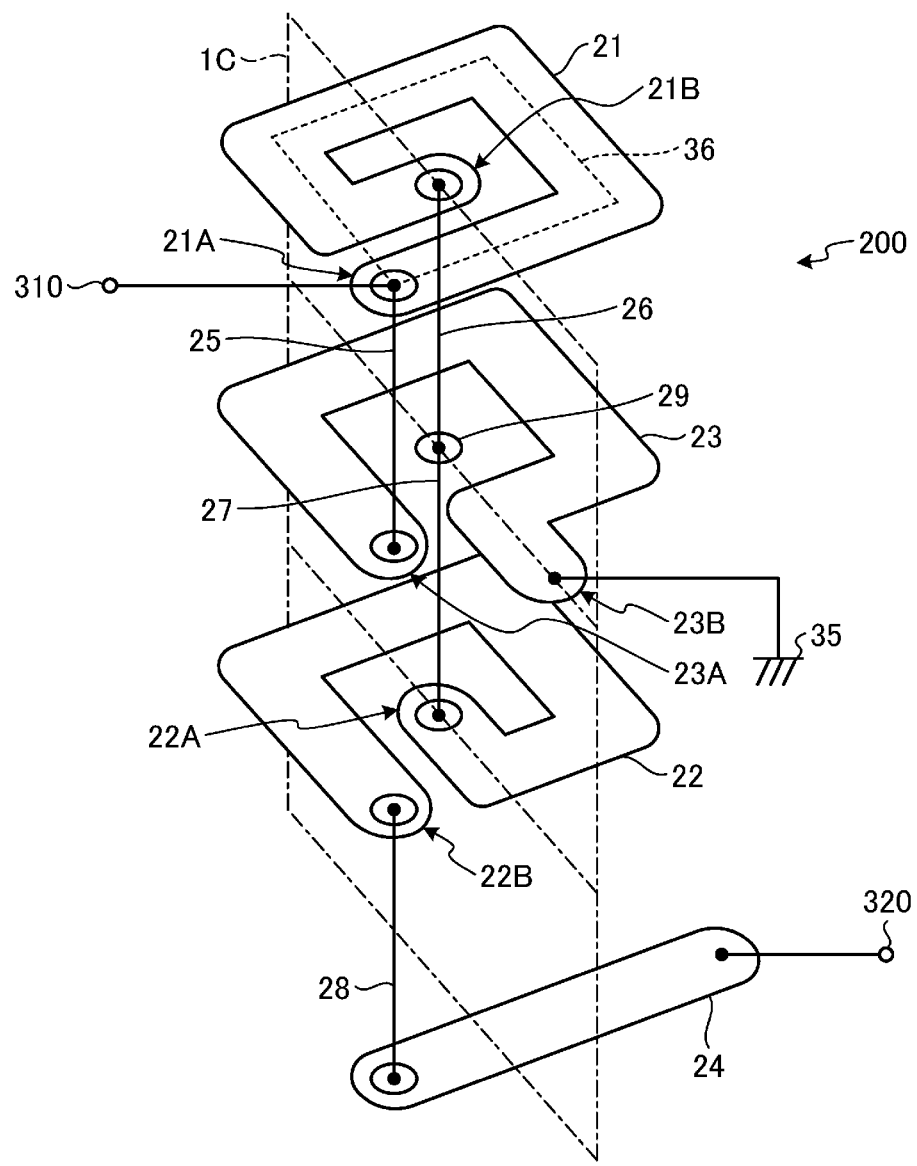
FIG. 15 is a schematic perspective view of the transmission line transformer.

FIG. 15 is a schematic perspective view of the transmission line transformer 200. FIG. 16 is a cross-sectional view taken along a cross section represented by the alternate long and short dashed line 1C in FIG. 15.

Figure 16:
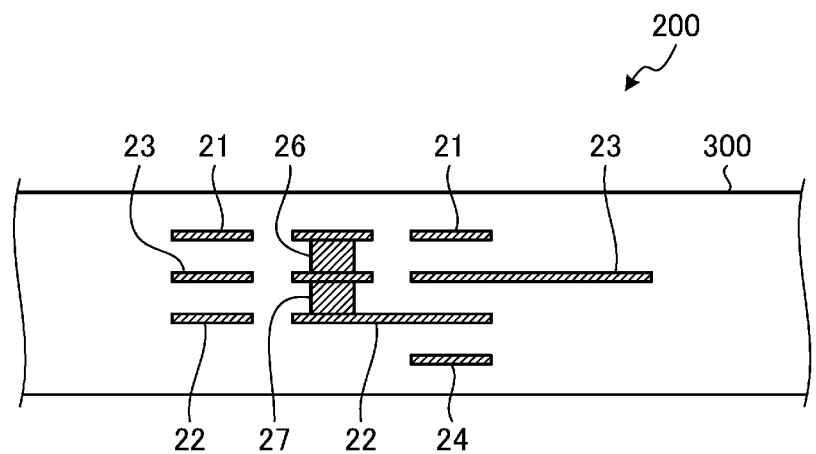
FIG. 16 is a cross-sectional view taken along a cross section represented by the alternate long and short dashed line in FIG. 15.

The first transmission line 21 and the second transmission line 22 are disposed at different locations in the thickness direction of a substrate 300 (FIG. 16). For example, a magnetic insulator or a dielectric may be used for the substrate 300. Examples of the substrate made of a dielectric include a resin substrate and a ceramic substrate. An insulator layer formed on a semiconductor substrate may be used as the substrate 300. The third transmission line 23 is disposed between the first transmission line 21 and the second transmission line 22. The first transmission line 21, the second transmission line 22, and the third transmission line 23 each are made up of a spiral conductor pattern of which the dimension in the width direction is greater than the dimension in the thickness direction. In addition, an extended line 24 and a ground conductor 35 (FIG. 15) are disposed in the substrate 300.

The third end portion 21A of the first transmission line 21, the first end portion 23A of the third transmission line 23, and the sixth end portion 22B of the second transmission line 22 are disposed at locations that overlap one another in plan view. The fourth end portion 21B of the first transmission line 21 and the fifth end portion 22A of the second transmission line 22 are disposed at locations that overlap each other in plan view. A conductor pattern 29 is disposed at a location corresponding to the fourth end portion 21B of the first transmission line 21 in the same layer with the third transmission line 23. A via conductor 25 connects the third end portion 21A of the first transmission line 21 to the first end portion 23A of the third transmission line 23. A via conductor 26 connects the fourth end portion 21B of the first transmission line 21 to the conductor pattern 29. A via conductor 27 connects the conductor pattern 29 to the fifth end portion 22A of the second transmission line 22. A via conductor 28 connects the sixth end portion 22B of the second transmission line 22 to the extended line 24. The third end portion 21A of the first transmission line 21 is connected to the first terminal 310, and the extended line 24 is connected to the second terminal 320. The second end portion 23B of the third transmission line 23 is connected to the ground conductor 35.

In plan view, the first transmission line 21 extends so as to turn in a first rotation direction (counterclockwise direction in FIG. 15) with a start point set at the third end portion 21A. The third transmission line 23 extends so as to turn in a second rotation direction (clockwise direction in FIG. 15) opposite to the first rotation direction with a start point set at the first end portion 23A. The second transmission line 22 extends so as to turn in the first rotation direction with a start point set at the fifth end portion 22A.

In plan view, a closed imaginary circuit 36 along the outer periphery of a substantially square shape. The third end portion 21A of the first transmission line 21, the first end portion 23A of the third transmission line 23, and the sixth end portion 22B of the second transmission line 22 are disposed at the same point on the circuit 36 in plan view. The fourth end portion 21B of the first transmission line 21, the conductor pattern 29, and the fifth end portion 22A of the second transmission line 22 are disposed at locations inside the circuit 36 in plan view. The third end portion 21A, the first end portion 23A, and the sixth end portion 22B may be disposed such that these end portions partially overlap in plan view. Similarly, the fourth end portion 21B, the conductor pattern 29, and the fifth end portion 22A may be disposed such that these end portions partially overlap in plan view.

The first transmission line 21 makes substantially a round in the first rotation direction from the third end portion 21A along the circuit 36, then extends inward of the circuit 36, and reaches the fourth end portion 21B. The third transmission line 23 makes substantially a round in the second rotation direction from the first end portion 23A along the circuit 36, then extends outward of the circuit 36, and reaches the second end portion 23B. The second transmission line 22 extends toward the circuit 36 from the fifth end portion 22A located inside the circuit 36, and then makes substantially a round along the circuit 36 in the first rotation direction, and reaches the sixth end portion 22B. In this way, the first transmission line 21, the second transmission line 22, and the third transmission line 23 each make up a coil pattern of which the number of turns is about one.

Parts along the circuit 36 of the first transmission line 21, the second transmission line 22, and the third transmission line 23 at least partially overlap in plan view. Therefore, the first transmission line 21 is capacitively coupled to the third transmission line 23, and the second transmission line 22 is also capacitively coupled to the third transmission line 23.

Next, an excellent effect in the case where the transmission line transformer 200 is used will be described. In a transmission line transformer having two-layer structure of the first transmission line 21 and the third transmission line 23, the impedance conversion ratio is about four. In contrast, the impedance conversion ratio of the transmission line transformer 200 is about nine, so the impedance conversion ratio greater than the two-layer structure transmission line transformer is implemented. This is because an odd mode current induced in the third transmission line 23 is doubled when the third transmission line 23 is electromagnetically coupled to both the first transmission line 21 and the second transmission line 22.

In addition, since the first transmission line 21, the second transmission line 22, and the third transmission line 23 are disposed so as to substantially overlap in plan view, a region occupied by the transmission line transformer 200 in the substrate 300 does not increase even when the impedance conversion ratio is increased. Therefore, in comparison with a configuration in which a large impedance conversion ratio is achieved by connecting a plurality of transmission line transformers with a small impedance conversion ratio dependently, the size of the transmission line transformer 200 is able to be reduced.

Next, a transmission line transformer according to a modification will be described. In the transmission line transformer 200, the circuit 36 (FIG. 15) along which the first transmission line 21, the second transmission line 22, and the third transmission line 23 are formed is formed in a shape that coincides with the outer periphery of a substantially square shape; however, the other shapes are applicable. For example, the circuit 36 may be formed in a shape that coincides with the outer periphery of a circle, an ellipse, a rectangle, and other polygons. In the transmission line transformer 200, the series circuit made up of the first transmission line 21 and the second transmission line 22 may extend so as to turn in the counterclockwise direction with the third end portion 21A set for a start point, and the third transmission line 23 may turn in the clockwise direction. Alternatively, the rotation directions of both may be opposite.

In the transmission line transformer 200, the first transmission line 21, the second transmission line 22, and the third transmission line 23 are formed in a shape that substantially makes a round along the circuit 36. Alternatively, the length of a part in which the first transmission line 21, the second transmission line 22, and the third transmission line 23 are formed along the circuit 36 may be shorter than one round. In the definition (FIG. 17, FIG. 18) of the number of turns T in the specification, even when the length of a part along the circuit 36 is shorter than one round, the number of turns T can be one. To obtain sufficient electromagnetic coupling, the number of turns T of each of the first transmission line 21, the second transmission line 22, and the third transmission line 23 is preferably set to one or greater.

In the transmission line transformer 200, the width of each of conductor patterns that respectively make up the first transmission line 21, the second transmission line 22, and the third transmission line 23 is substantially equal. As for the other configuration, the width of the conductor pattern of the third transmission line 23 may be greater than or equal to the width of each of the conductor pattern of the first transmission line 21 and the conductor pattern of the second transmission line 22. In this case, in plan view, the conductor pattern of the first transmission line 21 and the conductor pattern of the second transmission line 22 just need to be disposed inside the conductor pattern of the third transmission line 23 in the width direction of the conductor pattern. With such an arrangement, capacitive coupling between the first transmission line 21 and the third transmission line 23 and capacitive coupling between the second transmission line 22 and the third transmission line 23 are able to be increased. By increasing capacitive coupling, a loss at the time of inducing an odd mode current in the third transmission line 23 is reduced. As a result, the effect that an insertion loss improves and the impedance conversion ratio approximates to a theoretical conversion ratio is obtained.

In the transmission line transformer 200, as shown in FIG. 15, the extended line 24 is disposed in a layer different from a layer of the second transmission line 22, and the second transmission line 22 and the second terminal 320 are connected via the extended line 24. Alternatively, the extended line 24 may be disposed in the same layer as the layer of the second transmission line 22. With this configuration, since the second transmission line 22 and the extended line 24 are formed by a common conductor pattern, the sixth end portion 22B of the second transmission line 22 is not clearly identified. In this case, a location where the second transmission line 22 deviates from the circuit 36 just needs to be defined as the sixth end portion 22B.

In the transmission line transformer 200, as shown in FIG. 15, the distal end of a part extending from a part of the third transmission line 23 along the circuit 36 extended outward is defined as the second end portion 23B (FIG. 15). Other than that, the end of a part along the circuit 36 may be defined as the second end portion 23B, and a part from the end to the ground conductor 35 may be regarded as part of an extended line.

Similarly, the end of a part of the first transmission line 21 along the circuit 36 may be defined as the fourth end portion 21B, and a part extending from the end toward the inside of the circuit 36 may be regarded as a wire that connects the first transmission line 21 to the second transmission line 22. Similarly, the end of a part of the second transmission line 22 along the circuit 36 may be defined as the fifth end portion 22A, and a part extending from the end toward the inside of the circuit 36 may be regarded as a wire that connects the first transmission line 21 to the second transmission line 22.

(Second-Order Harmonic Termination Circuit)

Figure 19:
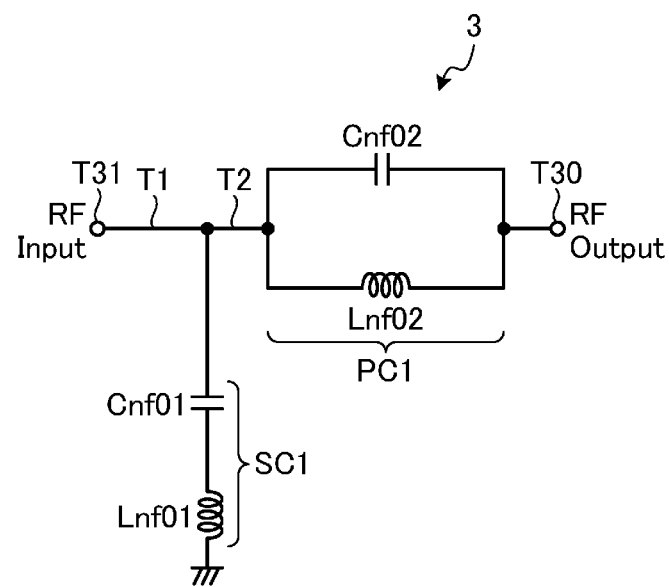
FIG. 19 is a diagram that shows a configuration example of a second-order harmonic termination circuit.

The series resonant circuit SC described with reference to FIG. 2 may be used for the second-order harmonic termination circuit 3. In this case, for example, in FIG. 2, the first terminal T1 may be set as the third input terminal T31 of the harmonic termination circuit 30, and the second terminal T2 may be set as the third output terminal T30 of the harmonic termination circuit 30. A plurality of the series resonant circuits SC may be used. The parallel resonant circuit PC described with reference to FIG. 3 may be used for the second-order harmonic termination circuit 3. In this case, for example, in FIG. 3, the first terminal T1 may be set as the third input terminal T31 of the harmonic termination circuit 30, and the second terminal T2 may be set as the third output terminal T30 of the harmonic termination circuit 30. A plurality of the parallel resonant circuits PC may be used. In addition, the circuit shown in FIG. 19 may be used for the second-order harmonic termination circuit 3. FIG. 19 is a diagram that shows a configuration example of the second-order harmonic termination circuit 3. The second-order harmonic termination circuit 3 shown in FIG. 19 includes a series resonant circuit SC1 made up of a capacitor Cnf01 and an inductor Lnf01 connected in series, and a parallel resonant circuit PC1 made up of a capacitor Cnf02 and an inductor Lnf02 connected in parallel. In the second-order harmonic termination circuit 3 shown in FIG. 19, the first terminal T1 and the second terminal T2 are provided between the third input terminal T31 and the third output terminal T30, and the series resonant circuit SC1 is provided between the first terminal T1 and the second terminal T2. One end of the series resonant circuit SC1 is connected to the reference potential, and the other end of the series resonant circuit SC1 is connected to both the first terminal T1 and the second terminal T2. One end of the parallel resonant circuit PC1 is connected to the third input terminal T31, and the other end of the parallel resonant circuit PC1 is connected to the third output terminal T30. The second-order harmonic termination circuit 3 reflects at least part of even-ordered harmonics and odd-ordered harmonics contained in the third radio-frequency signal S3 input to the third input terminal T31 by resonance between the capacitor Cnf01 and the inductor Lnf01 in the series resonant circuit SC1 and resonance between the capacitor Cnf02 and the inductor Lnf02 in the parallel resonant circuit PC1.

(Filter)

Figure 20:
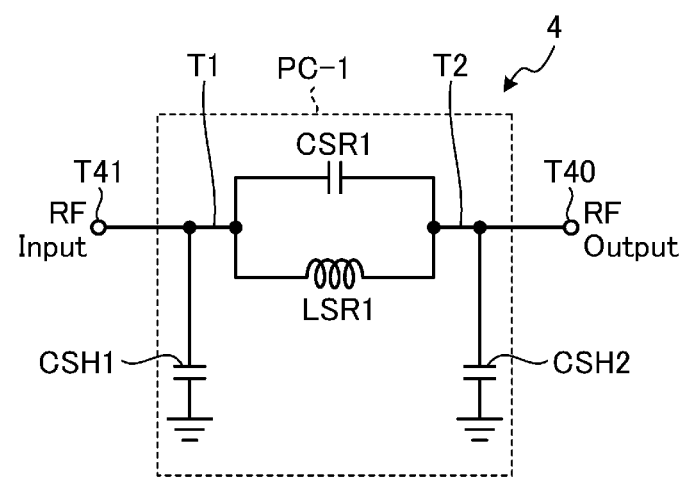
FIG. 20 is a diagram that shows a configuration example of a filter.

FIG. 20 is a diagram that shows a configuration example of the filter 4. The filter 4 shown in FIG. 20 includes a unit filter circuit PC-1. The unit filter circuit PC-1 includes a parallel resonant circuit. The unit filter circuit PC-1 includes a parallel resonant circuit, the first terminal T1, and the second terminal T2. The parallel resonant circuit includes a capacitor CSR1 that is a first capacitor and an inductor LSR1 that is a first inductor. The capacitor CSR1 that is the first capacitor and the inductor LSR1 that is the first inductor are connected in parallel between the first terminal T1 and the second terminal T2. The unit filter circuit PC-1 includes a capacitor CSH1 that is a second capacitor connected between the first terminal T1 and the reference potential, and a capacitor CSH2 that is a third capacitor connected between the second terminal T2 and the reference potential. The unit filter circuit PC-1 attenuates at least part of even-ordered harmonics and odd-ordered harmonics contained in the fifth radio-frequency signal S5 input to the fourth input terminal T41 of the filter 4 by resonance between the capacitor CSR1 that is the first capacitor and the inductor LSR1 that is the first inductor, included in the parallel resonant circuit.

Figure 21:
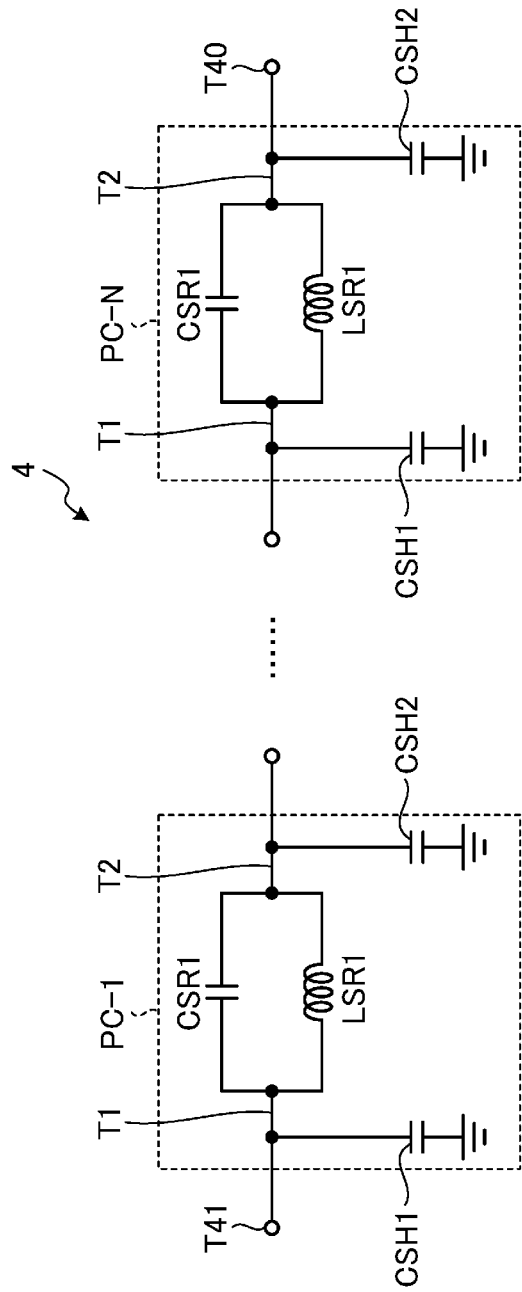
FIG. 21 is a diagram that shows a filter including N unit filter circuits.

The filter 4 may include multiple-stage cascaded unit filter circuits. FIG. 21 is a diagram that shows the filter 4 including N unit filter circuits PC-1, . . . , PC-N. In FIG. 21, the filter 4 includes N-stage (N is a natural number) cascaded unit filter circuits PC-1, . . . , PC-N. In the unit filter circuits PC-1, . . . , PC-N, the output terminal of a preceding-stage unit filter circuit is connected to the input terminal of a following-stage unit filter circuit. The first terminal T1 of the first-stage unit filter circuit PC-1 is connected to the fourth input terminal T41. The second terminal T2 of the last-stage unit filter circuit PC-N is connected to the fourth output terminal T40.

The configuration of the filter 4 of FIG. 20 corresponds to the case of "N=1" in FIG. 21. When the number of stages of unit filter circuits is one, that is, in the case of "N=1", the first-stage unit filter circuit is the last-stage unit filter circuit.

Incidentally, in any adjacent two unit filter circuits, a third capacitor connected to the second terminal T2 of the preceding-stage unit filter circuit and a first capacitor connected to the first terminal T1 of the subsequent-stage unit filter circuit may be integrated as a capacitor. In other words, not those capacitors are provided separately but a capacitor common to adjacent two unit filter circuits may be adopted.

Figure 22:
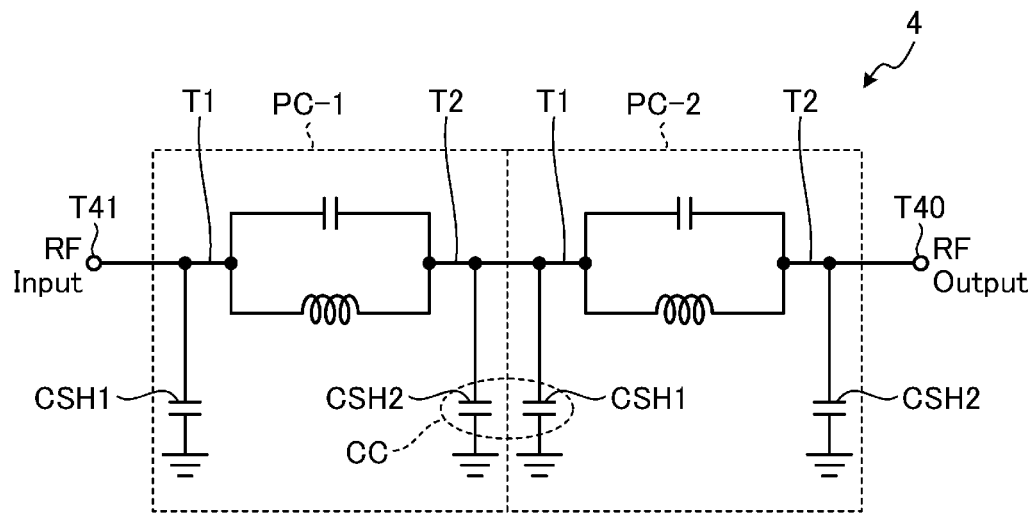
FIG. 22 is a diagram that illustrates a capacitor common to adjacent two unit filter circuits.

FIG. 22 is a diagram that illustrates a capacitor common to adjacent two unit filter circuits. As shown in FIG. 22, a third capacitor connected to the second terminal T2 of a preceding-stage unit filter circuit PC-1 and a first capacitor connected to the first terminal T1 of a subsequent-stage unit filter circuit PC-2 may be integrated as a capacitor CC. Even in the case where three unit filter circuits are cascaded (not shown), similarly, a third capacitor connected to the second terminal T2 of a preceding-stage unit filter circuit and a first capacitor connected to the first terminal T1 of a subsequent-stage unit filter circuit may be integrated as a capacitor CC.

Figure 23:
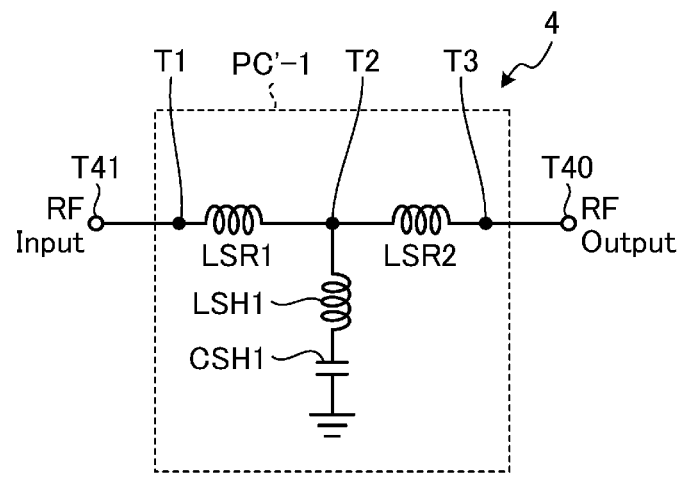
FIG. 23 is a diagram that shows another unit filter circuit.

FIG. 23 is a diagram that shows another unit filter circuit PC-1. The unit filter circuit PC-1 shown in FIG. 23 includes a series resonant circuit. The unit filter circuit PC-1 includes a first terminal T1, a second terminal T2, a third terminal T3, an inductor LSR1 that is a first inductor, an inductor LSR2 that is a second inductor, and a series resonant circuit. The series resonant circuit is made up of a capacitor CSH1 that is a first capacitor and an inductor LSR3 that is a third inductor, connected in series with each other. The inductor LSR1 that is the first inductor is connected between the first terminal T1 and the second terminal T2. The inductor LSR2 that is the second inductor is connected between the second terminal T2 and the third terminal T3. The capacitor CSH1 that is the first capacitor and the inductor LSR3 that is the third inductor are connected between the second terminal T2 and the reference potential. The unit filter circuit PC'-1 attenuates at least part of even-ordered harmonics and odd-ordered harmonics contained in the fifth radio-frequency signal S5 input to the fourth input terminal T41 of the filter 4 by resonance between the capacitor CSH1 that is the first capacitor and the inductor LSR3 that is the third inductor, included in the series resonant circuit.

Figure 24:
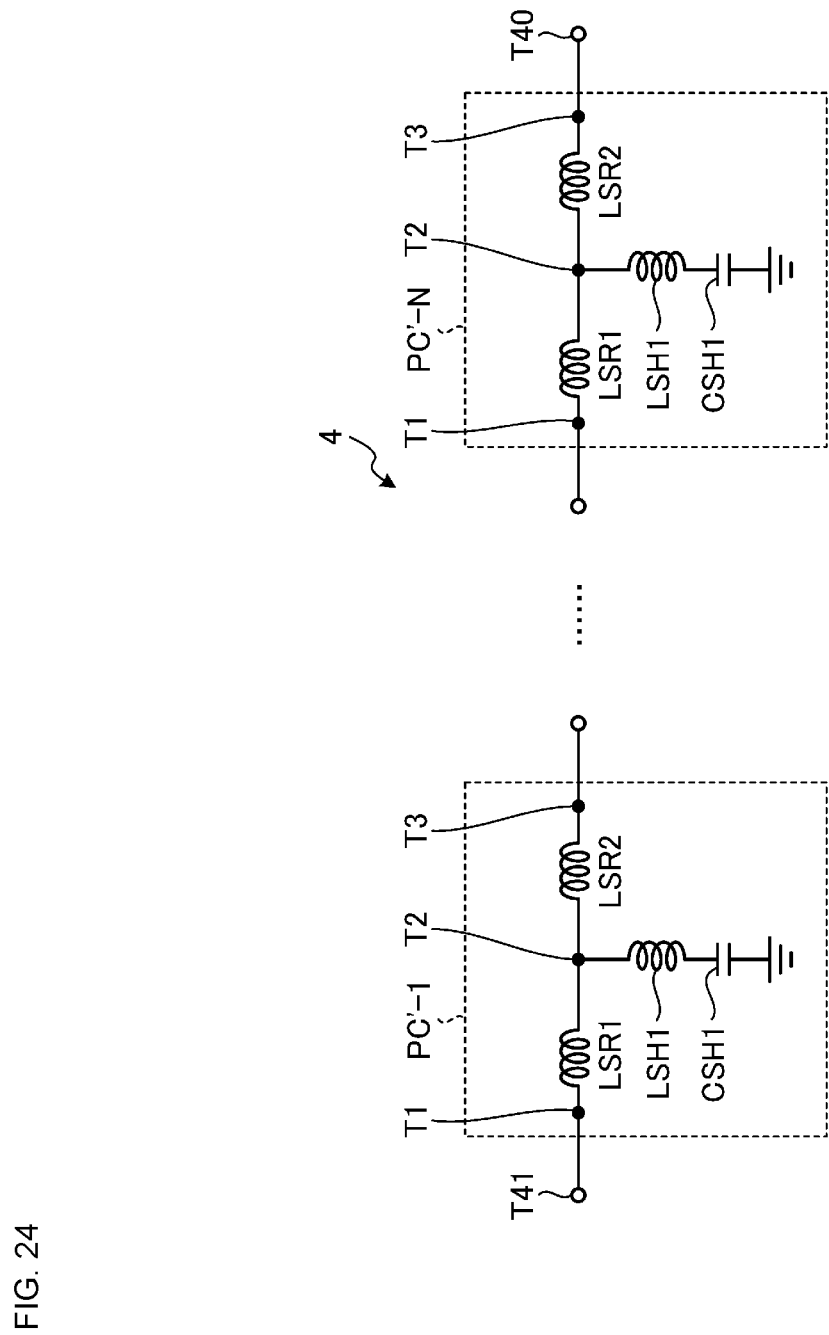
FIG. 24 is a diagram that shows a filter including N unit filter circuits.

The filter 4 may include multiple-stage cascaded unit filter circuits. FIG. 24 is a diagram that shows the filter 4 including N unit filter circuits PC'-1, ..., PC'-N. In FIG. 24, the filter 4 includes N-stage (N is a natural number) cascaded unit filter circuits PC'-1, ..., PC'-N. In the unit filter circuits PC'-1, ..., PC'-N, the output terminal of a preceding-stage unit filter circuit is connected to the input terminal of a following-stage unit filter circuit. The first terminal T1 of the first-stage unit filter circuit PC-1 is connected to the fourth input terminal T41. The second terminal T2 of the last-stage unit filter circuit PC-N is connected to the fourth output terminal T40.

The configuration of the filter 4 of FIG. 23 corresponds to the case of "N=1" in FIG. 24. When the number of stages of unit filter circuits is one, that is, in the case of "N=1", the first-stage unit filter circuit is the last-stage unit filter circuit.

Incidentally, in any adjacent two unit filter circuits, a third inductor connected to the second terminal T2 of the preceding-stage unit filter circuit and a first inductor connected to the first terminal T1 of the subsequent-stage unit filter circuit may be integrated as an inductor. In other words, not those inductors are provided separately but an inductor common to adjacent two unit filter circuits may be adopted.

Figure 25:
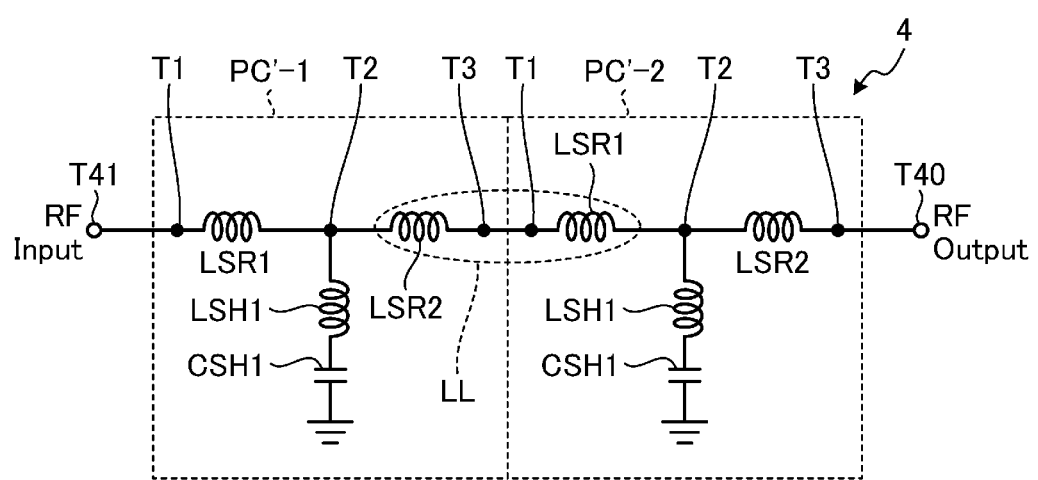
FIG. 25 is a diagram that illustrates an inductor common to adjacent two unit filter circuits.

FIG. 25 is a diagram that illustrates an inductor common to adjacent two unit filter circuits. As shown in FIG. 25, a third inductor connected to the second terminal T2 of a preceding-stage unit filter circuit PC-1 and a first inductor connected to the first terminal T1 of a subsequent-stage unit filter circuit PC'-2 may be integrated as an inductor LL. Even in the case where three unit filter circuits are cascaded (not shown), similarly, a third inductor connected to the second terminal T2 of a preceding-stage unit filter circuit and a first inductor connected to the first terminal T1 of a subsequent-stage unit filter circuit may be integrated as an inductor LL.

Figure 26:
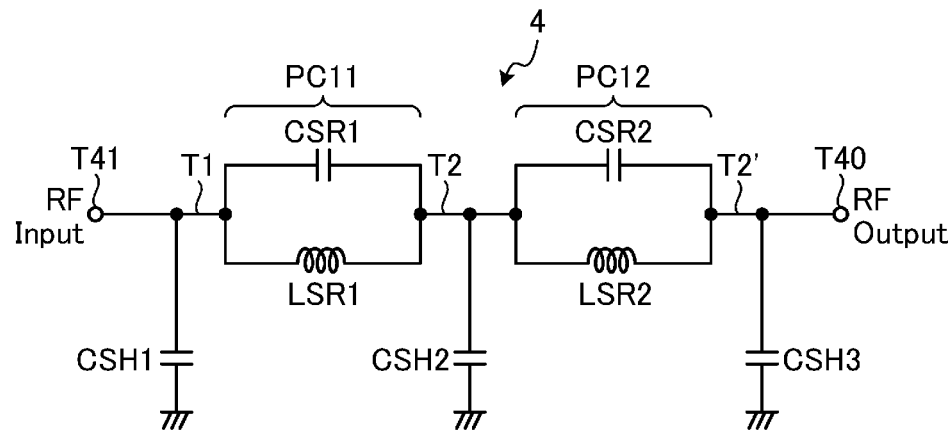
FIG. 26 is a diagram that shows a configuration example of a filter.

The filter 4 shown in FIG. 26 has such a configuration that, in FIG. 22, a third capacitor connected to the second terminal T2 of a preceding-stage unit filter circuit and a first capacitor connected to the first terminal T1 of a subsequent-stage unit filter circuit may be integrated as a capacitor CSH2. The filter 4 shown in FIG. 26 is provided between the fourth input terminal T41 and the fourth output terminal T40. The first terminal T1 and the second terminal T2 are provided between the fourth input terminal T41 and the fourth output terminal T40. The first terminal T1 is connected to the fourth input terminal T41. A parallel resonant circuit PC11 is provided between the first terminal T1 and the second terminal T2. The parallel resonant circuit PC11 is a parallel resonant circuit made up of the capacitor CSR1 and the inductor LSR1 connected in parallel. The second terminal T2' is provided between the fourth input terminal T41 and the fourth output terminal T40. The second terminal T2' is connected to the fourth output terminal T40. The parallel resonant circuit PC11 and a parallel resonant circuit PC12 are provided between the first terminal T1 and the second terminal T2'. The parallel resonant circuit PC12 is a parallel resonant circuit made up of a capacitor CSR2 and an inductor LSR2 connected in parallel. The filter 4 includes a capacitor CSH2 connected between the reference potential and a junction point of the parallel resonant circuit PC11 with the parallel resonant circuit PC12, a capacitor CSH1 connected between the first terminal T1 and the reference potential, and a capacitor CSH3 connected between a second terminal T2' and the reference potential. In the filter 4, at least part of even-ordered harmonics and odd-ordered harmonics contained in the fifth radio-frequency signal S5 input to the fourth input terminal T41 are attenuated by resonance between the capacitor and the inductor included in each of the parallel resonant circuits PC11, PC12. The filter 4 of FIG. 26 includes two parallel resonant circuits PC11, PC12. Alternatively, the filter 4 may include one parallel resonant circuit PC11. In this case, the filter 4 includes two capacitors CSH1, CSH2. The filter 4 may include a series resonant circuit instead of each of the parallel resonant circuits.

Here, assuming a circuit configuration in which the second-order harmonic termination circuit 3 that reflects a second-order harmonic is provided just after the power amplifier circuit 1 and the first impedance matching circuit 2 is provided in a subsequent stage of the second-order harmonic termination circuit. In this circuit configuration, attenuation in the second-order harmonic termination circuit 3 is large, and the level of reflected wave component reduces, so good characteristics are not obtained from a signal input to the power amplifier circuit 1. A second-order harmonic is a harmonic with a frequency of a fundamental twice as high among harmonics.

In contrast, in the circuit configuration shown in FIG. 5, the first impedance matching circuit 2 is provided just after the power amplifier circuit 1, and the second-order harmonic termination circuit 3 is provided in a subsequent stage of the first impedance matching circuit 2, so the level of reflected wave component is able to be increased, and good characteristics are obtained.

In the first embodiment shown in FIG. 5, a third-order harmonic termination circuit (not shown) that reflects a third-order harmonic may be provided in a subsequent stage of the second-order harmonic termination circuit 3, and a third-order harmonic may be superposed on a fundamental in addition to a second-order harmonic. With this configuration, as in the case of the waveform P30 in which harmonics up to a third order are superposed as shown in FIG. 12, a waveform further close to a rectangular wave is obtained, so the loss of electric power is further reduced. In addition, a termination circuit that reflects a higher-order harmonic may be provided to superpose a higher-order harmonic. With this configuration, a waveform much closer to a rectangular wave is obtained, so the loss of electric power is further reduced.

The level of a harmonic reduces as the order of the harmonic increases. Therefore, to obtain a reflected wave component with a large amplitude, as described above, preferably, the first impedance matching circuit 2 is provided just after the power amplifier circuit 1, and the second-order harmonic termination circuit 3 is provided just after the first impedance matching circuit 2.

Summary of First Embodiment

The first impedance matching circuit 2 is provided in a subsequent stage of the power amplifier circuit 1, and the second-order harmonic termination circuit 3 is provided just after the first impedance matching circuit 2. Thus, a component reflected by the second-order harmonic termination circuit 3 is converted in impedance by the first impedance matching circuit 2 with less attenuation and is input to the output stage of the power amplifier circuit 1.

Second Embodiment

Figure 27:
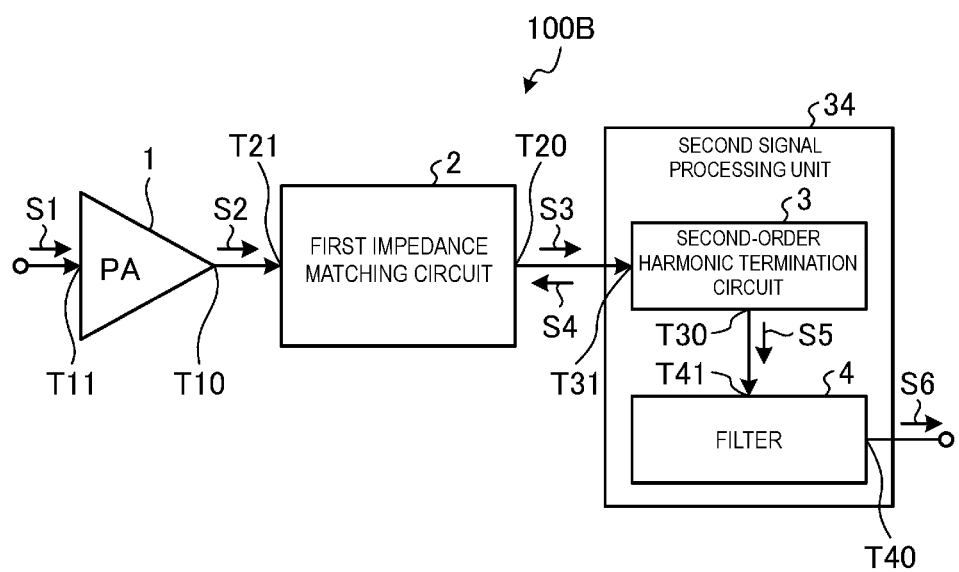
FIG. 27 is a diagram that shows the configuration of a power amplifier unit according to a second embodiment.

FIG. 27 is a diagram that shows the configuration of a power amplifier unit 100B according to a second embodiment. As shown in FIG. 27, the power amplifier unit 100B according to the second embodiment includes a power amplifier circuit 1, a first impedance matching circuit 2, and a second signal processing unit 34. In the power amplifier unit 100B according to the second embodiment shown in FIG. 27, the functions of the second-order harmonic termination circuit 3 of the power amplifier unit 100A and filter 4 shown in FIG. 5 are integrated in the same integrated circuit as the second signal processing unit 34.

Figure 28:
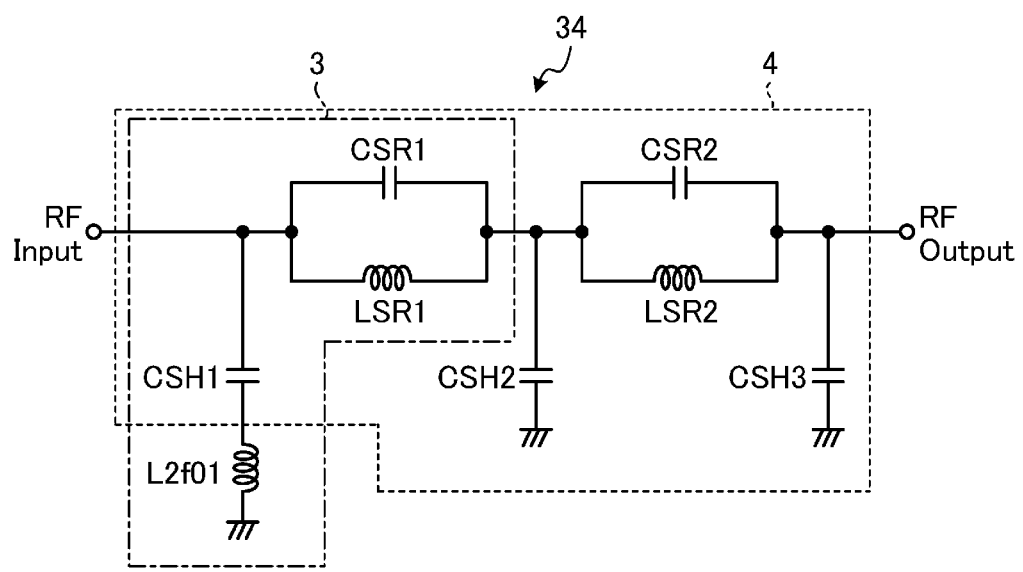
FIG. 28 is a diagram that shows a configuration example of a second signal processing unit in FIG. 27.

FIG. 28 is a diagram that shows a configuration example of the second signal processing unit 34 in FIG. 27. In FIG. 28, the second signal processing unit 34 shown in FIG. 28 includes a capacitor CSR1 and an inductor LSR1 connected in parallel, a capacitor CSR2 and an inductor LSR2 connected in parallel, a capacitor CSH2 connected between the reference potential and a junction point of them, a capacitor CSH1 and an inductor L2f01 connected in series between an input terminal and the reference potential, and a capacitor CSH3 connected between an output terminal and the reference potential.

In the second signal processing unit 34, a part surrounded by the alternate long and short dashed line, that is, a part made up of the capacitor CSR1 and the inductor LSR1 connected in parallel and the capacitor CSH1 and the inductor L2f01 connected in series has a function equivalent to the function of the second-order harmonic termination circuit 3 described with reference to FIG. 19. In the second signal processing unit 34, a part surrounded by the dashed line, other than the inductor L2f01, has a function equivalent to the function of the filter 4 described with reference to FIG. 26. Therefore, the second signal processing unit 34 has the function of the second-order harmonic termination circuit 3 described with reference to FIG. 19 and the function of the filter 4. The capacitors CSR1, CSH1 and the inductor LSR1 are the component elements of the second-order harmonic termination circuit 3 and also the component elements of the filter 4. In this way, the second-order harmonic termination circuit 3 and the filter 4 have partially common component elements, so the circuit size of the second signal processing unit 34 is reduced in comparison with the case where those are separately provided.

Third Embodiment

Figure 29:
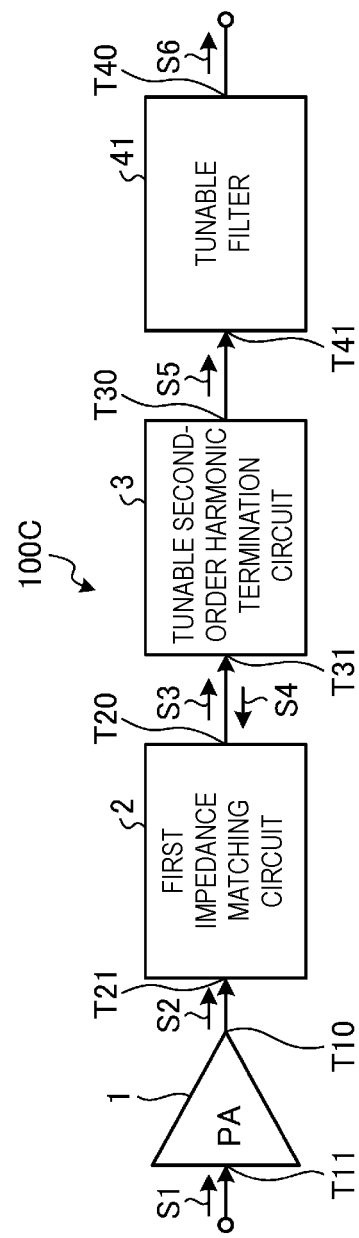
FIG. 29 is a diagram that shows the configuration of a power amplifier unit according to a third embodiment.

FIG. 29 is a diagram that shows the configuration of a power amplifier unit 100C according to a third embodiment. As shown in FIG. 29, the power amplifier unit 100C according to the third embodiment includes a power amplifier circuit 1, a first impedance matching circuit 2, a tunable second-order harmonic termination circuit 31, and a tunable filter 41.

Figure 30:
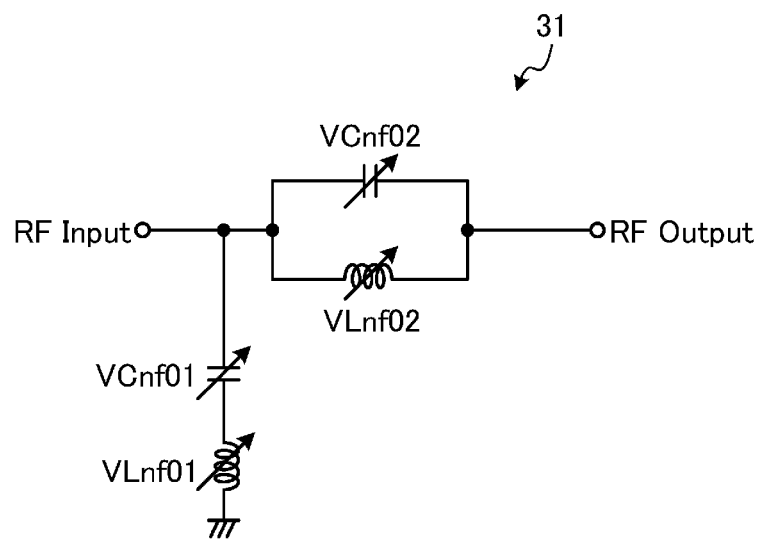
FIG. 30 is a diagram that shows a configuration example of a tunable second-order harmonic termination circuit.

FIG. 30 is a diagram that shows a configuration example of the tunable second-order harmonic termination circuit 31. The tunable second-order harmonic termination circuit 31 shown in FIG. 30 includes a capacitor VCnf01 and an inductor VLnf01 connected in series between an input terminal RFInput and a reference potential, and a capacitor VCnf02 and an inductor VLnf02 connected in parallel between the input terminal RFInput and an output terminal RFOutput. The input terminal RFInput corresponds to the fourth input terminal T41 in FIG. 29. The output terminal RFOutput corresponds to the fourth output terminal T40 in FIG. 29. The capacitor VCnf01 is capable of changing the capacitance value. The inductor VLnf01 is capable of changing the inductance value. Therefore, it is possible to set the resonant frequency of the capacitor VCnf01 and the inductor VLnf01 connected in series. The capacitor VCnf02 is capable of changing the capacitance value. The inductor VLnf02 is capable of changing the inductance value. Therefore, it is possible to set the resonant frequency of the capacitor VCnf02 and the inductor VLnf02 connected in parallel. Therefore, the tunable second-order harmonic termination circuit 31 has a function capable of adjusting the frequency to reflect. Since the tunable second-order harmonic termination circuit 31 is capable of adjusting the frequency to reflect, the tunable second-order harmonic termination circuit 31 is capable of reflecting an appropriate second-order harmonic in accordance with the fundamental of a frequency band (that is, a band) to be used. In other words, the tunable second-order harmonic termination circuit 31 is capable of changing the first phase or the second phase in accordance with the frequency of the fundamental.

Figure 31:
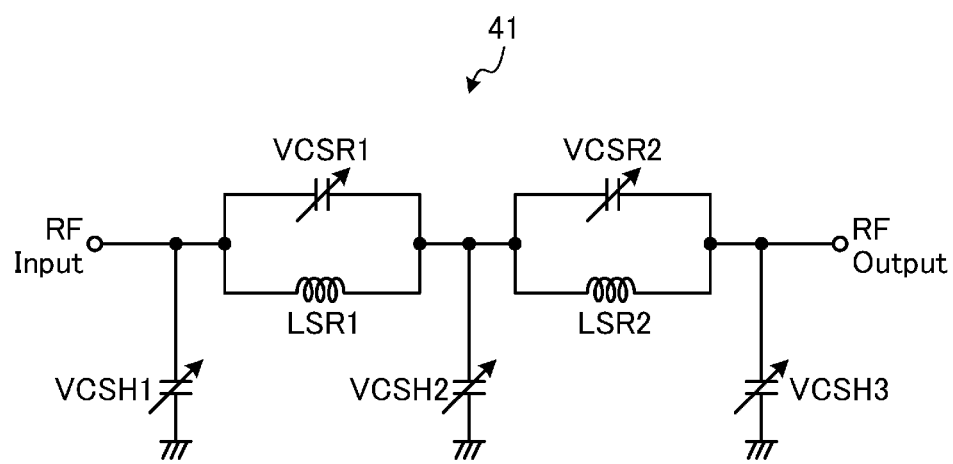
FIG. 31 is a diagram that shows a configuration example of a tunable filter.

FIG. 31 is a diagram that shows a configuration example of the tunable filter 41. The tunable filter 41 shown in FIG. 31 includes a capacitor VCSR1 and an inductor LSR1 connected in parallel, a capacitor VCSR2 and an inductor LSR2 connected in parallel, a capacitor VCSH2 connected between the reference potential and a junction point of them, a capacitor VCSH1 connected between the input terminal RFInput and the reference potential, and a capacitor VCSH3 connected between the output terminal RFOutput and the reference potential. One end of the capacitor VCSR1 and the inductor LSR1 connected in parallel is connected to the input terminal RFInput. One end of the capacitor VCSR2 and the inductor LSR2 connected in parallel is connected to the output terminal RFOutput. The input terminal RFInput corresponds to the fourth input terminal T41 in FIG. 29. The output terminal RFOutput corresponds to the fourth output terminal T40 in FIG. 29.

In the tunable filter 41, the capacitance value of each of the capacitors VCSR1, VCSR2, VCSH1, VCSH2, VCSH3 is able to be adjusted. Therefore, the tunable filter 41 has a function capable of adjusting the frequency to attenuate.

Figure 32:
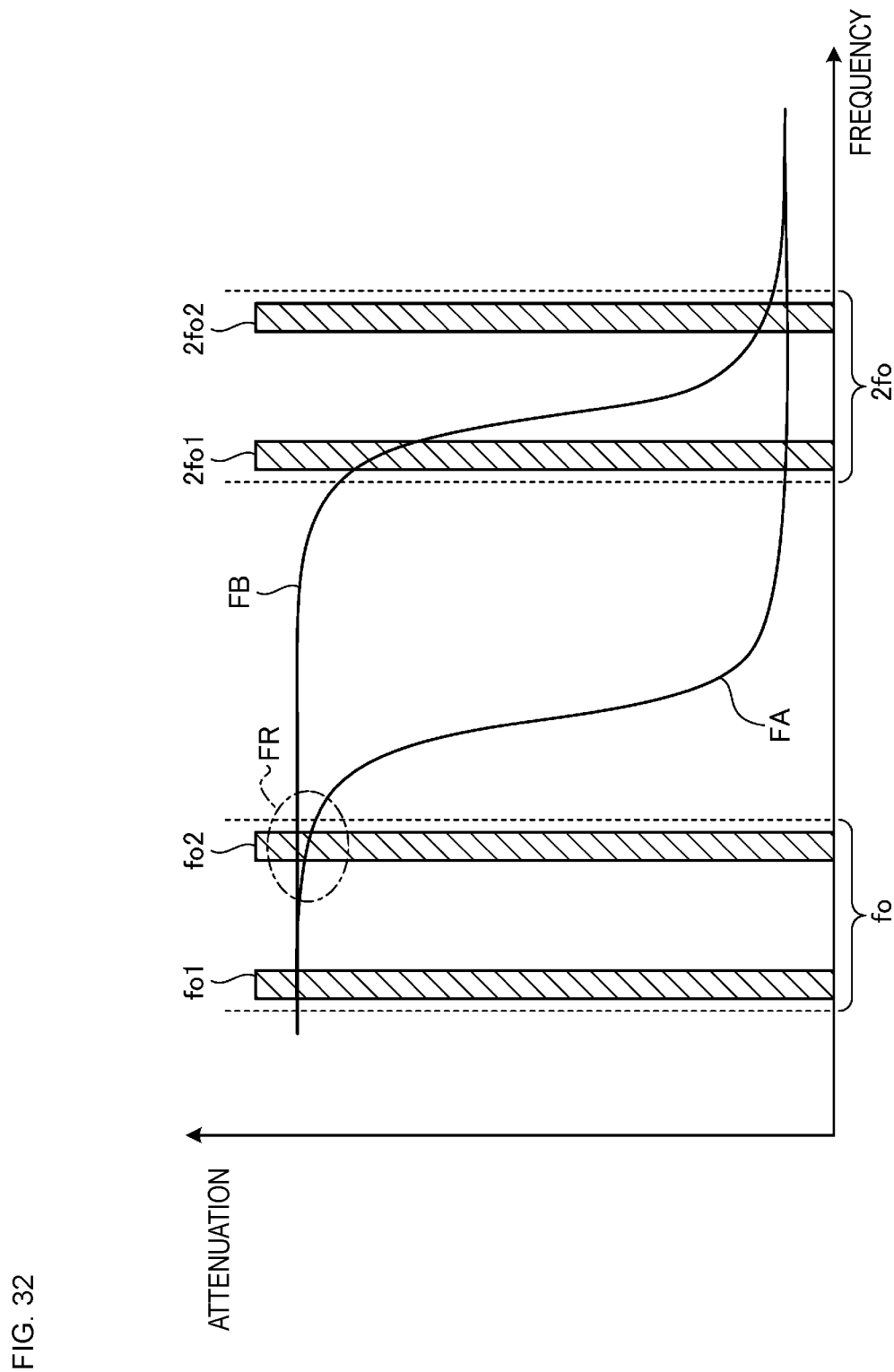
FIG. 32 is a graph that illustrates the function of a tunable filter.

FIG. 32 is a graph that illustrates the function of the tunable filter 41. In FIG. 32, the abscissa axis represents frequency, and the ordinate axis represents attenuation. A fundamental frequency band $f_0$ and a second-order harmonic frequency band $2f_0$ lie in the abscissa axis of FIG. 32. When the fundamental is $f_0 1$, the second-order harmonic is $2f_0 1$. When the fundamental is $f_0 2$ higher than $f_0 1$, the second-order harmonic is $2f_0 2$.

Here, the case where attenuation characteristics FA are set by the tunable filter 41 will be discussed. When the fundamental $f_0 1$ is used, the second-order harmonic $2f_0 1$ is attenuated in accordance with the set attenuation characteristics FA. When the fundamental to be used is changed and the fundamental $f_0 2$ is used, the second-order harmonic $2f_0 2$ is also able to be attenuated in accordance with the attenuation characteristics FA. However, when the fundamental is $f_0 2$, the fundamental is slightly attenuated in accordance with the attenuation characteristics FA in a region FR. Therefore, when the fundamental is $f_0 2$, attenuation based on the attenuation characteristics FA is not desirable.

For this reason, when the fundamental $f_0 2$ is used, setting made by the tunable filter 41 is changed from the attenuation characteristics FA to attenuation characteristics FB. With the changed attenuation characteristics FB, attenuation is not performed in the region FR, so good characteristics are obtained. At this time, the second-order harmonic $2f_0 2$ is attenuated in accordance with the attenuation characteristics FB. As described above, by using the tunable filter 41, it is possible to adjust attenuation characteristics in accordance with the fundamental to be used. Therefore, appropriate attenuation characteristics are obtained, and good characteristics are obtained.

Fourth Embodiment

Figure 33:
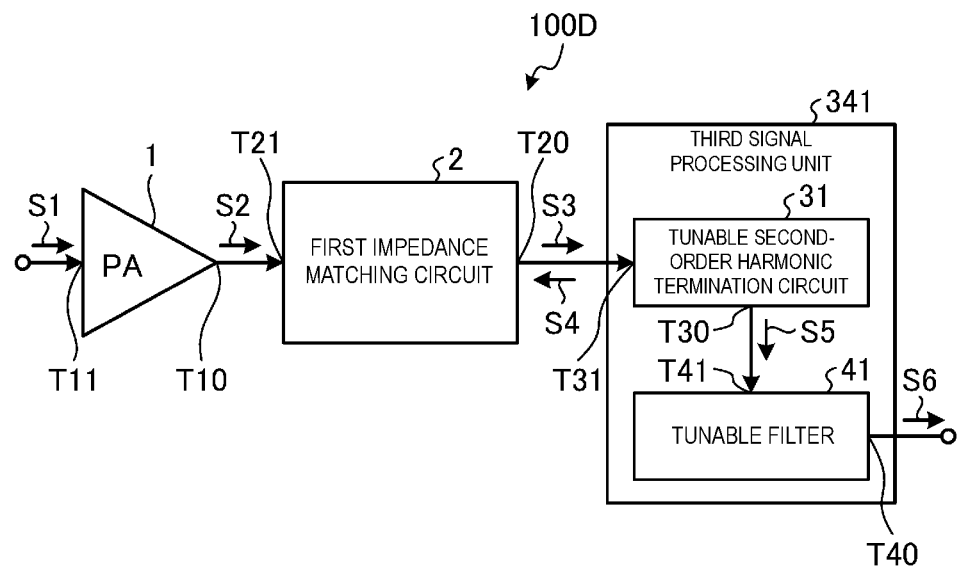
FIG. 33 is a diagram that shows the configuration of a power amplifier unit according to a fourth embodiment.

FIG. 33 is a diagram that shows the configuration of a power amplifier unit 100D according to a fourth embodiment. As shown in FIG. 33, the power amplifier unit 100D according to the fourth embodiment includes a power amplifier circuit 1, a first impedance matching circuit 2, and a third signal processing unit 341. The third signal processing unit 341 has the function of the tunable second-order harmonic termination circuit and the function of the tunable filter.

Figure 34:
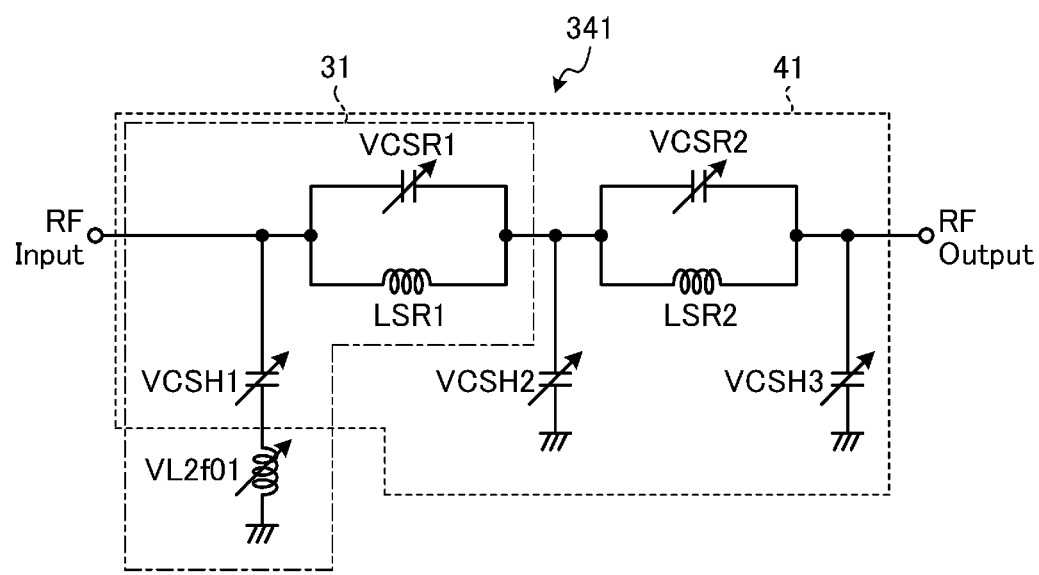
FIG. 34 is a diagram that shows a configuration example of a third signal processing unit in FIG. 33.

FIG. 34 is a diagram that shows a configuration example of the third signal processing unit 341 in FIG. 33. The third signal processing unit 341 shown in FIG. 34 includes a capacitor VCSR1 and an inductor LSR1 connected in parallel, a capacitor VCSR2 and an inductor LSR2 connected in parallel, and a capacitor VCSH2 connected between the reference potential and a junction point of them. The third signal processing unit 341 includes a capacitor VCSH1 and an inductor L2f01 connected in series between an input terminal RFInput and the reference potential, and a capacitor VCSH3 connected between an output terminal RFOutput and the reference potential. One end of the capacitor VCSR1 and the inductor LSR1 connected in parallel is connected to the input terminal RFInput. One end of the capacitor VCSR2 and the inductor LSR2 connected in parallel is connected to the output terminal RFOutput. The input terminal RFInput corresponds to the fourth input terminal T41 in FIG. 29. The output terminal RFOutput corresponds to the fourth output terminal T40 in FIG. 29.

In the third signal processing unit 341, a part surrounded by the alternate long and short dashed line, that is, a part made up of the capacitor VCSR1 and the inductor LSR1 connected in parallel and the capacitor VCSH1 and the inductor L2f01 connected in series has a function equivalent to the function of the tunable second-order harmonic termination circuit 31 described with reference to FIG. 30. In the third signal processing unit 341, a part surrounded by the dashed line has a function equivalent to the function of the tunable filter 41 described with reference to FIG. 31. The third signal processing unit 341 has the functions of the tunable second-order harmonic termination circuit 31 and tunable filter 41 described with reference to FIGS. 30 and 31.

As shown in FIG. 34, in the third signal processing unit 341, the capacitance value of each of the capacitors VCSR1, VCSR2, VCSH1, VCSH2, VCSH3 is able to be adjusted. The inductance value of the inductor L2f01 is able to be adjusted. The capacitors VCSR1, VCSH1 and the inductor LSR1 are the component elements of the tunable second-order harmonic termination circuit 31 and also the component elements of the tunable filter 41. In this way, the tunable second-order harmonic termination circuit 31 and the tunable filter 41 have partially common component elements, so the circuit size of the third signal processing unit 341 is reduced in comparison with the case where those are separately provided.

Fifth Embodiment

Figure 35:
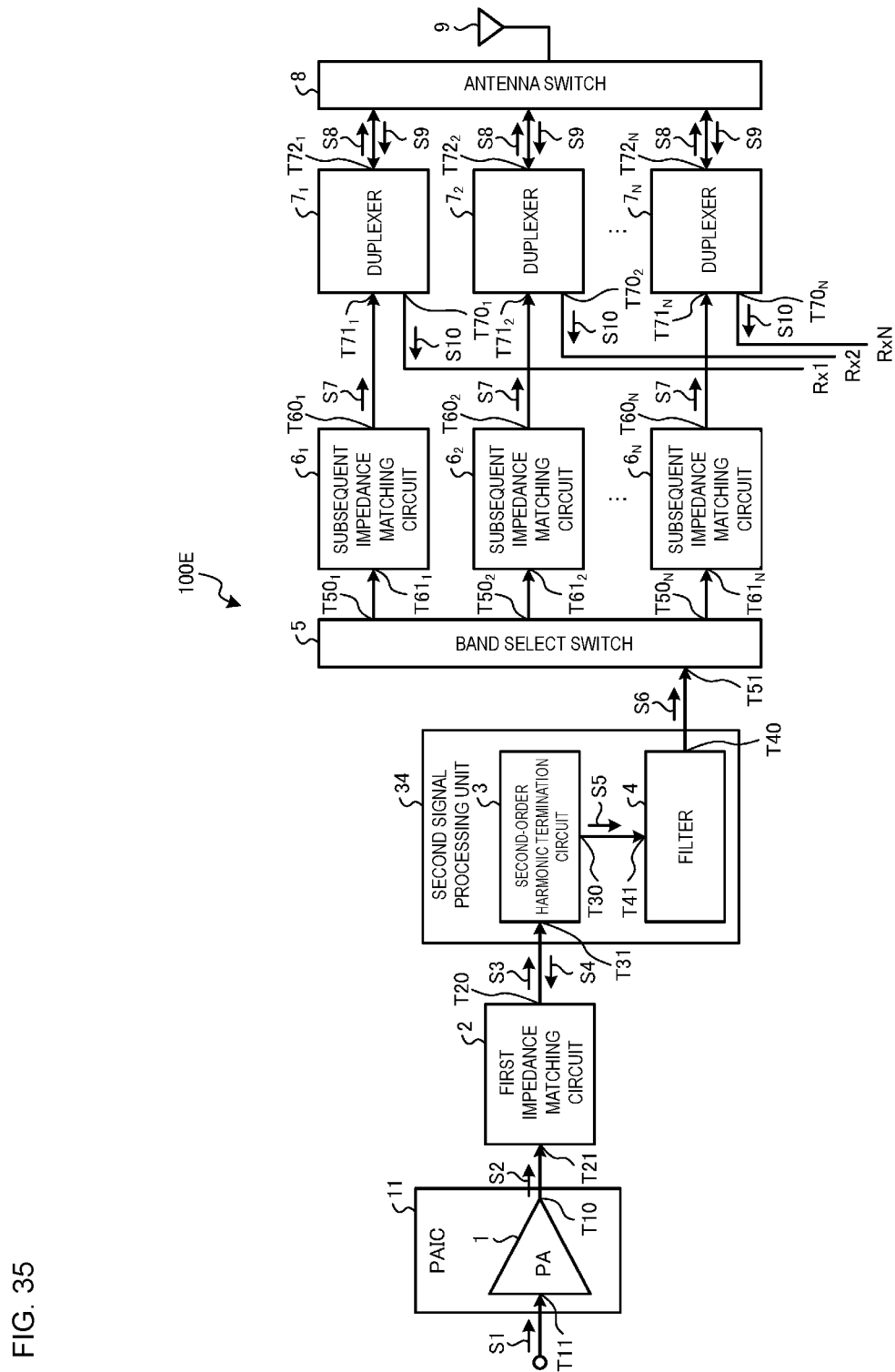
FIG. 35 is a diagram that shows the configuration of a power amplifier unit according to a fifth embodiment.

FIG. 35 is a diagram that shows the configuration of a power amplifier unit 100E according to a fifth embodiment. As shown in FIG. 35, the power amplifier unit 100E according to the fifth embodiment includes a power amplifier circuit 1, a first impedance matching circuit 2, a second signal processing unit 34, a band select switch 5, subsequent impedance matching circuits $6_1, 6_2, \ldots, 6_N$ (N is a natural number; hereinafter, the same applies), duplexers $7_1, 7_2, \ldots, 7_N$, an antenna switch 8, and an antenna 9. The power amplifier circuit 1 is implemented as an integrated power amplifier integrated circuit (PAIC) 11. The band select switch 5 has fifth input terminals $T51_1, T51_2, \ldots, T51_N$, and fifth output terminals $T50_1, T50_2, \ldots, T50_N$. The subsequent impedance matching circuits $6_1, 6_2, \ldots, 6_N$ that are a plurality of second impedance matching circuits are provided in association with the plurality of fifth output terminals T50 of the band select switch 5 and respectively have sixth input terminals $T61_1, T61_2, \ldots, T61_N$ and sixth output terminals $T60_1, T60_2, \ldots, T60_N$.

The second signal processing unit 34 has a similar configuration to that of the power amplifier unit 100B according to the second embodiment shown in FIG. 27. That is, the second signal processing unit 34 has the functions of the second-order harmonic termination circuit 3 and filter 4 of the power amplifier unit 100A shown in FIG. 5. As described with reference to FIG. 28, the second-order harmonic termination circuit 3 and the filter 4 that make up the second signal processing unit 34 have partially common component elements. Therefore, the circuit size of the second signal processing unit 34 is reduced in comparison with the case where those are separately provided.

The band select switch 5 selects an appropriate one of the subsequent impedance matching circuits $6_1, 6_2, \ldots, 6_N$ in accordance with a frequency band to be used, designated by a signal (not shown). One of the subsequent impedance matching circuits $6_1, 6_2, \ldots, 6_N$, selected by the band select switch 5, performs impedance matching for the output of the second signal processing unit 34. The subsequent impedance matching circuits $6_1, 6_2, \ldots, 6_N$ are impedance matching circuits provided on a signal output side, that is, a subsequent stage side, of the first impedance matching circuit 2.

The duplexers $7_1, 7_2, \ldots, 7_N$ are provided in association with the plurality of subsequent impedance matching circuits $6_1, 6_2, \ldots, 6_N$ and respectively have seventh input terminals T71$_1$, T71$_2$, ..., T71$_N$, seventh output terminals T70$_1$, T70$_2$, ..., T70$_N$, and input/output terminals T72$_1$, T72$_2$, ..., T72$_N$. The duplexers 7$_1$, 7$_2$, ..., 7$_N$ are provided in association with the subsequent impedance matching circuits 6$_1$, 6$_2$, ..., 6$_N$. The duplexers 7$_1$, 7$_2$, ..., 7$_N$ each include a filter that uses the frequency band of a transmission signal as a pass band and a filter that uses the frequency band of a reception signal as a pass band. The antenna switch 8 selects one of the duplexers 7$_1$, 7$_2$, ..., 7$_N$. The antenna switch 8 electrically connects a selected one of the duplexers 7$_1$, 7$_2$, ..., 7$_N$ to the antenna 9.

A seventh radio-frequency signal S7 is input to any one of the seventh input terminals T71$_1$, T71$_2$, ..., T71$_N$ from an associated one of the subsequent impedance matching circuits 6$_1$, 6$_2$, ..., 6$_N$. The one of the duplexers 7$_1$, 7$_2$, ..., 7$_N$ outputs an eighth radio-frequency signal from an associated one of the input/output terminals T72$_1$, T72$_2$, ..., T72$_N$. The eighth radio-frequency signal S8 is output from the antenna 9 via the antenna switch 8 as a transmission signal. A ninth radio-frequency signal S9 that is a signal received from the antenna 9 is input to any one of the input/output terminals T72$_1$, T72$_2$, ..., T72$_N$ of the duplexers 7$_1$, 7$_2$, ..., 7$_N$. The one of the duplexers 7$_1$, 7$_2$, ..., 7$_N$ outputs a tenth radio-frequency signal S10 from an associated one of the seventh output terminals T70$_1$, T70$_2$, ..., T70$_N$ in accordance with the frequency of the ninth radio-frequency signal S9. The tenth radio-frequency signal S10 is input to a receiving circuit (not shown) as any one of signals Rx1, Rx2, ..., RxN.

In the power amplifier unit 100E having the above-described configuration, a signal output from the power amplifier circuit 1 is input to the first impedance matching circuit 2, and impedance matching is performed. A fundamental passes through the second signal processing unit 34 and is input to the subsequent impedance matching circuit selected by the band select switch 5. Then, impedance matching is performed. After that, the fundamental is transmitted from the antenna 9 via the duplexer associated with the subsequent impedance matching circuit, and the antenna switch 8. In other words, a signal associated with a radio-frequency input signal is transmitted.

On the other hand, a second-order harmonic is reflected in the second signal processing unit 34. A reflected wave component is input to the power amplifier circuit 1 via the first impedance matching circuit 2. In the power amplifier circuit 1, the traveling wave component and the reflected wave component are superposed, and amplification operation is performed in a switching mode by using the superposed signal. As described above, for a second-order harmonic, the amplitude of a synthetic wave obtained by superposing a traveling wave component and a reflected wave component is zero, so, even when the synthetic wave is input to the output end of the power amplifier circuit 1, the synthetic wave does not affect the fundamental.

One of the duplexers 7$_1$, 7$_2$, ..., 7$_N$ is selected by the antenna switch 8. A signal received by the antenna 9 is input to a selected one of the duplexers 7$_1$, 7$_2$, ..., 7$_N$ via the antenna switch 8. The one of the duplexers 7$_1$, 7$_2$, ..., 7$_N$ outputs the received signal to a receiving circuit (not shown) as any one of signals Rx1, Rx2, ..., RxN.

Sixth Embodiment

Figure 36:
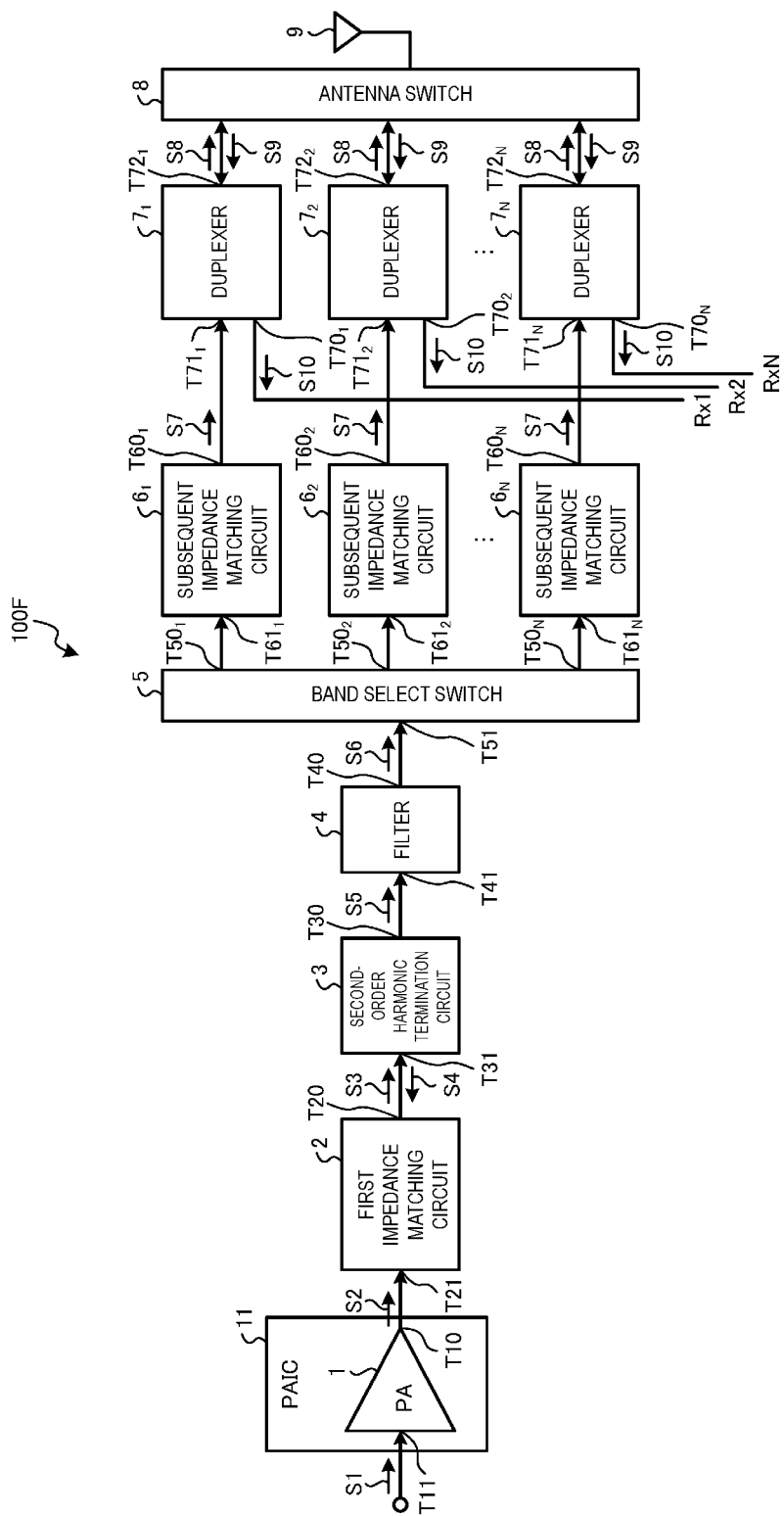
FIG. 36 is a diagram that shows the configuration of a power amplifier unit according to a sixth embodiment.

FIG. 36 is a diagram that shows the configuration of a power amplifier unit 100F according to a sixth embodiment. As shown in FIG. 36, the power amplifier unit 100F according to the sixth embodiment has such a configuration that, in the power amplifier unit 100E according to the fifth embodiment described with reference to FIG. 35, a second-order harmonic termination circuit 3 and a filter 4 are provided instead of the second signal processing unit 34. The other configuration of the power amplifier unit 100F is similar to that of the power amplifier unit 100E according to the fifth embodiment described with reference to FIG. 35.

Seventh Embodiment

Figure 37:
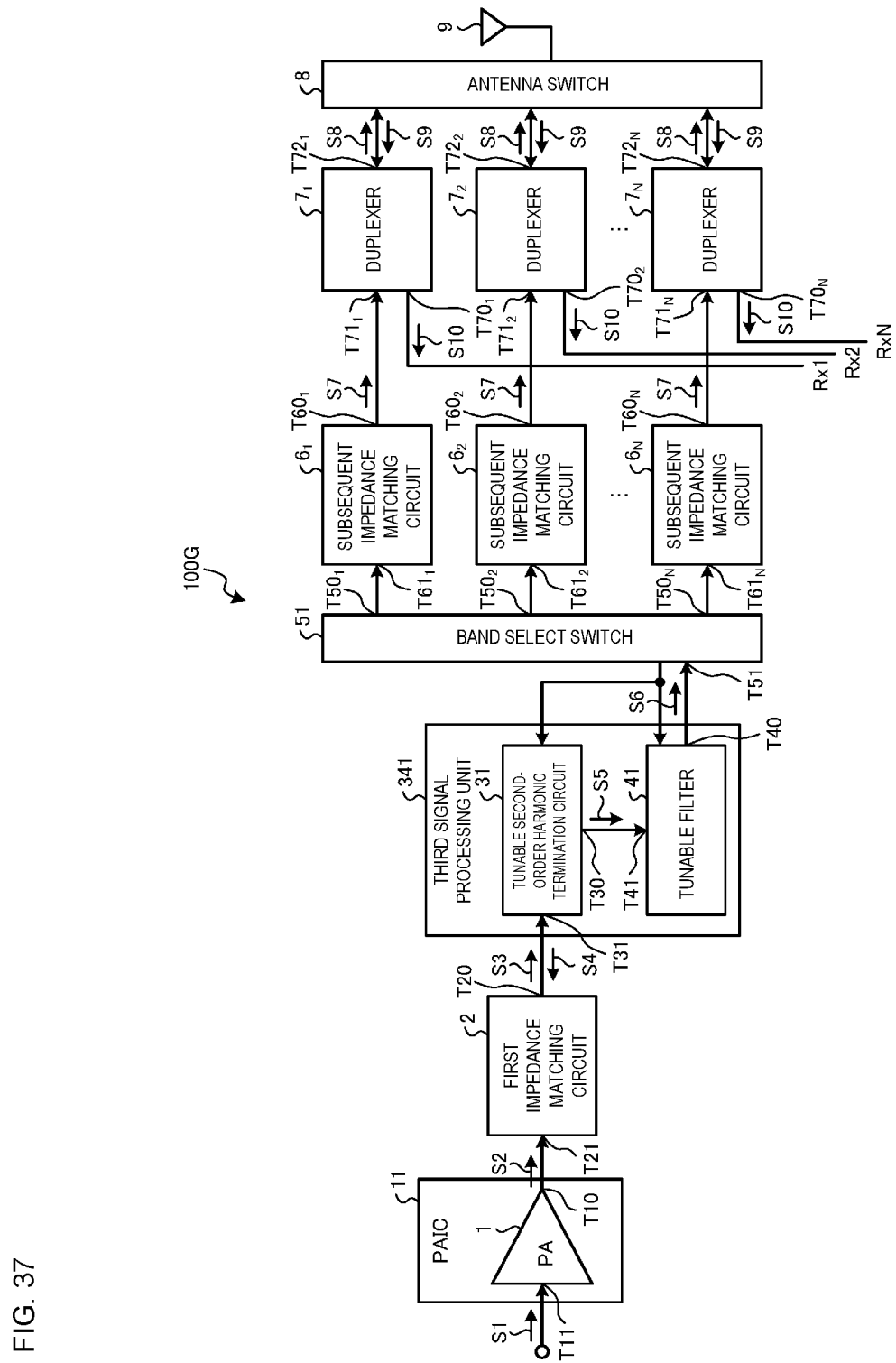
FIG. 37 is a diagram that shows the configuration of a power amplifier unit according to a seventh embodiment.

FIG. 37 is a diagram that shows the configuration of a power amplifier unit 100G according to a seventh embodiment. As shown in FIG. 37, the power amplifier unit 100G according to the seventh embodiment has such a configuration that, in the power amplifier unit 100E according to the fifth embodiment described with reference to FIG. 35, a third signal processing unit 341 is provided instead of the second signal processing unit 34 and a band select switch 51 is provided instead of the band select switch 5. The other configuration of the power amplifier unit 100G is similar to that of the power amplifier unit 100E according to the fifth embodiment described with reference to FIG. 35.

Figure 38:
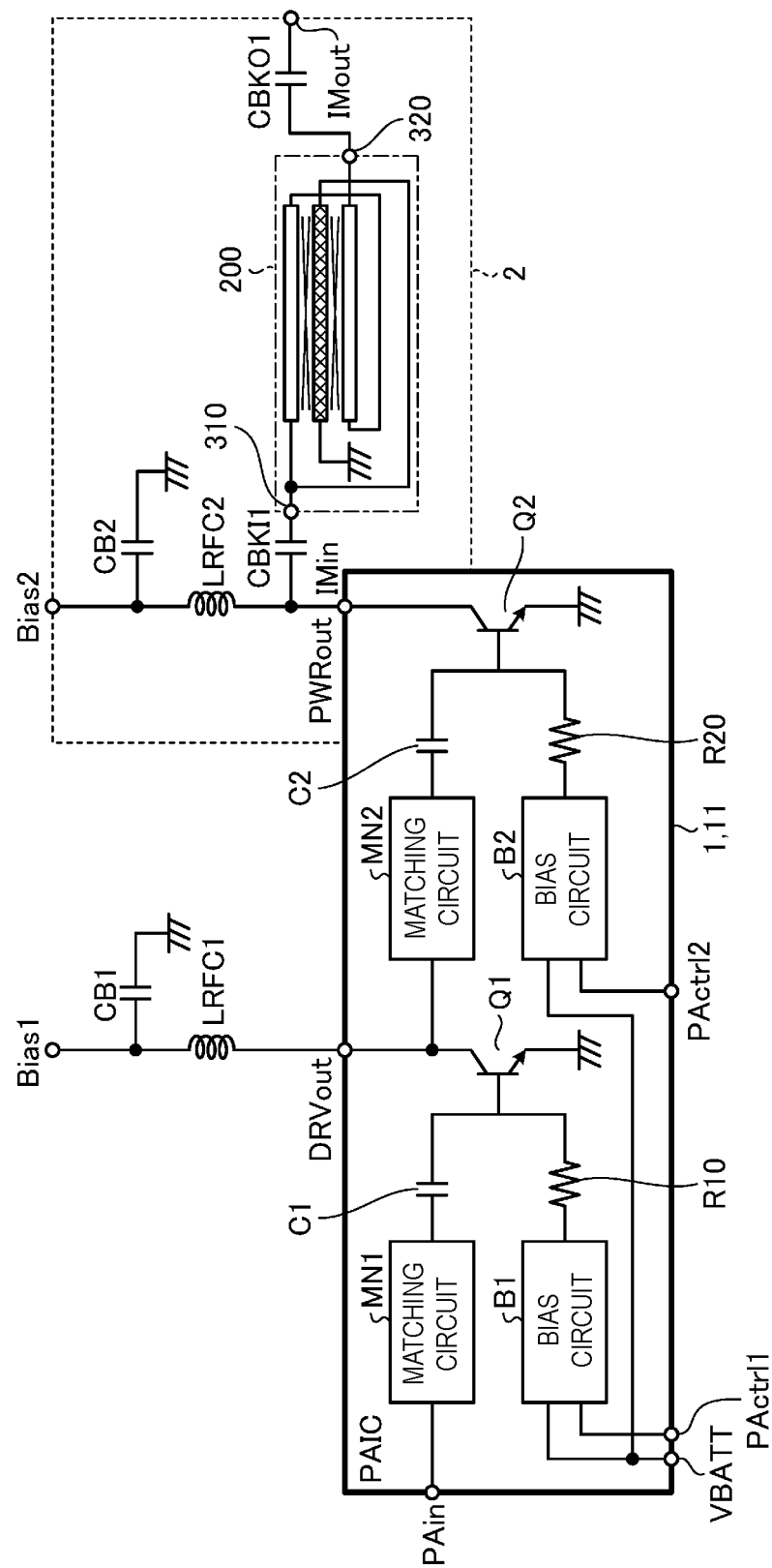
FIG. 38 is a diagram that shows a configuration example of a power amplifier circuit.

FIG. 38 is a diagram that shows a configuration example of the power amplifier circuit 1. In FIG. 38, the power amplifier circuit 1 is implemented by a PAIC 11.

The power amplifier circuit 1 includes a transistor Q1, a matching circuit MN1, a bias circuit B1, a capacitor C1, and a resistance R10. The emitter of the transistor Q1 is grounded, and a grounded emitter circuit is formed.

An input signal input to an input terminal PAin is applied to the base of the transistor Q1 via the matching circuit MN1 and the capacitor C1. The capacitor C1 functions as a DC-cut capacitor. A signal having passed through the capacitor C1 is supplied to the base of the transistor Q1.

The bias circuit B1 is connected to a power supply voltage terminal VBATT and a control terminal PActrl1. The resistance R10 functions as a bias resistance for applying a bias (that is, a bias current or a bias voltage) to the base of the transistor Q1.

The collector of the transistor Q1 is connected to a drive output terminal DRVout. A bias Bias1 is applied to the drive output terminal DRVout. The bias Bias1 is applied to the drive output terminal DRVout via a filter made up of an inductor LRFC1 and a capacitor CB1.

The power amplifier circuit 1 includes a transistor Q2, a matching circuit MN2, a bias circuit B2, a capacitor C2, and a resistance R20. The emitter of the transistor Q2 is grounded, and a grounded emitter circuit is formed.

A signal output from the collector of the transistor Q1 is applied to the base of the transistor Q2 via the matching circuit MN2 and the capacitor C2. The capacitor C2 functions as a DC-cut capacitor. A signal having passed through the capacitor C2 is supplied to the base of the transistor Q2.

The bias circuit B2 is connected to the power supply voltage terminal VBATT and a control terminal PActrl2. The resistance R20 functions as a bias resistance for applying a bias (that is, a bias current or a bias voltage) to the base of the transistor Q2.

The collector of the transistor Q2 is connected to an output terminal PWRout. An output of the output terminal PWRout becomes an input to an input terminal IMin of the first impedance matching circuit 2. The configuration and operation of the first impedance matching circuit 2 are as described with reference to FIG. 13. An output terminal IMout of the first impedance matching circuit 2 is connected to the input terminal of the third signal processing unit 341.

In the present disclosure, each of the transistors Q1, Q2 is a bipolar transistor; however, the present disclosure is not limited thereto. A bipolar transistor has an emitter that is a first terminal, a collector that is a second terminal, and a base that is a third terminal. A heterojunction bipolar transistor (HBT) is illustrated as a bipolar transistor; however, the present disclosure is not limited thereto. Each of the transistors Q1, Q2 may be, for example, a field effect transistor (FET). In this case, an emitter is replaced with a source, a collector is replaced with a drain, and a base is replaced with a gate. Therefore, the first terminal may be regarded as an emitter or a source, the second terminal may be regarded as a collector or a drain, and the third terminal may be regarded as a base or a gate. Each of the transistors Q1, Q2 may be a multi-finger transistor in which a plurality of unit transistors (also referred to as fingers) is electrically connected in parallel. A unit transistor means a minimum configuration of a transistor.

Figure 39:
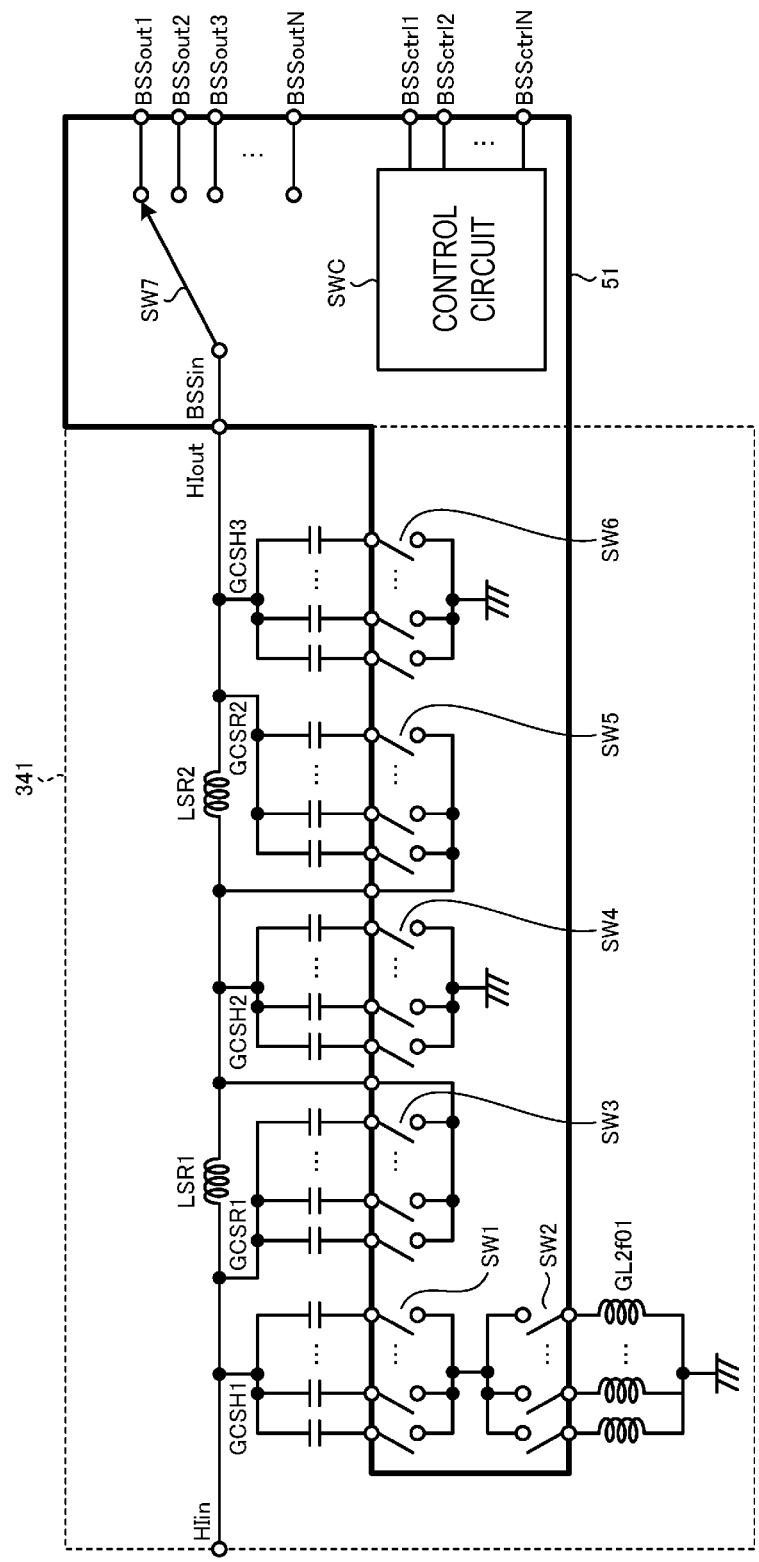
FIG. 39 is a diagram that shows a configuration example of a third signal processing unit in FIG. 37.

FIG. 39 is a diagram that shows a configuration example of the third signal processing unit 341 in FIG. 37. FIG. 39 also shows a configuration example of the band select switch 51. In FIG. 39, the third signal processing unit 341 includes capacitor element groups GCSH1, GCSR1, GCSH2, GCSR2, GCSH3 each made up of a plurality of capacitors, an inductor element group GL2/01, an inductor LSR1, and an inductor LSR2. Each of the capacitor element groups GCSH1, GCSR1, GCSH2, GCSR2, GCSH3 is made up of a plurality of capacitors with capacitance values different from one another. The inductor element group GL2/01 is made up of inductors with inductance values different from one another.

The band select switch 51 includes switches SW1, ..., SW6 for selecting element groups in the third signal processing unit 341, a switch SW7 for selecting one of output terminals BSSout1, BSSout2, BSSout3, ..., BSSoutN, and a control circuit SWC that controls the statuses of the switches SW1, ..., SW7.

The control circuit SWC includes, for example, at least one of a decoder and a switch controller. The control circuit SWC controls the statuses of the switches SW1, ..., SW7 in accordance with control signals respectively input to control terminals BSSctrl1, BSSctrl2, BSSctrl3, ..., BSSctrlN. Control signals respectively input to the control terminals BSSctrl1, BSSctrl2, BSSctrl3, ..., BSSctrlN are signals associated with the frequency band to be used. Therefore, the control circuit SWC controls the statuses of the switches SW1, ..., SW7 in accordance with the frequency band to be used.

The operation of the thus configured third signal processing unit 341 and band select switch 51 will be described. The capacitor selected by the switch SW1 from among the capacitors included in the capacitor element group GCSH1, and the inductor selected by the switch SW2 from among the inductors included in the inductor element group GL2/01 are electrically connected in series. The capacitor selected by the switch SW3 from among the capacitors included in the capacitor element group GCSR1 and the inductor LSR1 are electrically connected in parallel. One end of the capacitor selected by the switch SW4 from among the capacitors included in the capacitor element group GCSH2 is electrically connected to the reference potential. The capacitor selected by the switch SW5 from among the capacitors included in the capacitor element group GCSR2 and the inductor LSR2 are electrically connected in parallel. One end of the capacitor selected by the switch SW6 from among the capacitors included in the capacitor element group GCSH3 is electrically connected to the reference potential.

In this way, by selecting the switch SW1 to the switch SW6, the third signal processing unit 341 is able to implement the function of terminating a second-order harmonic and the function of a filter. In the present disclosure, the switch SW2 corresponds to a first switch, and the switches SW1, SW3 to SW6 each correspond to a second switch.

The input terminal BSSin is electrically connected to the output terminal selected by the switch SW7 from among the output terminals BSSout1, BSSout2, BSSout3, ..., BSSoutN. The input terminal B S Sin is connected to the output terminal HIout of the third signal processing unit 341. Therefore, an output signal of the third signal processing unit 341 is output to the impedance matching circuit selected by the band select switch 51 from among the subsequent impedance matching circuits $6_1, 6_2, \ldots, 6_N$.

Eighth Embodiment

Figure 40:
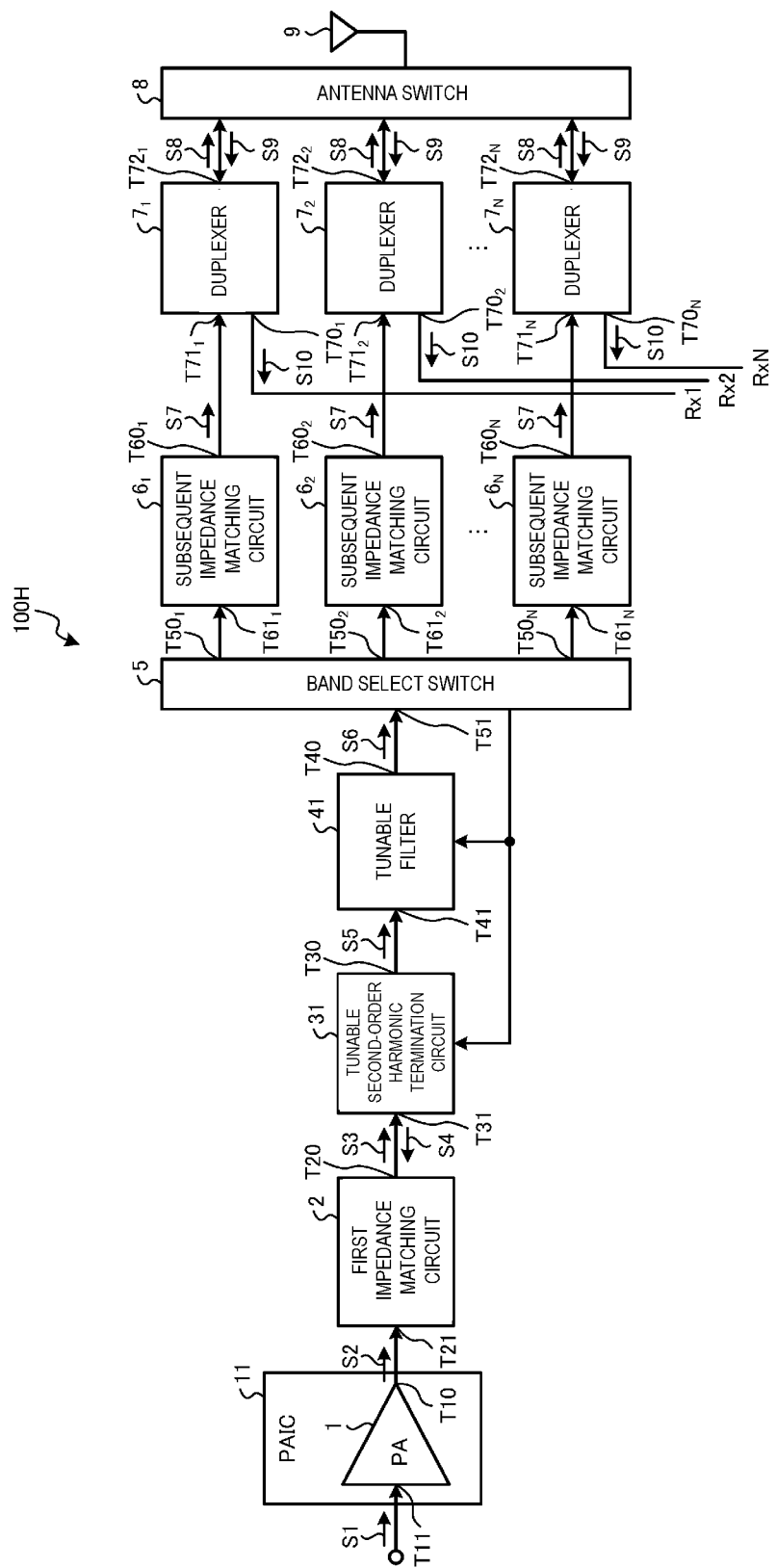
FIG. 40 is a diagram that shows the configuration of a power amplifier unit according to an eighth embodiment.

FIG. 40 is a diagram that shows the configuration of a power amplifier unit 100H according to an eighth embodiment. As shown in FIG. 40, the power amplifier unit 100H according to the eighth embodiment has such a configuration that, in the power amplifier unit 100G according to the seventh embodiment described with reference to FIG. 37, a tunable second-order harmonic termination circuit 31 and a tunable filter 41 are provided instead of the third signal processing unit 341. A control signal output from the band select switch 5 is input to each of the tunable second-order harmonic termination circuit 31 and the tunable filter 41. The other configuration is similar to that of the power amplifier unit 100G according to the seventh embodiment described with reference to FIGS. 37 to 39.

Ninth Embodiment

Figure 41:
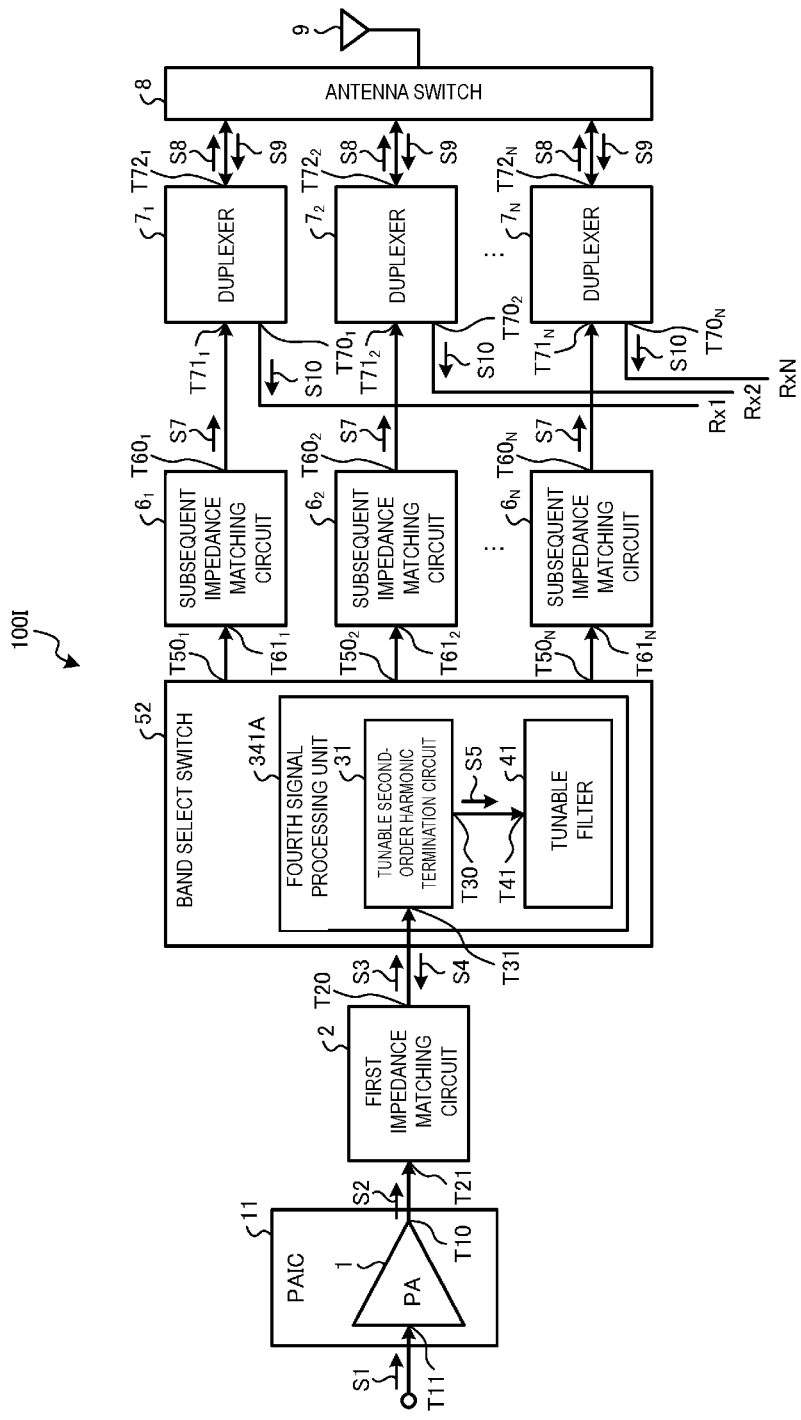
FIG. 41 is a diagram that shows the configuration of a power amplifier unit according to a ninth embodiment.

FIG. 41 is a diagram that shows the configuration of a power amplifier unit 100I according to a ninth embodiment. As shown in FIG. 41, the power amplifier unit 100I according to the ninth embodiment has such a configuration that, in the power amplifier unit 100E according to the fifth embodiment described with reference to FIG. 35, a fourth signal processing unit 341A is provided in a band select switch 52. The fourth signal processing unit 341A has the function of a tunable second-order harmonic termination circuit and the function of a tunable filter. The other configuration of the power amplifier unit 100I is similar to that of the power amplifier unit 100E according to the fifth embodiment described with reference to FIG. 35. By providing the fourth signal processing unit 341A in the band select switch 52, the size of the power amplifier unit 100I is reduced as compared to the power amplifier unit 100E of FIG. 35.

Figure 42:
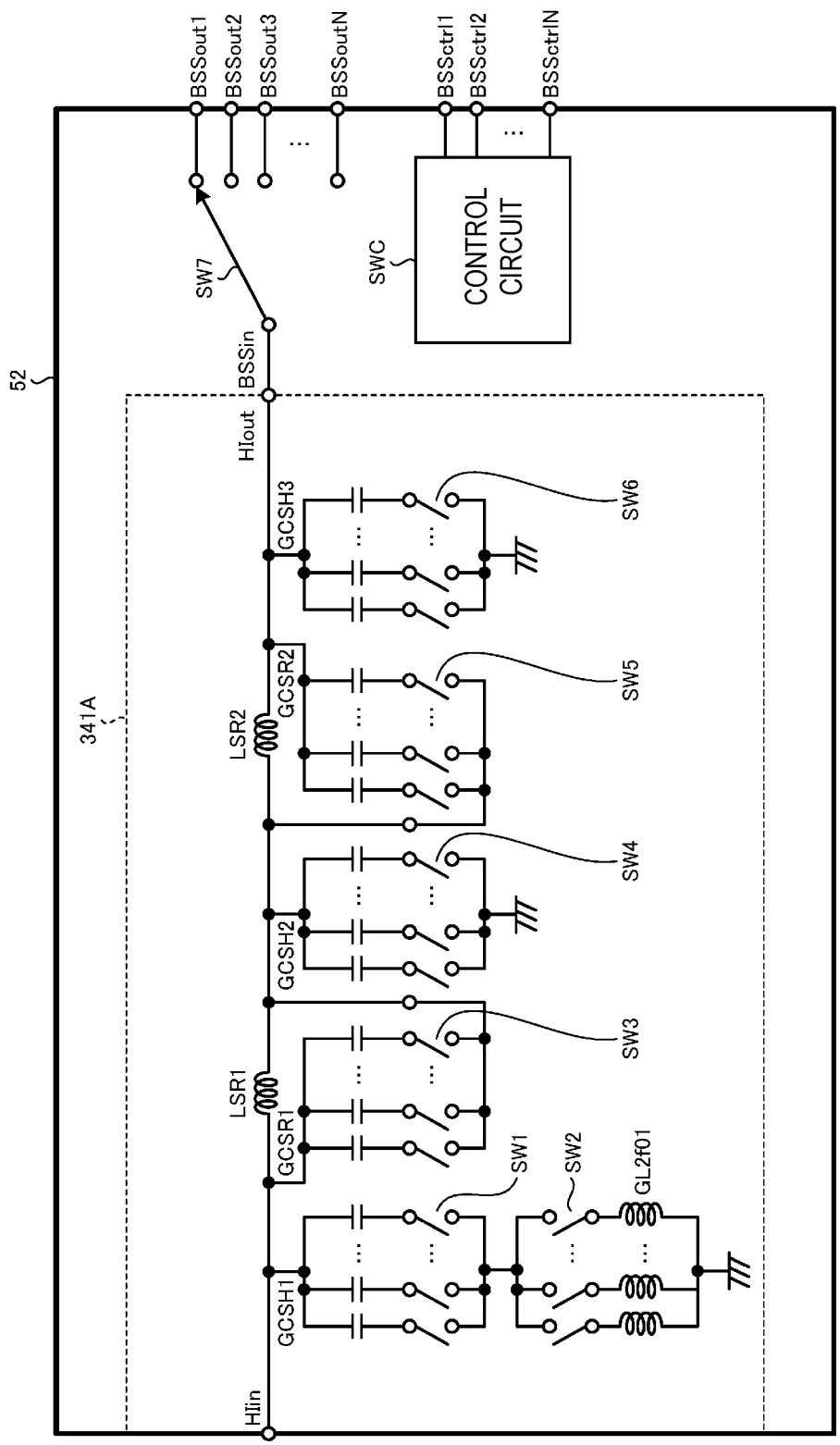
FIG. 42 is a diagram that shows a configuration example of a fourth signal processing unit in FIG. 41.

FIG. 42 is a diagram that shows a configuration example of the fourth signal processing unit 341A in the power amplifier unit 100I according to the ninth embodiment shown in FIG. 41. As shown in FIG. 42, the fourth signal processing unit 341A is provided in the band select switch 52.

The fourth signal processing unit 341A, as in the case of the third signal processing unit 341 described with reference to FIG. 39, includes capacitor element groups GCSH1, CSR1, CSH2, CSR2, CSH3 each made up of a plurality of capacitors, an inductor element group GL2/01, an inductor LSR1, and an inductor LSR2. Each of the capacitor element groups GCSH1, CSR1, CSH2, CSR2, CSH3 is made up of a plurality of capacitors with capacitance values different from one another. The inductor element group GL2/01 is made up of inductors with inductance values different from one another. In addition, the fourth signal processing unit 341A includes switches SW1, . . . , SW6 for selecting the element groups. The output terminal MIout of the first impedance matching circuit 2 is connected to the input terminal Min of the fourth signal processing unit 341A.

The band select switch 52 includes a switch SW7 for selecting one of output terminals BSSout1, BSSout2, BSSout3, . . . , BSSoutN, and a control circuit SWC that controls the statuses of the switches SW1, . . . , SW7. The operation of the fourth signal processing unit 341A and band select switch 52 is similar to the operation of the third signal processing unit 341 and band select switch 51, described with reference to FIG. 39.

Tenth Embodiment

Figure 43:
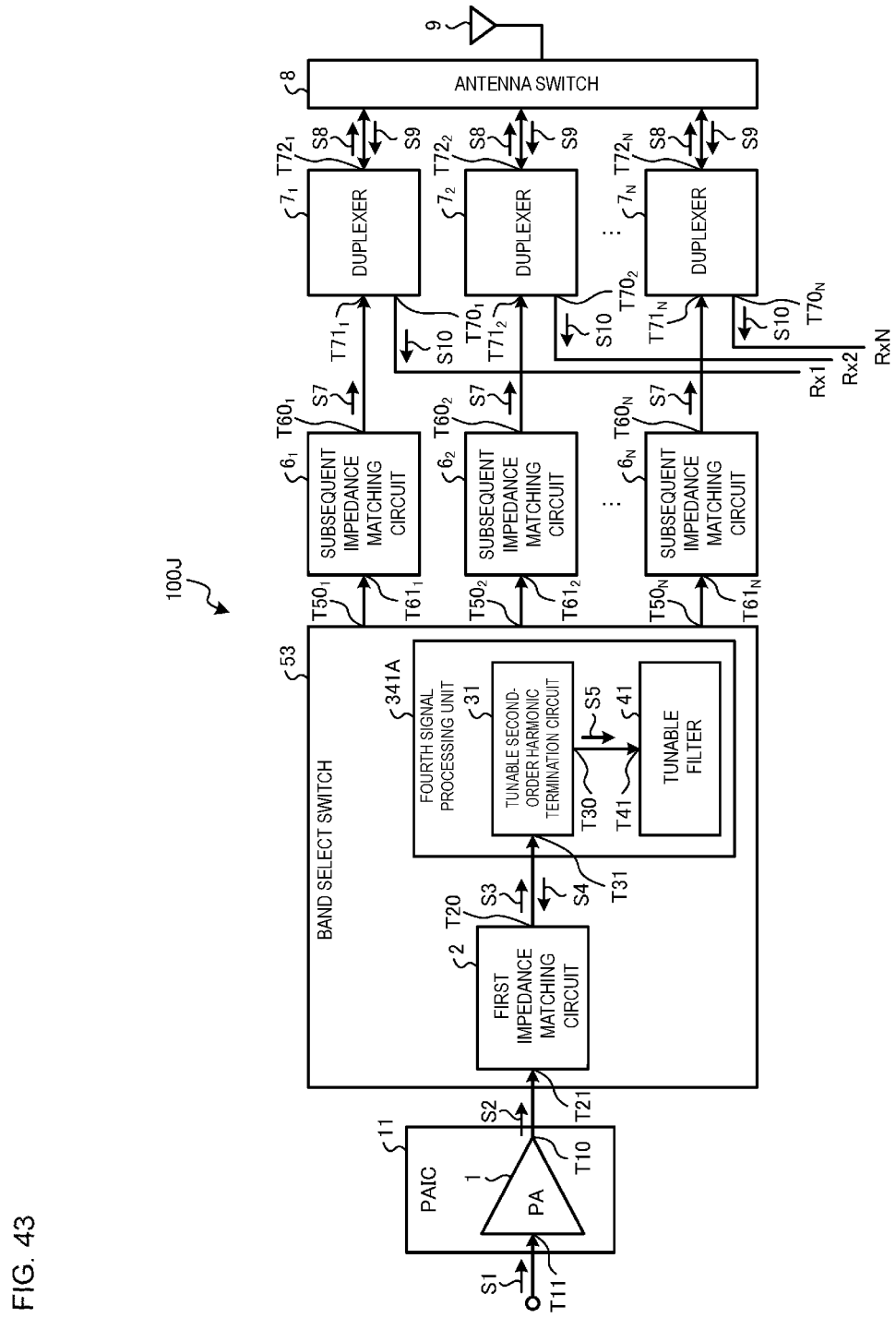
FIG. 43 is a diagram that shows the configuration of a power amplifier unit according to a tenth embodiment.

FIG. 43 is a diagram that shows the configuration of a power amplifier unit 100J according to a tenth embodiment. As shown in FIG. 43, the power amplifier unit 100J according to the tenth embodiment has such a configuration that, in the power amplifier unit 100G according to the seventh embodiment described with reference to FIG. 37, a first impedance matching circuit 2 and a fourth signal processing unit 341A are provided in a band select switch 53. The other configuration of the power amplifier unit 100J is similar to that of the power amplifier unit 100G according to the seventh embodiment described with reference to FIG. 37. By providing the first impedance matching circuit 2 and the fourth signal processing unit 341A in the band select switch 53, the size of the power amplifier unit 100J is reduced as compared to the power amplifier unit 100E of FIG. 35.

Figure 44:
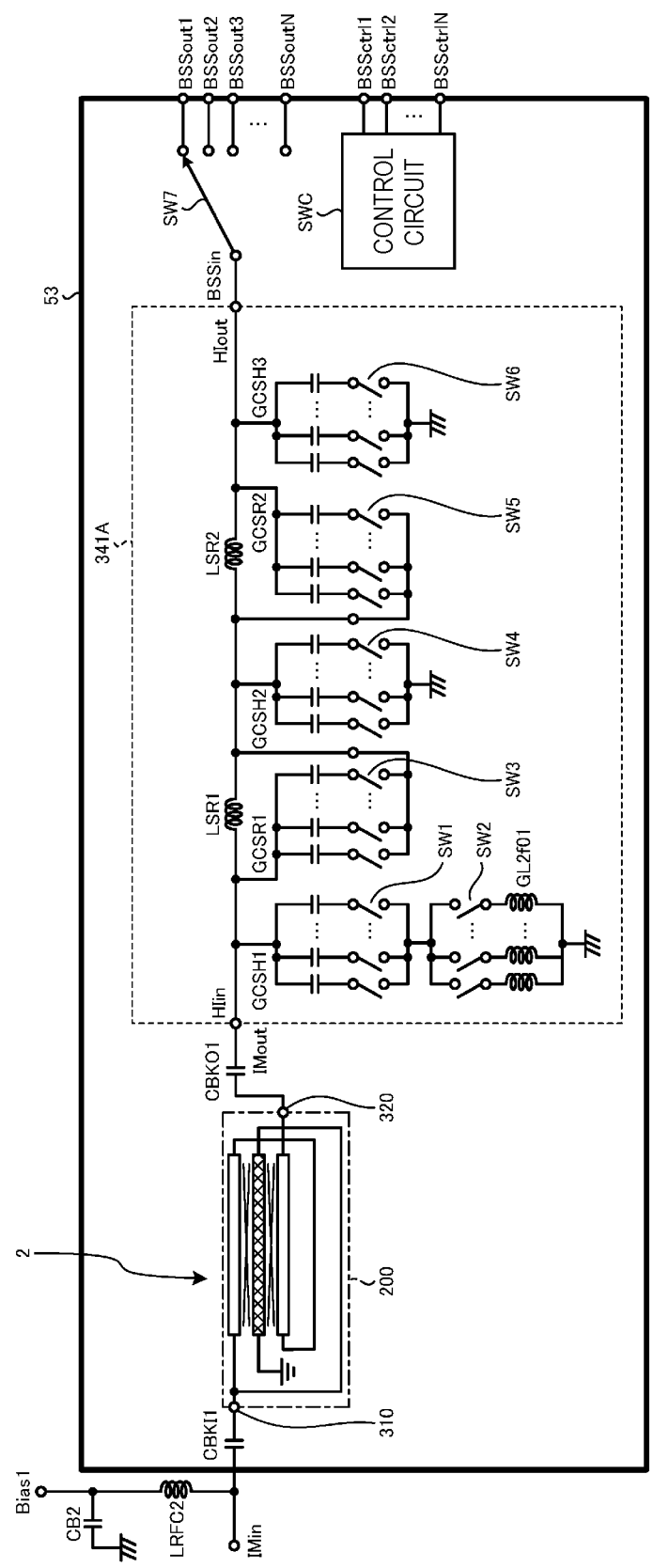
FIG. 44 is a diagram that shows a configuration example of a first impedance matching circuit and a fourth signal processing unit in a power amplifier unit according to the tenth embodiment shown in FIG. 43.

FIG. 44 is a diagram that shows a configuration example of the first impedance matching circuit 2 and the fourth signal processing unit 341A in the power amplifier unit 100J according to the tenth embodiment shown in FIG. 43. As shown in FIG. 44, the first impedance matching circuit 2 and the fourth signal processing unit 341A are provided in the band select switch 53. In this embodiment, an inductor LRFC2 and a capacitor CB2 that are part of the first impedance matching circuit 2 are provided outside the band select switch 53. The inductor LRFC2 and the capacitor CB2 may be provided in the band select switch 53.

The configuration and operation of the first impedance matching circuit 2 are as described with reference to FIG. 13. The output terminal IMout of the first impedance matching circuit 2 is connected to an input terminal Min of the third signal processing unit 341.

The operation of the fourth signal processing unit 341A is similar to the operation of the third signal processing unit 341, described with reference to FIG. 39. The operation of the band select switch 53 are similar to the operation of the band select switch 51, described with reference to FIG. 39.

Eleventh Embodiment

Figure 45:
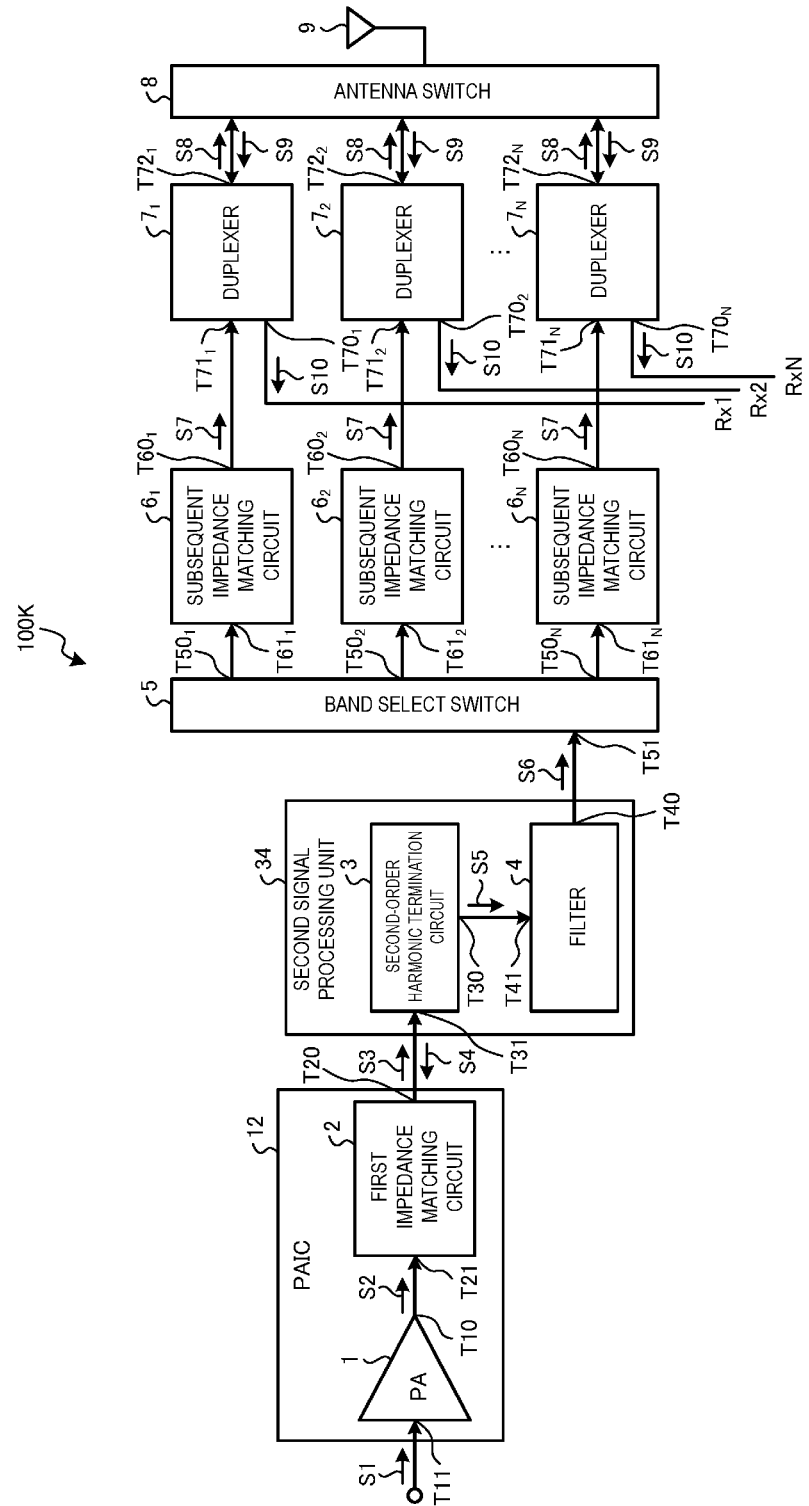
FIG. 45 is a diagram that shows the configuration of a power amplifier unit according to an eleventh embodiment.

FIG. 45 is a diagram that shows the configuration of a power amplifier unit 100K according to an eleventh embodiment. As shown in FIG. 45, the power amplifier unit 100K according to the eleventh embodiment has such a configuration that, in the power amplifier unit 100E according to the fifth embodiment described with reference to FIG. 35, a first impedance matching circuit 2 is implemented as a PAIC 12 together with a power amplifier circuit 1. In other words, the power amplifier circuit 1 and the first impedance matching circuit 2 are provided in the same integrated circuit. The other configuration of the power amplifier unit 100K is similar to that of the power amplifier unit 100E according to the fifth embodiment described with reference to FIG. 35.

In the power amplifier unit 100K according to the eleventh embodiment, the power amplifier circuit 1 and the first impedance matching circuit 2 are provided in the same integrated circuit, that is, the PAIC 12. Thus, a power loss that has been generated in a transmission line between the first impedance matching circuit 2 and the power amplifier circuit 1 disappears, so the amplitude of a reflected wave component is kept large.

Twelfth Embodiment

Figure 46:
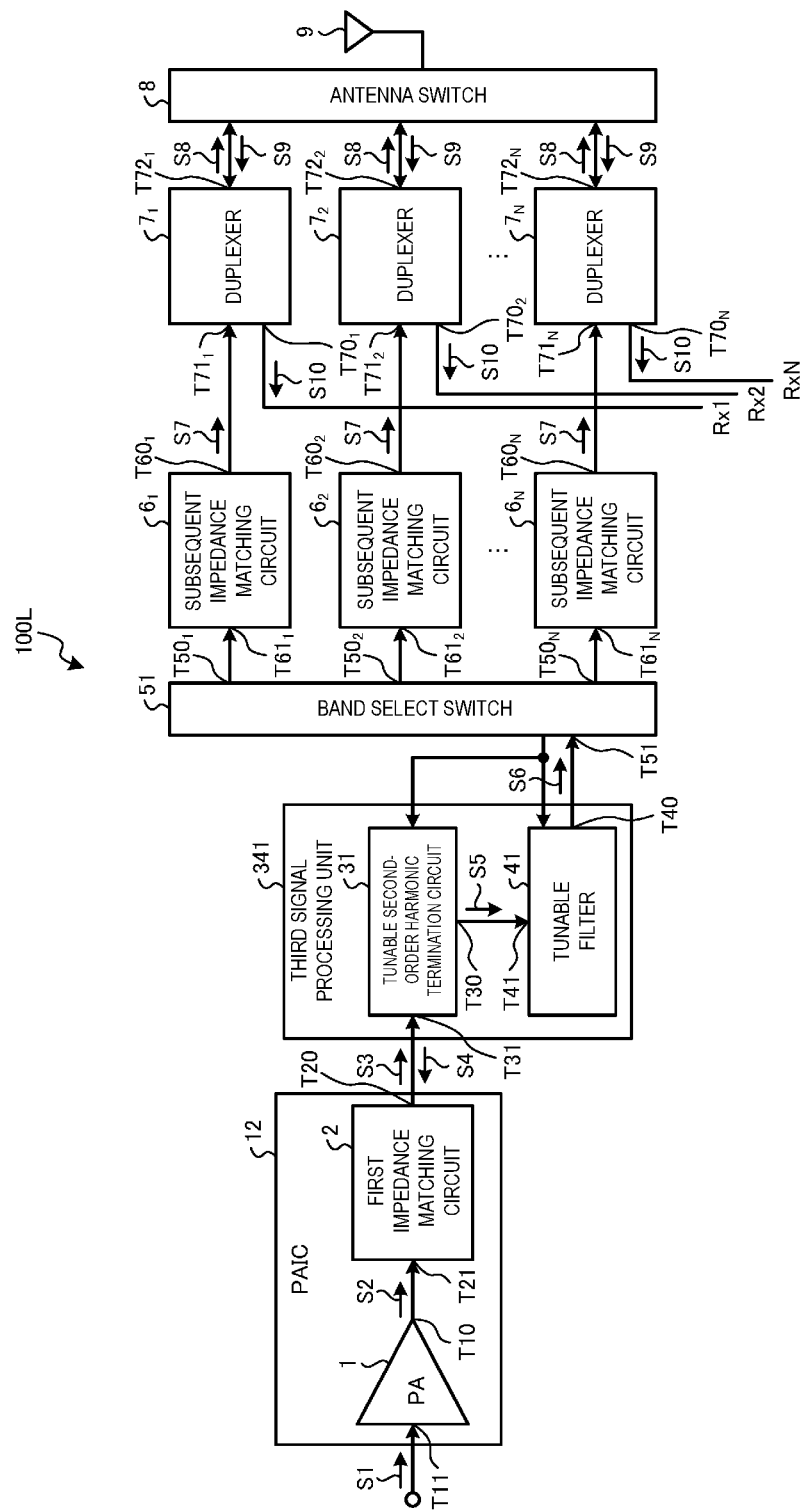
FIG. 46 is a diagram that shows the configuration of a power amplifier unit according to a twelfth embodiment.

FIG. 46 is a diagram that shows the configuration of a power amplifier unit 100L according to a twelfth embodiment. As shown in FIG. 46, the power amplifier unit 100L according to the twelfth embodiment has such a configuration that, in the power amplifier unit 100I according to the ninth embodiment described with reference to FIG. 41, a first impedance matching circuit 2 is implemented as a PAIC 12 together with a power amplifier circuit 1. The other configuration of the power amplifier unit 100L is similar to that of the power amplifier unit 100I according to the ninth embodiment described with reference to FIG. 41.

In the power amplifier unit 100L according to the twelfth embodiment, the power amplifier circuit 1 and the first impedance matching circuit 2 are provided in the same integrated circuit, that is, the PAIC 12. Thus, a power loss that has been generated in a transmission line between the first impedance matching circuit 2 and the power amplifier circuit 1 disappears, so the amplitude of a reflected wave component is kept large.

Thirteenth Embodiment

Figure 47:
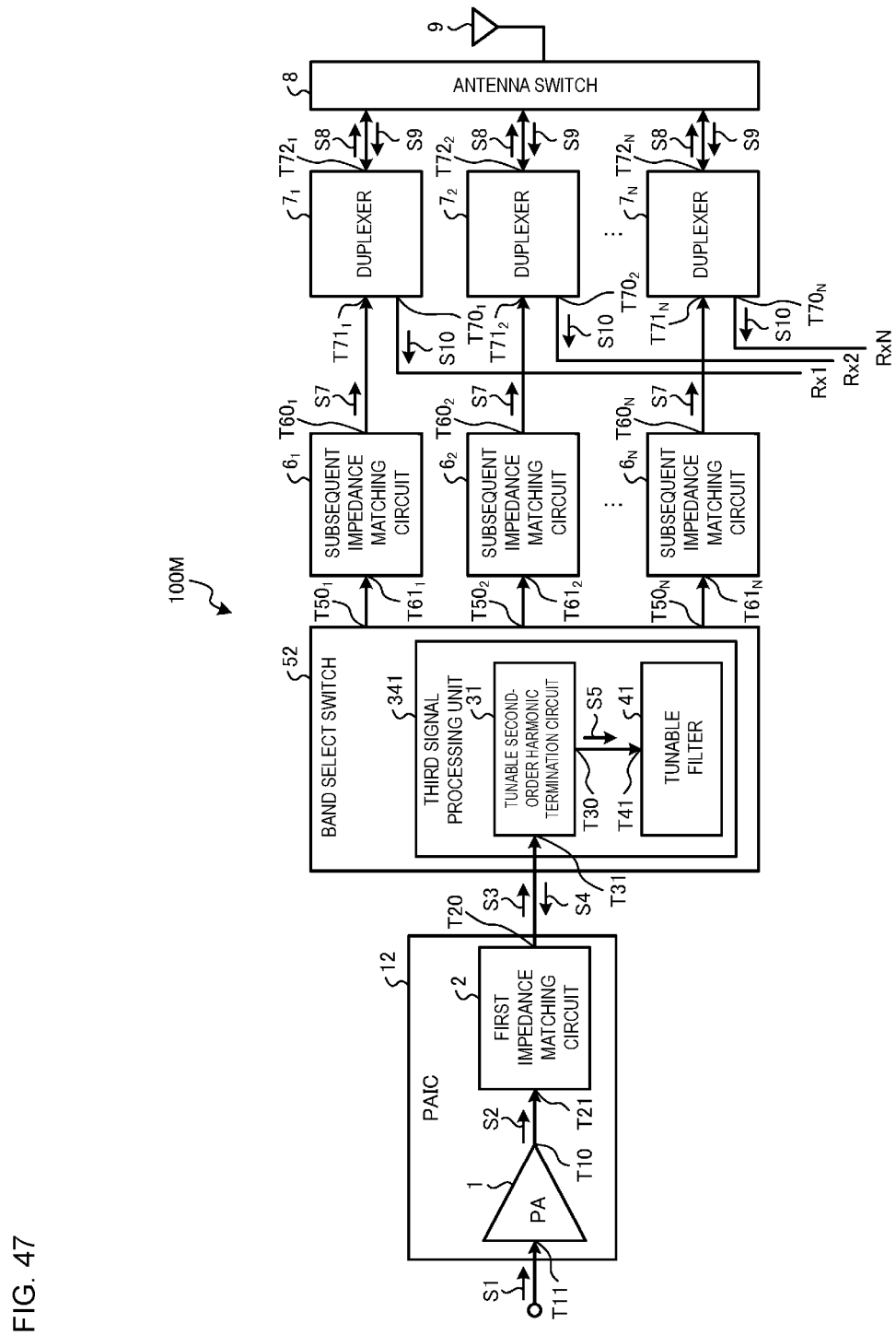
FIG. 47 is a diagram that shows the configuration of a power amplifier unit according to a thirteenth embodiment.

FIG. 47 is a diagram that shows the configuration of a power amplifier unit 100M according to a thirteenth embodiment. As shown in FIG. 47, the power amplifier unit 100M according to the thirteenth embodiment has such a configuration that, in the power amplifier unit 100F according to the sixth embodiment described with reference to FIG. 36, a first impedance matching circuit 2 is implemented as a PAIC 12 together with a power amplifier circuit 1 and a third signal processing unit 341 is provided in a band select switch 52. The other configuration of the power amplifier unit 100M is similar to that of the power amplifier unit 100F according to the sixth embodiment described with reference to FIG. 35.

In the power amplifier unit 100M according to the thirteenth embodiment, the power amplifier circuit 1 and the first impedance matching circuit 2 are provided in the same integrated circuit, that is, the PAIC 12. Thus, a power loss that has been generated in a transmission line between the first impedance matching circuit 2 and the power amplifier circuit 1 disappears, so the amplitude of a reflected wave component is kept large.

In the power amplifier unit 100M according to the thirteenth embodiment, by providing the third signal processing unit 341 in the band select switch 52, the size of the power amplifier unit 100M is reduced as compared to the power amplifier unit 100E of FIG. 35.

Fourteenth Embodiment

Figure 48:
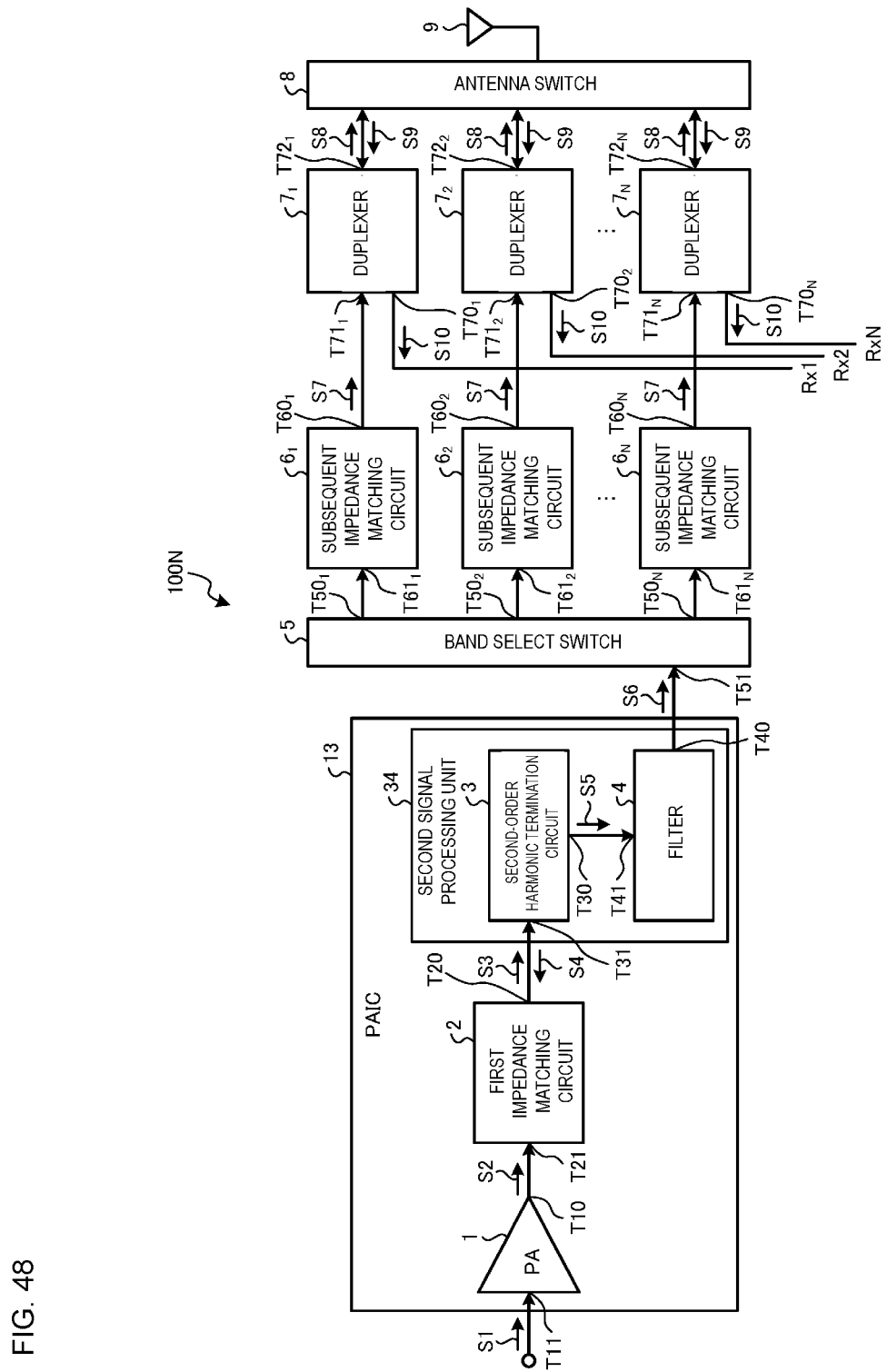
FIG. 48 is a diagram that shows the configuration of a power amplifier unit according to a fourteenth embodiment.

FIG. 48 is a diagram that shows the configuration of a power amplifier unit 100N according to a fourteenth embodiment. As shown in FIG. 48, the power amplifier unit 100N according to the fourteenth embodiment has such a configuration that, in the power amplifier unit 100E according to the fifth embodiment described with reference to FIG. 35, a first impedance matching circuit 2 and a second signal processing unit 34 are implemented as a PAIC 13 together with a power amplifier circuit 1. The other configuration of the power amplifier unit 100N is similar to that of the power amplifier unit 100E according to the fifth embodiment described with reference to FIG. 35.

In the power amplifier unit 100N according to the fourteenth embodiment, the power amplifier circuit 1, the first impedance matching circuit 2, and the second signal processing unit 34 are provided in the same integrated circuit, that is, the PAIC 13. Thus, a power loss that has been generated in a transmission line between the first impedance matching circuit 2 and the power amplifier circuit 1 and a power loss that has been generated in a transmission line between the second signal processing unit 34 and the first impedance matching circuit 2 disappear, so the amplitude of a reflected wave component is kept large.

Fifteenth Embodiment

Figure 49:
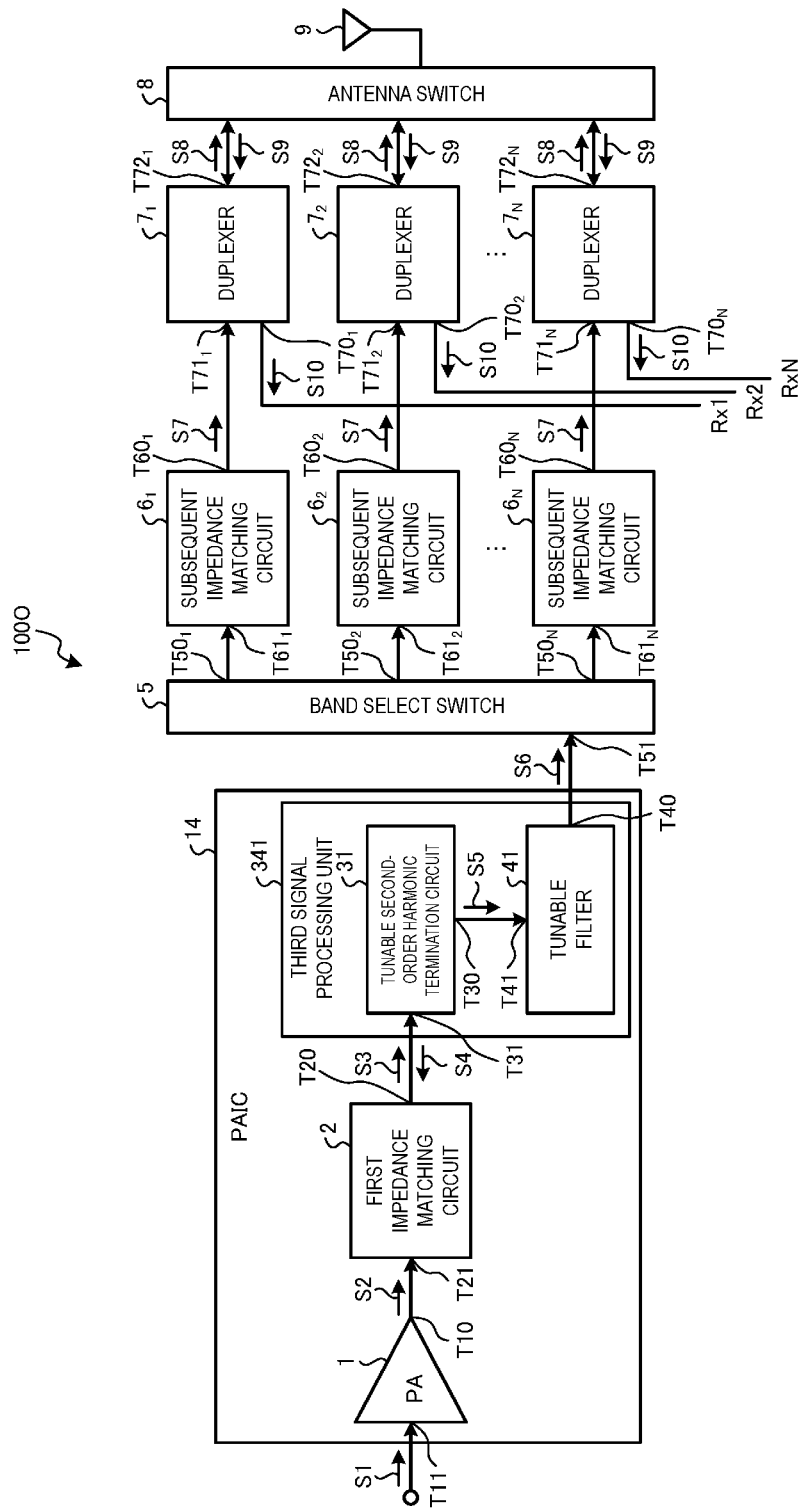
FIG. 49 is a diagram that shows the configuration of a power amplifier unit according to a fifteenth embodiment.

FIG. 49 is a diagram that shows the configuration of a power amplifier unit 100O according to a fifteenth embodiment. As shown in FIG. 49, the power amplifier unit 100O according to the fifteenth embodiment has such a configuration that, in the power amplifier unit 100E according to the fifth embodiment described with reference to FIG. 35, a first impedance matching circuit 2 and a third signal processing unit 341 are implemented as a PAIC 14 together with a power amplifier circuit 1. The other configuration of the power amplifier unit 100O is similar to that of the power amplifier unit 100E according to the fifth embodiment described with reference to FIG. 35.

In the power amplifier unit 100O according to the fifteenth embodiment, the power amplifier circuit 1, the first impedance matching circuit 2, and the third signal processing unit 341 are provided in the same integrated circuit, that is, the PAIC 14. Thus, a power loss that has been generated in a transmission line between the first impedance matching circuit 2 and the power amplifier circuit 1 and a power loss that has been generated in a transmission line between the third signal processing unit 341 and the first impedance matching circuit 2 disappear, so the amplitude of a reflected wave component is kept large.

Sixteenth Embodiment

Figure 50:
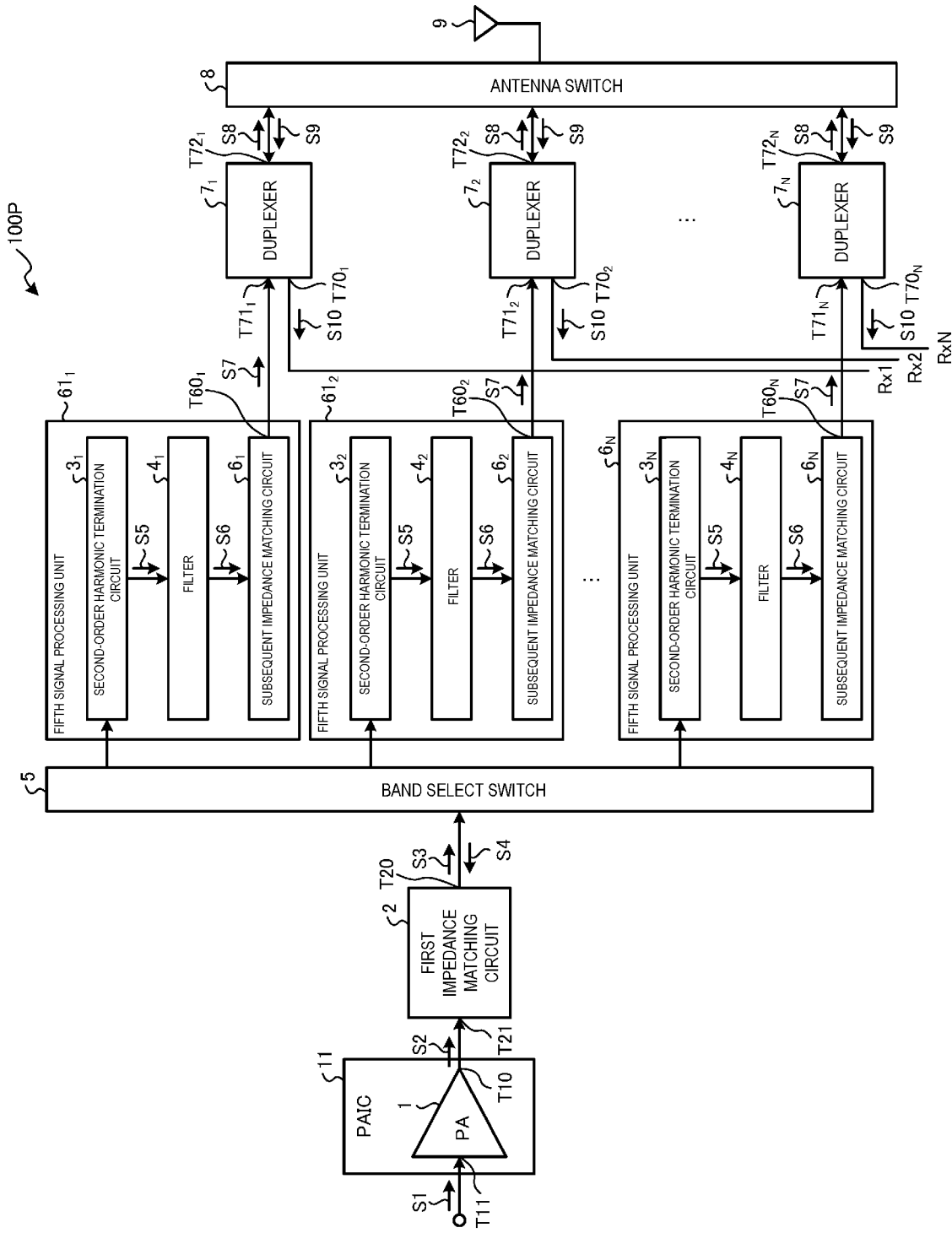
FIG. 50 is a diagram that shows the configuration of a power amplifier unit according to a sixteenth embodiment.

FIG. 50 is a diagram that shows the configuration of a power amplifier unit 100P according to a sixteenth embodiment. As shown in FIG. 50, the power amplifier unit 100P according to the sixteenth embodiment has such a configuration that the function of the second signal processing unit 34 of the power amplifier unit 100E according to the fifth embodiment described with reference to FIG. 35 is provided in each of fifth signal processing units $61_1$, $61_2$, ..., $61_N$. The other configuration of the power amplifier unit 100P is similar to that of the power amplifier unit 100E according to the fifth embodiment described with reference to FIG. 35.

Since each of the fifth signal processing units $61_1$, $61_2$, ..., $61_N$ has the functions of second-order harmonic termination circuit, filter, and impedance matching circuit, cost is suppressed as compared to when those functions are separately provided.

Seventeenth Embodiment

Figure 51:
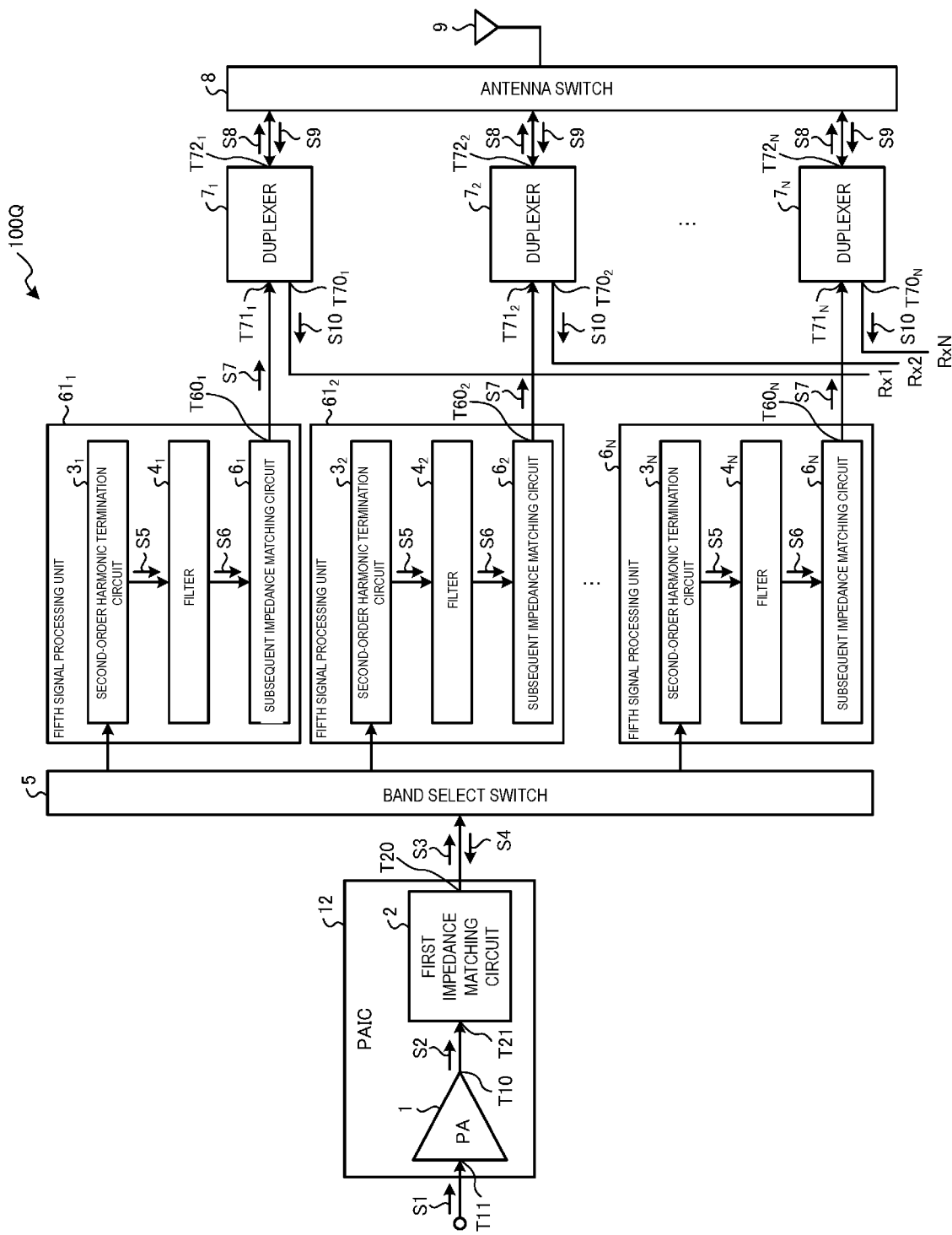
FIG. 51 is a diagram that shows the configuration of a power amplifier unit according to a seventeenth embodiment.

FIG. 51 is a diagram that shows the configuration of a power amplifier unit 100Q according to a seventeenth embodiment. As shown in FIG. 51, the power amplifier unit 100Q according to the seventeenth embodiment has such a configuration that, in the power amplifier unit 100P according to the sixteenth embodiment described with reference to FIG. 50, a first impedance matching circuit 2 is implemented as a PAIC 12 together with a power amplifier circuit 1. The other configuration of the power amplifier unit 100Q is similar to that of the power amplifier unit 100P according to the sixteenth embodiment described with reference to FIG. 50.

In the power amplifier unit 100Q according to the seventeenth embodiment, the power amplifier circuit 1 and the first impedance matching circuit 2 are provided in the same integrated circuit, that is, the PAIC 12. Thus, a power loss that has been generated in a transmission line between the first impedance matching circuit 2 and the power amplifier circuit 1 disappears, so the amplitude of a reflected wave component is kept large.

Since each of the fifth signal processing units $61_1$, $61_2$, ..., $61_N$ has the function of a second-order harmonic termination circuit, the function of a filter, and the function of an impedance matching circuit, cost is suppressed as compared to when those functions are separately provided.

Eighteenth Embodiment

Figure 52:
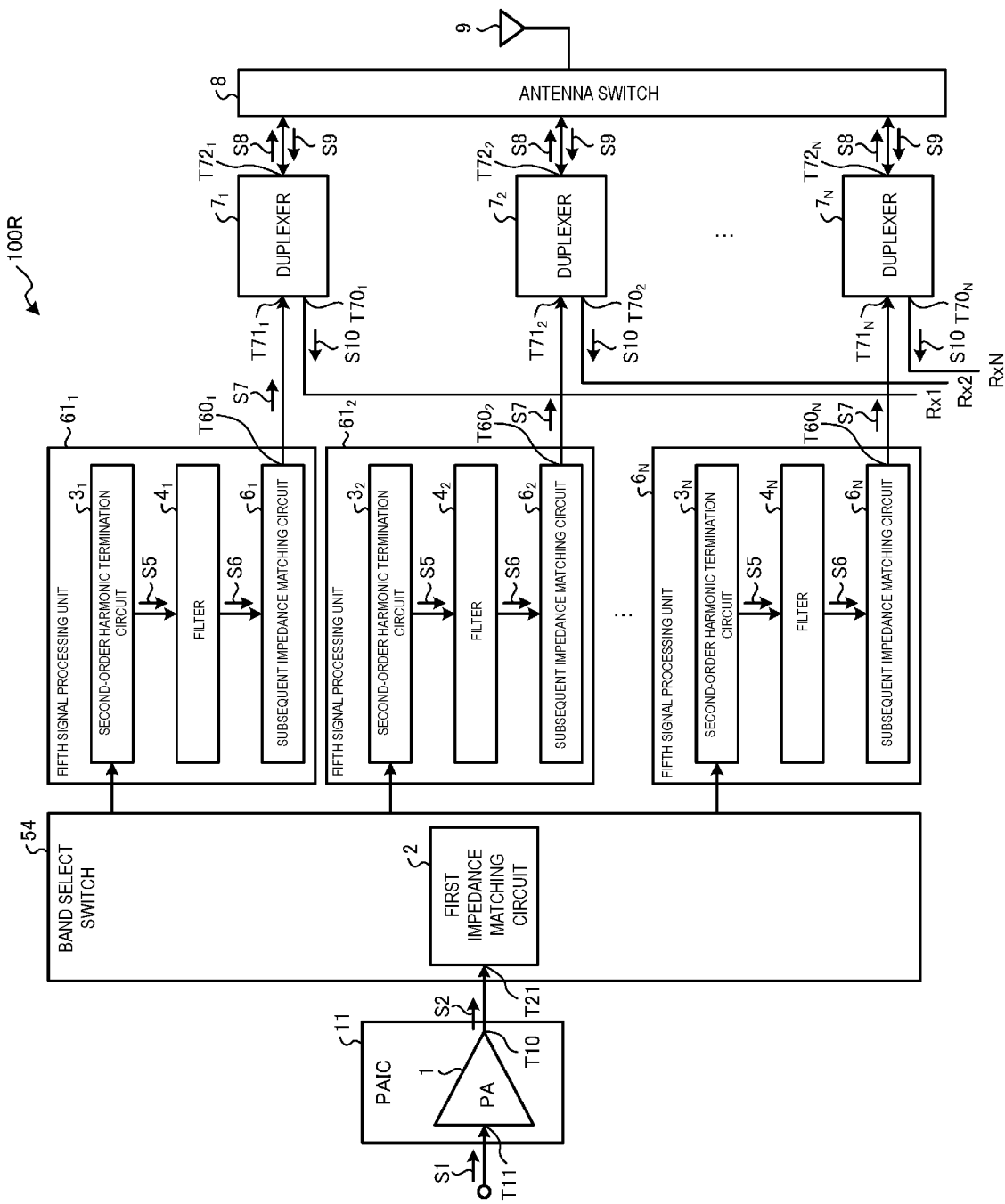
FIG. 52 is a diagram that shows the configuration of a power amplifier unit according to an eighteenth embodiment.

FIG. 52 is a diagram that shows the configuration of a power amplifier unit 100R according to an eighteenth embodiment. As shown in FIG. 52, the power amplifier unit 100R according to the eighteenth embodiment has such a configuration that, in the power amplifier unit 100P according to the sixteenth embodiment described with reference to FIG. 50, a first impedance matching circuit 2 is provided in a band select switch 54. The other configuration of the power amplifier unit 100R is similar to that of the power amplifier unit 100P according to the sixteenth embodiment described with reference to FIG. 50.

By providing the first impedance matching circuit 2 in the band select switch 54, the size of the power amplifier unit 100R is reduced as compared to the power amplifier unit 100E of FIG. 35.

Since each of the fifth signal processing units $61_1$, $61_2$, ..., $61_N$ has the function of a second-order harmonic termination circuit, the function of a filter, and the function of an impedance matching circuit, cost is suppressed as compared to when those functions are separately provided.

Nineteenth Embodiment

Figure 53:
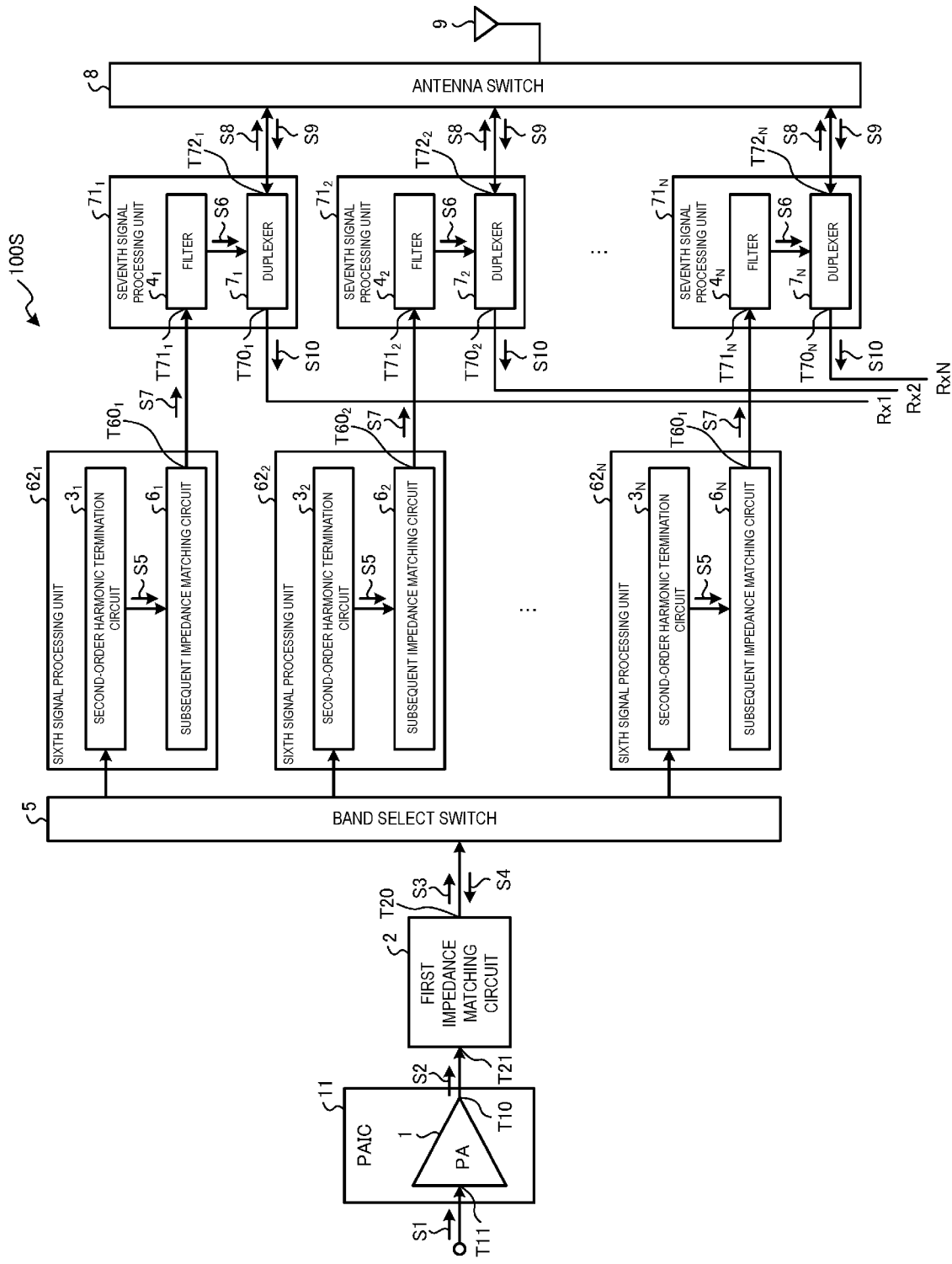
FIG. 53 is a diagram that shows the configuration of a power amplifier unit according to a nineteenth embodiment.

FIG. 53 is a diagram that shows the configuration of a power amplifier unit 100S according to a nineteenth embodiment. As shown in FIG. 53, the power amplifier unit 100S according to the nineteenth embodiment has such a configuration that, in the power amplifier unit 100F according to the sixth embodiment described with reference to FIG. 36, sixth signal processing units $62_1$, $62_2$, ..., $62_N$ each having the function of the second-order harmonic termination circuit 3 and seventh signal processing units 711, 712, ..., 71N each having the function of the filter 4 and the function of a duplexer are provided. The other configuration of the power amplifier unit 100S is similar to that of the power amplifier unit 100F according to the sixth embodiment described with reference to FIG. 36. By providing a filter in each of the seventh signal processing units $71_1$, $71_2$, ..., $71_N$ each having the function of a duplexer, the size of the power amplifier unit 100S is reduced as compared to the power amplifier unit 100E of FIG. 35.

Since each of the sixth signal processing units $62_1$, $62_2$, ..., $62_N$ has the functions of second-order harmonic termination circuit and impedance matching circuit, cost is suppressed as compared to when those functions are separately provided.

Twentieth Embodiment

Figure 54:
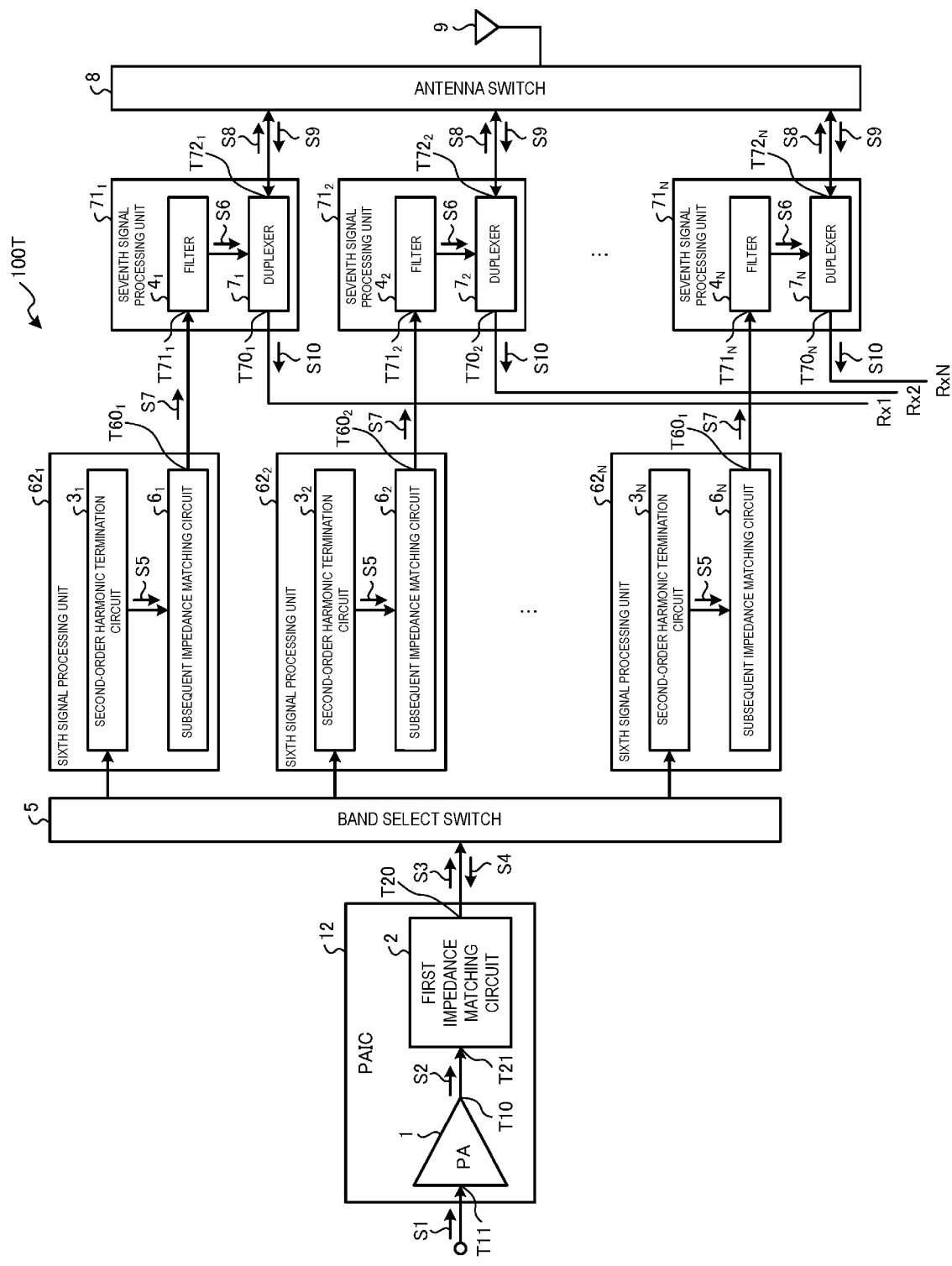
FIG. 54 is a diagram that shows the configuration of a power amplifier unit according to a twentieth embodiment.

FIG. 54 is a diagram that shows the configuration of a power amplifier unit 100T according to a twentieth embodiment. As shown in FIG. 54, the power amplifier unit 100T according to the twentieth embodiment has such a configuration that, in the power amplifier unit 100S according to the nineteenth embodiment described with reference to FIG. 53, a first impedance matching circuit 2 is implemented as a PAIC 12 together with a power amplifier circuit 1. The other configuration of the power amplifier unit 100T is similar to that of the power amplifier unit 100S according to the nineteenth embodiment described with reference to FIG. 53. By providing a filter in each of the seventh signal processing units $71_1$, $71_2$, ..., $71_N$ each having the function of a duplexer, the size of the power amplifier unit 100T is reduced as compared to the power amplifier unit 100E of FIG. 35.

In the power amplifier unit 100T according to the twentieth embodiment, the power amplifier circuit 1 and the first impedance matching circuit 2 are provided in the same integrated circuit, that is, the PAIC 12. Thus, a power loss that has been generated in a transmission line between the first impedance matching circuit 2 and the power amplifier circuit 1 disappears, so the amplitude of a reflected wave component is kept large.

Twenty-First Embodiment

Figure 55:
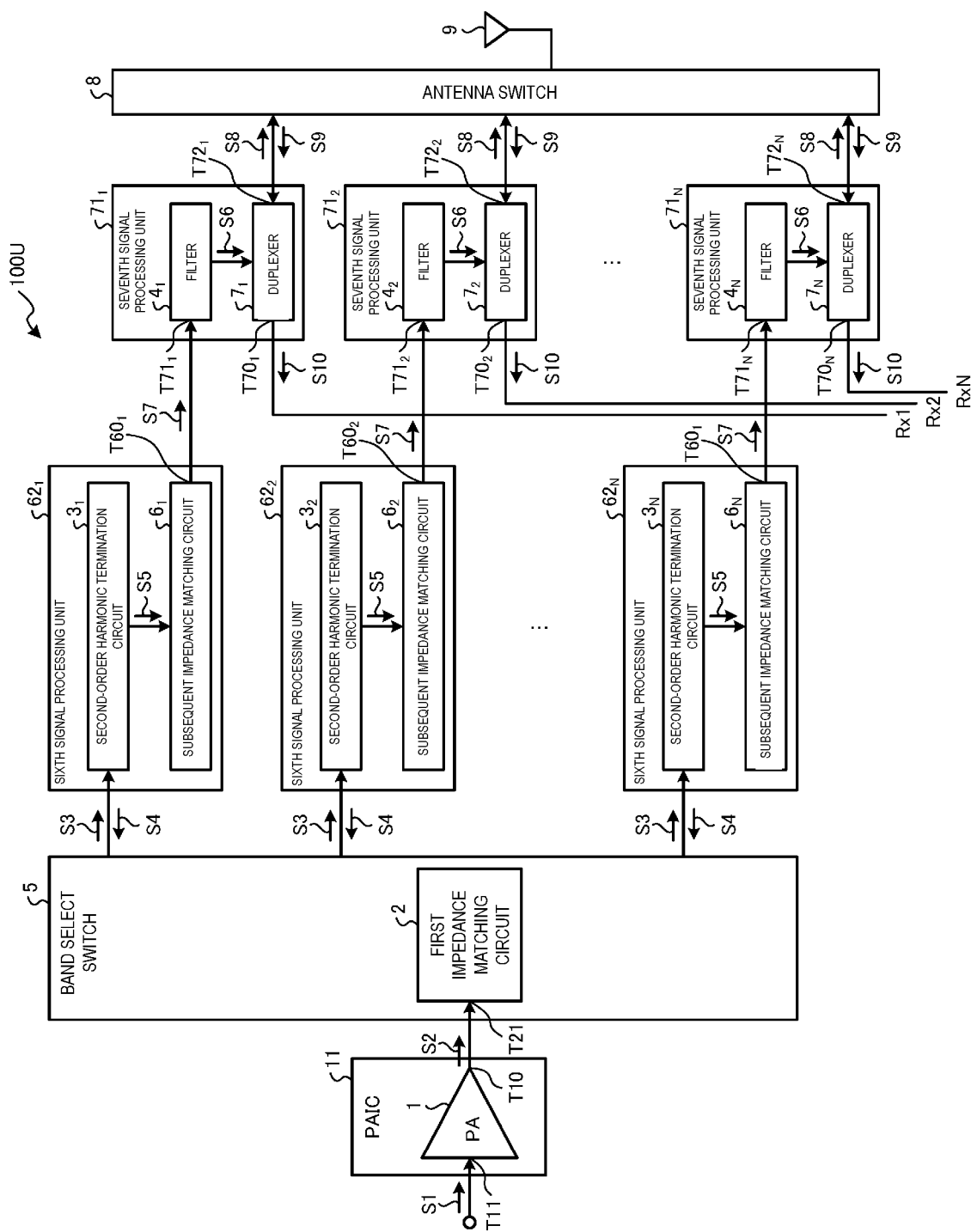
FIG. 55 is a diagram that shows the configuration of a power amplifier unit according to a twenty-first embodiment.

FIG. 55 is a diagram that shows the configuration of a power amplifier unit 100U according to a twenty-first embodiment. As shown in FIG. 55, the power amplifier unit 100U according to the twenty-first embodiment has such a configuration that, in the power amplifier unit 100S according to the nineteenth embodiment described with reference to FIG. 53, a first impedance matching circuit 2 is provided in a band select switch 55. The other configuration of the power amplifier unit 100U is similar to that of the power amplifier unit 100S according to the nineteenth embodiment described with reference to FIG. 53. By providing a filter in each of the seventh signal processing units $71_1$, $71_2$, ..., $71_N$ each having the function of a duplexer, the size of the power amplifier unit 100U is reduced as compared to the power amplifier unit 100E of FIG. 35.

Modifications

In the above-described embodiments, a reflected wave component obtained by reflecting a second-order harmonic that is an even-ordered harmonic is superposed on a traveling wave component of the second-order harmonic in opposite phase at the first output terminal of the power amplifier circuit 1. Alternatively, a third-order harmonic that is an odd-ordered harmonic may be reflected instead. In this case, at the first output terminal of the power amplifier circuit 1, a reflected wave component obtained by reflecting a third-order harmonic is superposed on a traveling wave component of the third-order harmonic in the same phase. Not limited to a third-order harmonic, a higher-level odd-ordered harmonic may be reflected and superposed on a traveling wave component in the same phase. In other words, at least an odd-ordered harmonic including a third-order harmonic for a fundamental may be reflected by the harmonic termination circuit, and a reflected wave component of the odd-ordered harmonic reflected by the harmonic termination circuit may be input to the output end of the power amplifier circuit 1 in the same phase, that is, in a non-destructive interference phase. As long as the phase is a non-destructive interference phase, the phase difference may be other than zero (that is, the same phase). When, for example, there is a slight phase difference between a traveling wave component and a reflected wave component, a synthetic wave of them is able to increase the amplitude of a fundamental.

In addition, a second-order harmonic that is an even-ordered harmonic may be reflected and superposed on a traveling wave component in opposite phase, and a third-order harmonic that is an odd-ordered harmonic may be reflected and superposed on a traveling wave component in the same phase. In other words, by the harmonic termination circuit, at least an even-ordered harmonic including a second-order harmonic for a fundamental may be reflected and superposed on a traveling wave component in opposite phase, and an odd-ordered harmonic including a third-order harmonic for the fundamental may be reflected and superposed on a traveling wave component in the same phase.

One or some or all of the component elements of each of the above-described power amplifier units may be implemented as surface mount devices (SMDs). For example, the first impedance matching circuit, the band select switch, and the subsequent impedance matching circuit may be implemented as surface mount devices. One or some or all of the component elements of each of the above-described power amplifier units may be implemented by an integrated circuit. For example, the band select switch, the duplexer, and the antenna switch may be implemented by an integrated circuit.

Modifications for Size Reduction

Figure 56:
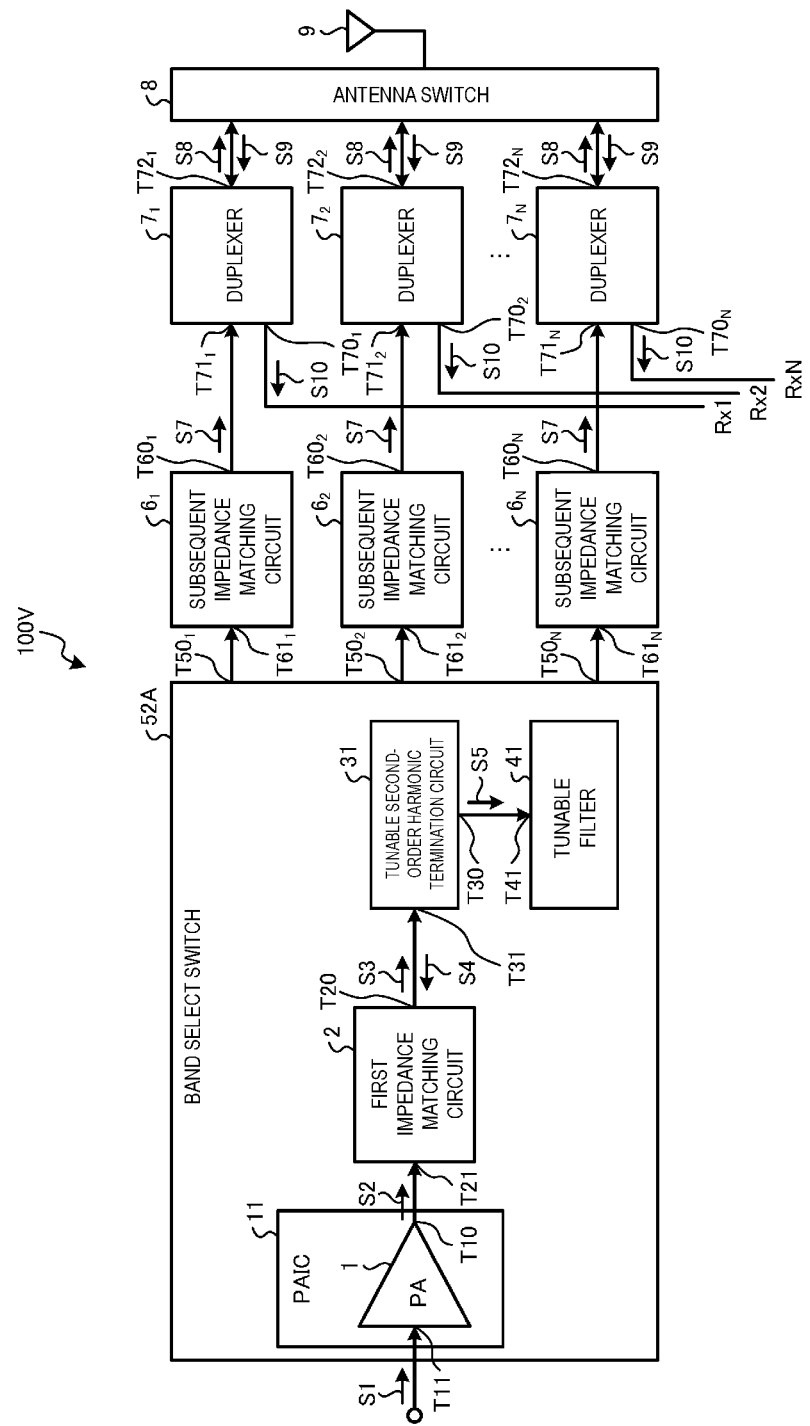
FIG. 56 is a diagram that shows the configuration of a power amplifier unit according to a twenty-second embodiment.

Hereinafter, a configuration for reducing the size of a power amplifier unit will be described. FIG. 56 is a diagram that shows the configuration of a power amplifier unit 100V according to a twenty-second embodiment. As shown in FIG. 56, the power amplifier unit 100V according to the twenty-second embodiment includes a band select switch 52A and a PAIC 11 in the power amplifier unit 100I according to the ninth embodiment described with reference to FIG. 41. An integrated circuit that makes up the band select switch 52A includes a first impedance matching circuit 2, a tunable second-order harmonic termination circuit 31, and a tunable filter 41. The electrical connection states among the PAIC 11, the first impedance matching circuit 2, the tunable second-order harmonic termination circuit 31, and the tunable filter 41 are similar to those of the power amplifier unit 100I according to the ninth embodiment described with reference to FIG. 41.

The integrated PAIC 11 is pasted onto the integrated circuit that makes up the band select switch 52A. The PAIC 11 is made by a semiconductor process different from that for the integrated circuit that makes up the band select switch 52A.

The integrated circuit that makes up the band select switch 52A may include a plurality of the first impedance matching circuits 2. The integrated circuit that makes up the band select switch 52A may include a plurality of the tunable second-order harmonic termination circuits 31. The integrated circuit that makes up the band select switch 52A may include a plurality of the tunable filters 41.

Next, an implementation example of the power amplifier unit 100V shown in FIG. 56 will be described. FIGS. 57A to 61 are diagrams that show an implementation example of a module 1111 including a circuit element 103 that corresponds to the power amplifier unit 100V shown in FIG. 56.

Figure 57A:
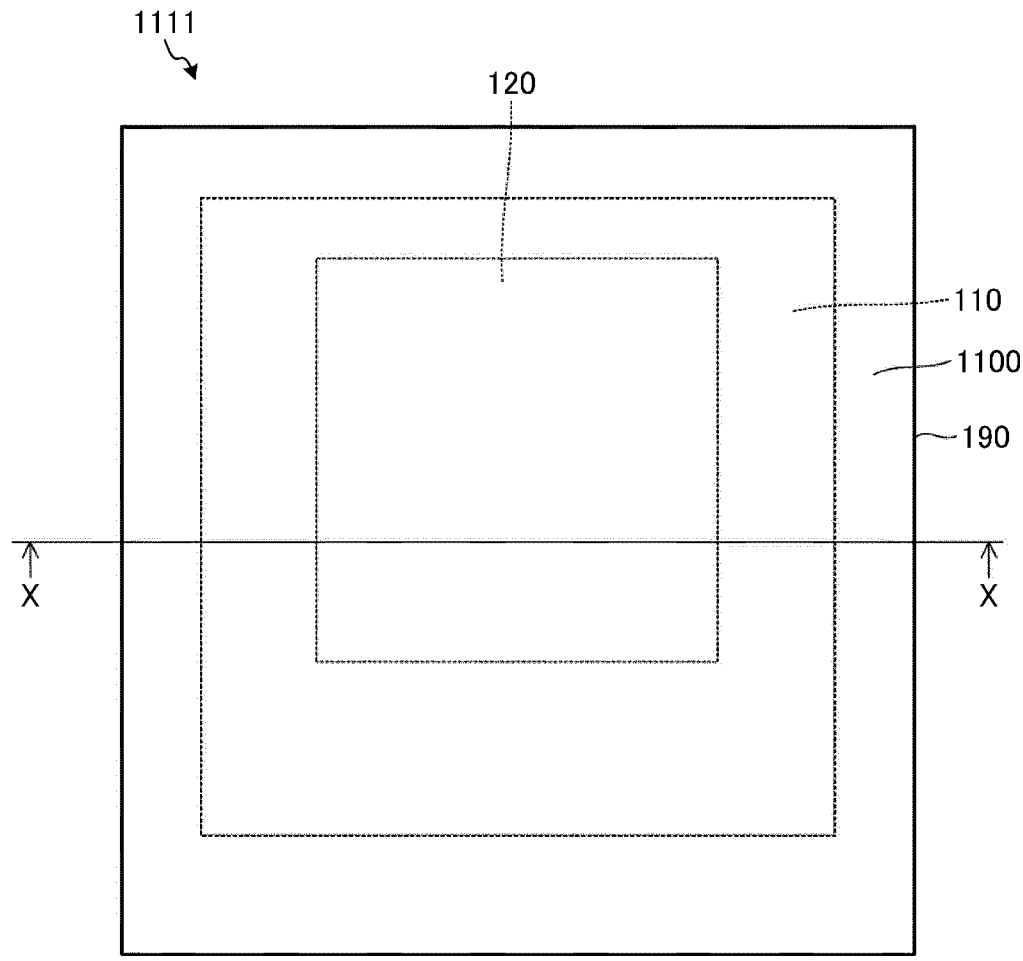
FIG. 57A is a view that shows an implementation example of the power amplifier unit shown in FIG. 56.
Figure 57B:
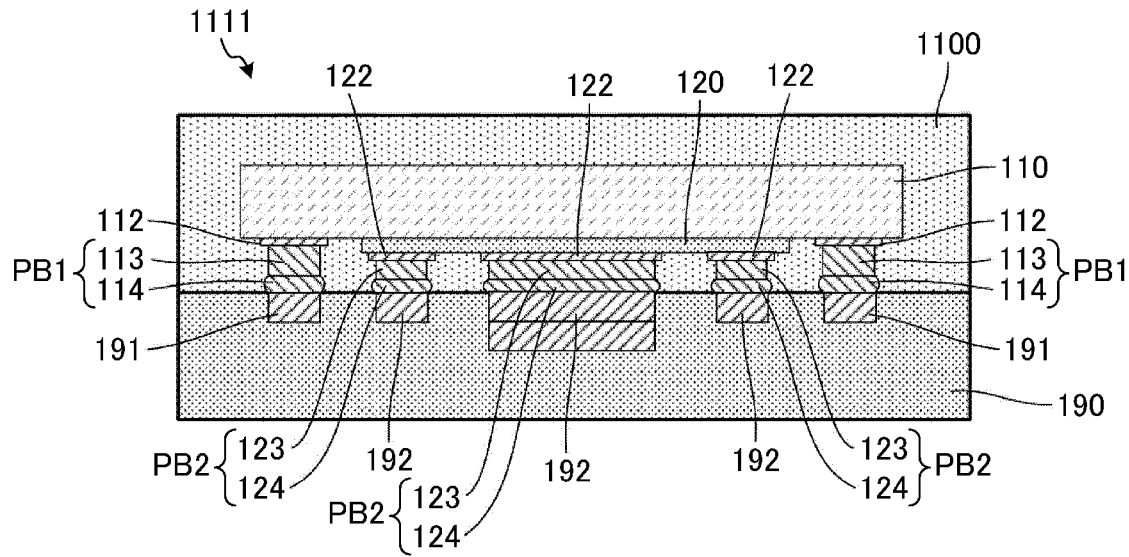
FIG. 57B is a view that shows an implementation example of the power amplifier unit shown in FIG. 56.

FIG. 57A is a plan view of the module 1111. FIG. 57B is a cross-sectional view taken along the X-X part in FIG. 57A. The module 1111 includes a module substrate 190 having module substrate-side electrodes 191, 192 for mounting components, a first member 110 in which a first circuit is implemented, a second member 120 in which a second circuit is implemented, and a mold resin 1100. The module substrate 190 is, for example, a printed circuit board (PCB), such as a glass epoxy substrate. The mold resin 1100 is, for example, epoxy resin.

The first circuit includes, for example, the above-described band select switch 52A, the first impedance matching circuit 2, the tunable second-order harmonic termination circuit 31, and the tunable filter 41. The first circuit including these components is formed on or in the first member 110. The second circuit is, for example, the above-described PAIC 11. The PAIC 11 is formed on or in the second member 120. The second member 120 is mounted on the first member 110. The first member 110 is flip-chip bonded to the module substrate 190 (mounted in a face-down position). A bias circuit may be further provided. The bias circuit is formed on or in the first member 110 or the second member 120.

The first member 110 and the second member 120 have a circuit-to-circuit connection wire that electrically connects a circuit formed on or in the first member 110 and a circuit formed on or in the second member 120 without intervening the module substrate 190.

The first member 110 has first member-side electrodes 112 and first conductor pillar bumps PB1. The second member 120 has second member-side electrodes 122 and second conductor pillar bumps PB2.

Each of the first conductor pillar bumps PB1 is made up of a conductor pillar 113 formed on the first member-side electrode 112 of the first member 110, and a solder layer 114 applied to the distal end portion of the conductor pillar 113. Each of the second conductor pillar bumps PB2 is made up of a conductor pillar 123 formed on the second member-side electrode 122 of the second member 120, and a solder layer 124 applied to the distal end portion of the conductor pillar 123. The conductor pillars 113, 123 are, for example, Cu plating films. The solder layers 114, 124 are, for example, SnAg alloy films.

The first circuit formed on or in the first member 110 and the second circuit formed on or in the second member 120 face an electrode forming surface of the module substrate 190.

Module substrate-side electrodes 191, 192 are formed in the module substrate 190. The first conductor pillar bumps PB1 of the first member 110 are connected to the module substrate-side electrodes 191 of the module substrate 190. The second conductor pillar bumps PB2 of the second member 120 are connected to the module substrate-side electrodes 192 of the module substrate 190.

In this way, the first circuit formed on or in the first member 110 and the second circuit formed on or in the second member 120 face the electrode forming surface of the module substrate 190 and are connected to the module substrate-side electrodes 191, 192 of the module substrate 190 via the first conductor pillar bumps PB1 and the second conductor pillar bumps PB2. For this reason, paths between the first circuit and a module substrate 190-side circuit and paths between the second circuit and the module substrate 190-side circuit each are shortest. Therefore, the degradation of electrical characteristics in signal paths is suppressed.

After a power amplifier module (that is, the circuit element 103) including the first member 110 and the second member 120 is mounted on the module substrate 190, the surface of the module substrate 190 is molded with the mold resin 1100.

Figure 58A:
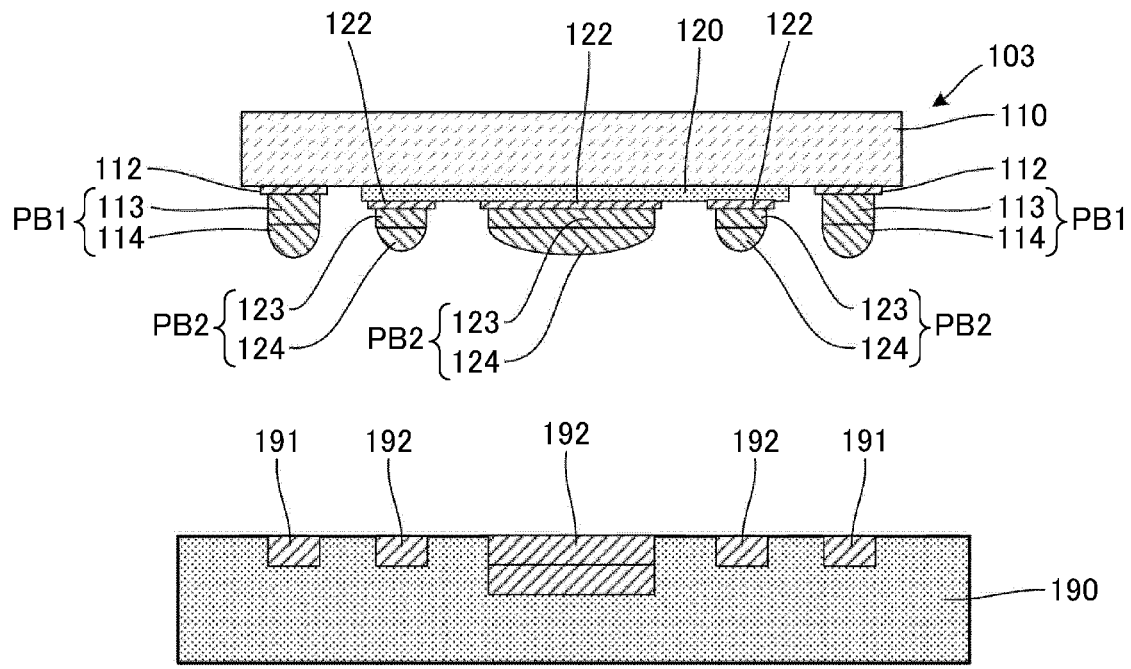
FIG. 58A is a view that shows an implementation example of the power amplifier unit shown in FIG. 56.
Figure 58B:
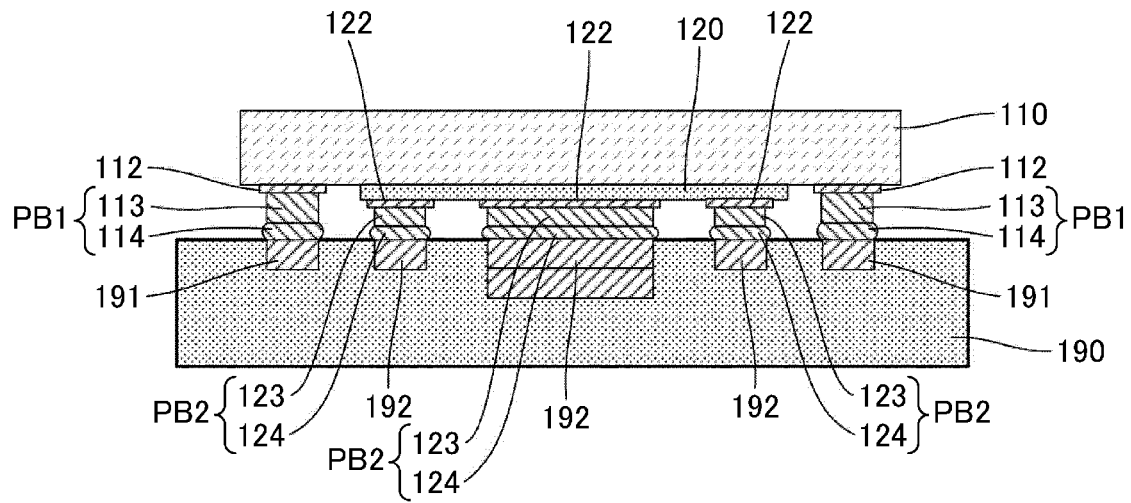
FIG. 58B is a view that shows an implementation example of the power amplifier unit shown in FIG. 56.

FIGS. 58A and 58B are views that show a manufacturing process for the module 1111. FIG. 58A is a cross-sectional view that shows a state just before the circuit element 103 including the first member 110 and the second member 120 is mounted on the module substrate 190. FIG. 58B is a cross-sectional view that shows a state where the circuit element 103 is mounted on the module substrate 190.

A method of forming the circuit element 103 will be described later. The first conductor pillar bumps PB1 and the second conductor pillar bumps PB2 are formed on the bottom surface of the circuit element 103. The first conductor pillar bumps PB1 and second conductor pillar bumps PB2 of the circuit element 103 are aligned with the module substrate 190 and heated under pressure. As a result, as shown in FIG. 58B, the solder layers 114, 124 of the first conductor pillar bumps PB1 and second conductor pillar bumps PB2 of the circuit element 103 are connected to the module substrate-side electrodes 191, 192.

Figure 59:
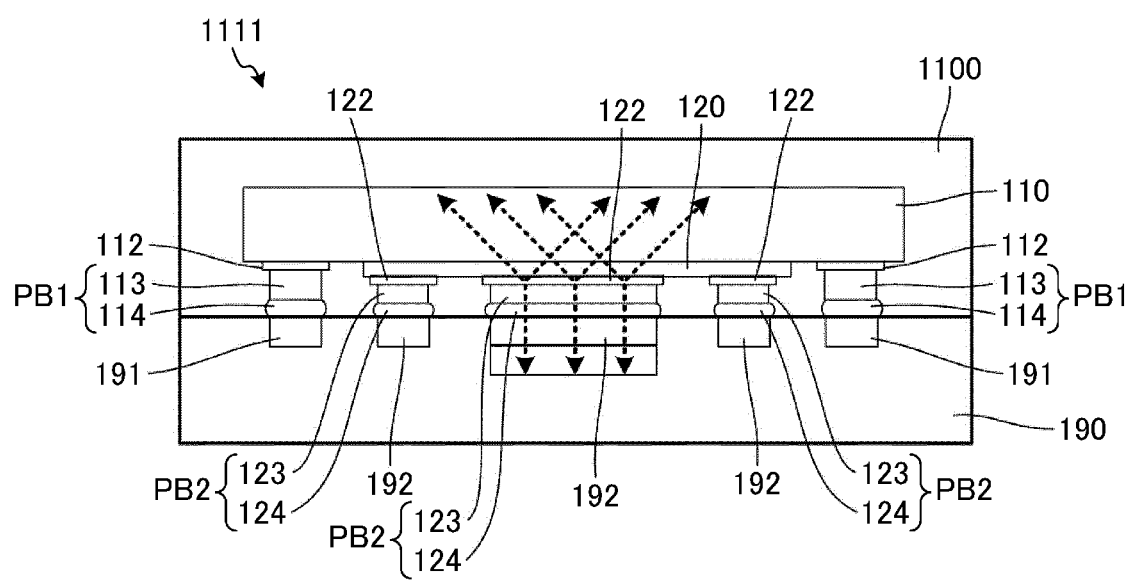
FIG. 59 is a view that shows an implementation example of the power amplifier unit shown in FIG. 56.

FIG. 59 is a view that shows two heat conduction paths that are heat radiation paths in the module 1111 from circuit elements formed on or in the second member 120. In FIG. 59, the dashed arrows represent the two heat conduction paths. The first heat conduction path is made up of the second member-side electrodes 122 and the second conductor pillar bumps PB2. Heat generated by the circuit elements passes through the first heat conduction path and is radiated and exhausted to the module substrate-side electrodes 192 and the module substrate 190. The second heat conduction path is a heat conduction path in a direction from the second member 120 to the first member 110. Heat generated by the circuit elements is radiated and exhausted via the second heat conduction path.

The second conductor pillar bumps PB2 are provided nearest to the second member-side electrodes 122 that are part of the second circuit formed on or in the second member 120. Therefore, the heat radiation and exhaust heat efficiency is high.

The height of each first conductor pillar bump PB1 is less than the thickness of the first member 110. Therefore, in comparison with the case where the first member 110 on which the second member 120 is mounted is connected to the module substrate 190 by means of a mounting technology, such as wire bonding, wire length is shortened, and loop inductance is reduced.

Figure 60:
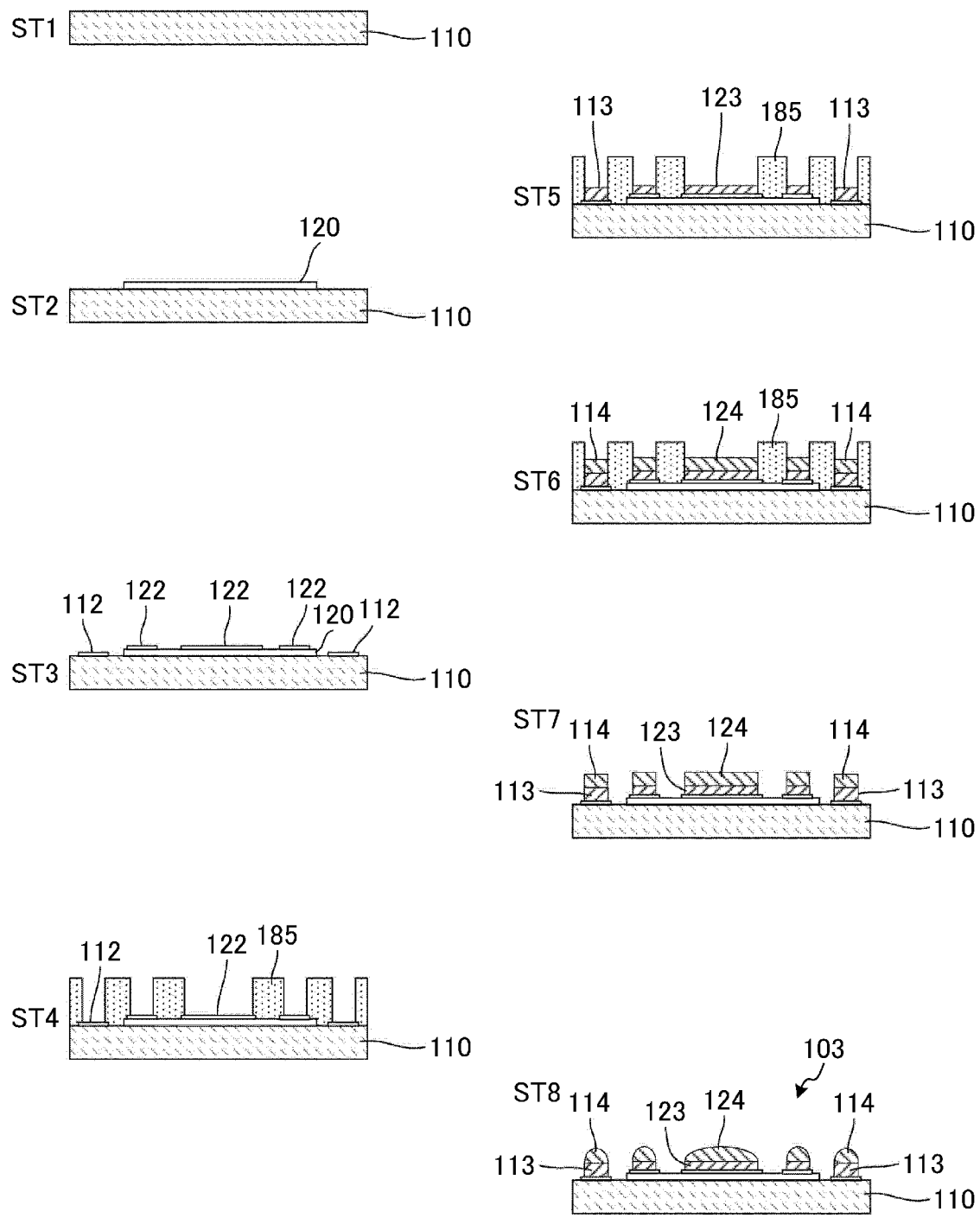
FIG. 60 is a view that shows an implementation example of the power amplifier unit shown in FIG. 56.

Next, a manufacturing method for the module 1111 will be illustrated. FIG. 60 is a view that shows the manufacturing method for the circuit element 103. The views from step ST1 to step ST7 in FIG. 60 are cross-sectional views in process of manufacturing the circuit element 103. Step ST8 is a cross-sectional view of the completed circuit element 103. Manufacturing is actually performed wafer by wafer. FIG. 60 shows a single semiconductor device.

Initially, as shown in step ST1 in FIG. 60, the first member 110 made up of an Si substrate is placed. When needed, a bonding layer may be formed on the surface of the first member 110 made up of the Si substrate with a general semiconductor process. The bonding layer is a metal film, such as an Au film, an organic material film, such as a polyimide (PI) film, polybenzoxazole (PBO), and benzocyclobutene (BCB), or an electrical insulator, such as AlN, SiC, and diamond.

Next, as shown in step ST2, the second member 120 is bonded onto the first member 110. Circuit elements and electrodes are already formed on or in the second member 120 in a separate step.

Subsequently, as shown in step ST3, the second member-side electrodes 122 are formed on the second member 120 and the first member-side electrodes 112 are formed on the first member 110 by means of a general semiconductor process.

Subsequently, as shown in step ST4, a resist film 185 having openings in regions in which the conductor pillars 113 and the solder layers 114 (FIGS. 58A and 58B) should be formed is formed. The electrodes 112, 122 are exposed to the insides of the openings of the resist film 185.

After that, as shown in step ST5 and step ST6, the conductor pillars 113, 123 and the solder layers 114, 124 are deposited by plating on the electrodes 112, 122 exposed to the insides of the openings of the resist film 185. The conductor pillars 113, 123 are made of Cu and have a thickness of, for example, about 40 µm. In this way, copper pillar bumps (CPBs) are formed. The solder layers 114, 124 are made of an SnAg alloy and have a thickness of, for example, 30 µm.

After that, as shown in step ST7, the resist film 185 is removed. Finally, a reflow process is performed to fuse the solder layers 114, 124 and solidified, with the result that the circuit element 103 is obtained as shown in step ST8.

Figure 61:
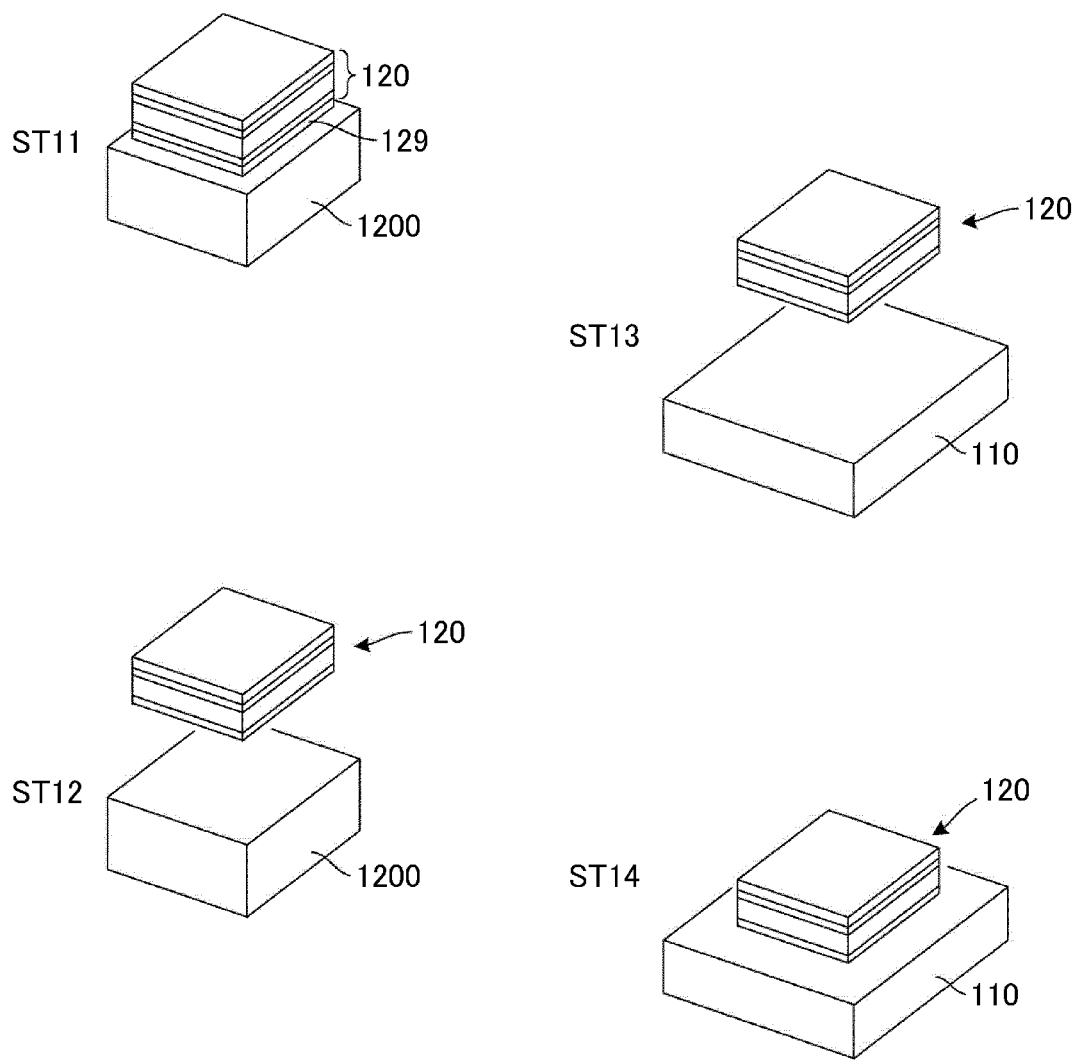
FIG. 61 is a view that shows an implementation example of the power amplifier unit shown in FIG. 56.

FIG. 61 shows perspective views in steps of a manufacturing method for the second member 120 and a method of bonding the second member 120 to the first member 110. Manufacturing is actually performed wafer by wafer. FIG. 61 shows a single semiconductor device.

As shown in step ST11 in FIG. 61, initially, a release layer 129 is formed on a motherboard 1200 that is a compound semiconductor substrate, a semiconductor thin film is formed on the top of the release layer 129 by means of an epitaxial growth method, and a plurality of circuit elements and electrodes connected to the circuit elements are formed in the semiconductor thin film. This portion will be the second member 120 later.

Subsequently, as shown in step ST12, the second member 120 (semiconductor thin film piece) is released from the motherboard 1200 by performing a process of selectively etching only the release layer 129.

After that, as shown in step ST13, the second member 120 is bonded to the first member 110. In other words, the second member 120 that is the semiconductor thin film piece is transferred from the motherboard 1200 to the first member 110. This bonding is performed by van der Waals bond or hydrogen bond. Other than those, the bonding may be performed by electrostatic force, covalent bond, eutectic alloy bond, or the like. In a separate step, an Au film may be formed on the first member 110 as a bonding layer, and the second member 120 may be brought into close contact with the surface of the bonding layer under pressure to diffuse Au of the bonding layer in the GaAs layer of the second member 120 to be eutectic.

Formation of circuit elements and electrodes on or in the second member 120 may be performed not only at the stage shown in step ST11 but also, as shown in step ST14, in a process applied to the second member 120 (photolithography etching step) after bonding the second member 120 to the first member 110.

As a method of peeling and transferring the semiconductor thin film piece, as shown in step ST12 in FIG. 61, when the second member 120 (semiconductor thin film piece) is peeled from the motherboard 1200, the second member 120 is peeled from the motherboard 1200 in a state where the second member 120 is supported by a support. Also, as shown in step ST13 in FIG. 61, when the second member 120 is bonded to the first member 110, the second member 120 is bonded in a state where the second member 120 is supported by the support. In step ST12 and step ST13 in FIG. 61, for the sake of clear illustration of the second member 120, the support is not shown.

The thus configured module 1111 has the following advantageous effects.

(a) Since the first member 110 is flip-chip bonded to the module substrate 190 (mounted in a face-down position), no space for disposing pads or wires for wire bonding is needed, so the size is reduced as a whole.

(b) The circuit formed on or in the first member 110 and the circuit formed on or in the second member 120 are electrically connected by the member-to-member connection conductor without intervening the module substrate 190, the first member 110 has the first conductor pillar bumps PB1 connected to the electrodes of the module substrate 190, and the second member 120 has the second conductor pillar bumps PB2 connected to the electrodes of the module substrate 190. Therefore, no wire for connecting the circuit formed on or in the first member 110 and the circuit formed on or in the second member 120 needs to be formed in the module substrate 190, so the size is reduced as a whole.

(c) Since heat generated by the radio-frequency amplifier circuit formed on or in the second member 120 is radiated and exhausted with high efficiency, the circuit module reduced in size without constraints to heat radiation property or the circuit module having a high heat radiation property with a small size is obtained.

By adopting the above configuration, the size of the unit is reduced as compared to the power amplifier unit 100I according to the ninth embodiment described with reference to FIG. 41. As a result, the wire length between circuits is reduced, so the parasitic capacitances of wires are reduced.

Figure 62:
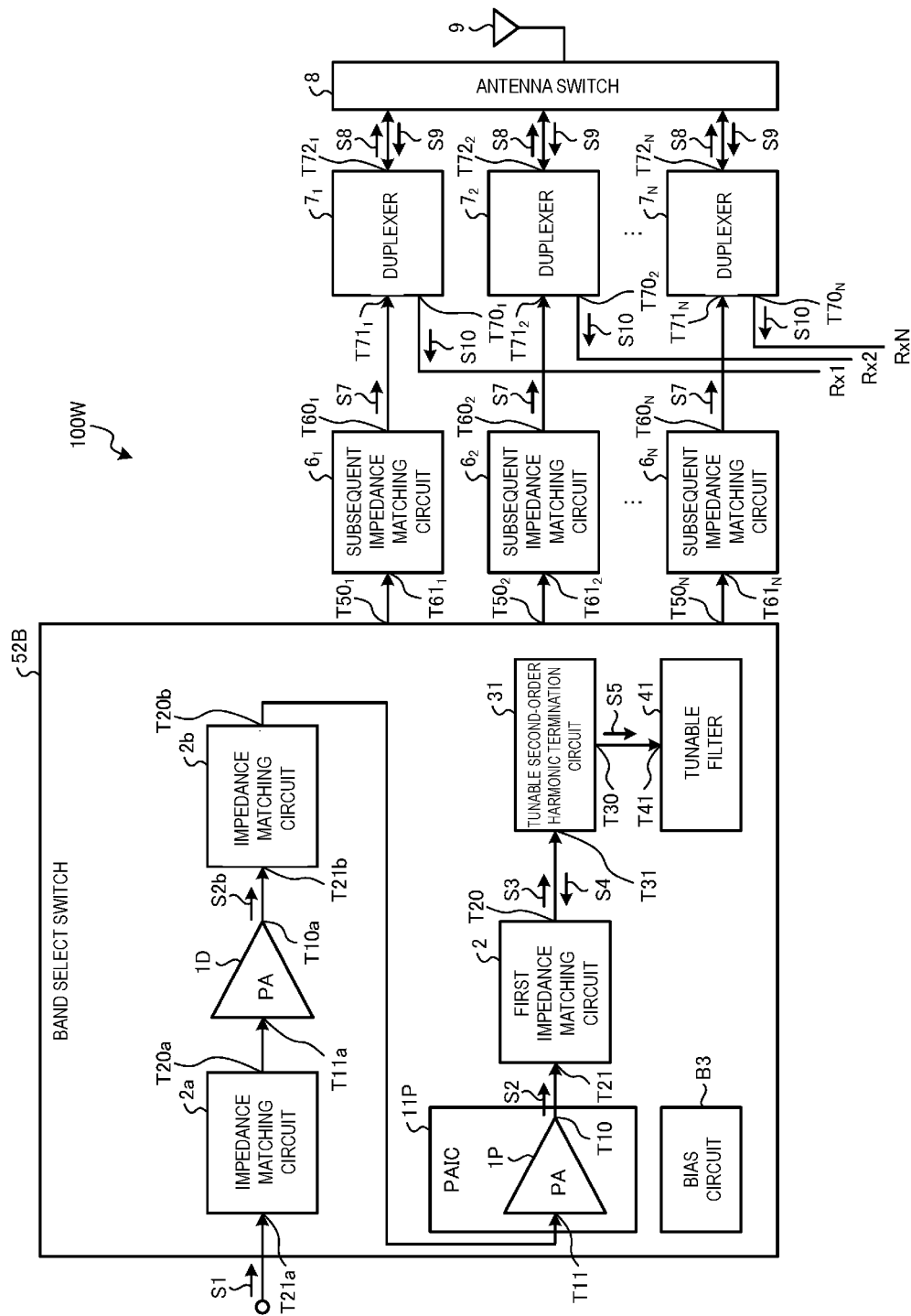
FIG. 62 is a diagram that shows the configuration of a power amplifier unit according to a twenty-third embodiment.

FIG. 62 is a diagram that shows the configuration of a power amplifier unit 100W according to a twenty-third embodiment. As shown in FIG. 62, the power amplifier unit 100W according to the twenty-third embodiment includes a band select switch 52B and a PAIC 11P. The band select switch 52B includes a first impedance matching circuit 2, a power amplifier circuit 1D, impedance matching circuits 2a, 2b, a tunable second-order harmonic termination circuit 31, a tunable filter 41, and a bias circuit B3. The power amplifier unit 100W according to the twenty-third embodiment shown in FIG. 62 has such a configuration that the PAIC 11 of the power amplifier unit 100V according to the twenty-second embodiment is divided into a drive-stage power amplifier circuit 1D and a power-stage PAIC 11P. The impedance matching circuit 2a is provided in a preceding stage of the power amplifier circuit 1D. The impedance matching circuit 2b is provided between the power amplifier circuit 1D and the PAIC 11P. The first impedance matching circuit 2 is provided in a subsequent stage of the PAIC 11P. The power amplifier unit 100W is implemented by the first member 110 and the second member 120 described with reference to FIGS. 57A to 61. In this case, the band select switch 52B, the first impedance matching circuit 2, the tunable second-order harmonic termination circuit 31, the tunable filter 41, the impedance matching circuit 2b, the drive-stage power amplifier circuit 1D, the impedance matching circuit 2a, and the bias circuit B3 in the power amplifier unit 100W are, for example, formed on or in the first member 110. The power-stage PAIC 11P in the power amplifier unit 100W is, for example, formed on or in the second member 120. A power amplifier unit 100W includes the bias circuit B3.

The impedance matching circuit 2a has an input terminal T21a and an output terminal T20a. The impedance matching circuit 2a converts the input impedance of an element connected to the output terminal T20a.

The drive-stage power amplifier circuit 1D has an input terminal T11a and an output terminal T10a. The power amplifier circuit 1D amplifies a signal to be input to the input terminal T11a.

The impedance matching circuit 2b has an input terminal T21b and an output terminal T20b. An output signal S2b of the power amplifier circuit 1D is input to the input terminal T21b of the impedance matching circuit 2b. The impedance matching circuit 2b converts the input impedance of an element connected to the output terminal T20b.

The PAIC 11P includes a power-stage power amplifier circuit 1P. The power amplifier circuit 1P has an input terminal T11 and an output terminal T10. The power amplifier circuit 1P amplifies a signal to be input to the input terminal T11.

The first impedance matching circuit 2 has a second input terminal T21 and a second output terminal T20. The second input terminal T21 is connected to the first output terminal T10 of the power amplifier circuit 1P. The first impedance matching circuit 2 outputs the second radio-frequency signal S2 input to the second input terminal T21, from the second output terminal T20 as a third radio-frequency signal S3. The first impedance matching circuit 2 converts an impedance between the second input terminal T21 and the second output terminal T20. In other words, the first impedance matching circuit 2 converts the input impedance of an element connected to the second output terminal T20 of the first impedance matching circuit 2 and provides a load impedance for the power amplifier circuit 1P.

The tunable second-order harmonic termination circuit 31 and the tunable filter 41 each have the above-described configuration and perform the above-described operation. The bias circuit B3 supplies a bias to the power amplifier circuit 1D and the power amplifier circuit 1P.

In the present embodiment, the integrated PAIC 11P is pasted onto the integrated circuit that makes up the band select switch 52B. The PAIC 11P is made by a semiconductor process different from that for the integrated circuit that makes up the band select switch 52B.

In the present embodiment, the integrated PAIC 11P is pasted onto the integrated circuit that makes up the band select switch 52B. The PAIC 11P is made by a semiconductor process different from that for the integrated circuit that makes up the band select switch 52B.

The integrated circuit that makes up the band select switch 52B may include a plurality of the tunable second-order harmonic termination circuits 31. The integrated circuit that makes up the band select switch 52B may include a plurality of the tunable filters 41.

Incidentally, in FIG. 62, the impedance matching circuit 2b may be formed on or in the second member 120 described with reference to FIGS. 57A to 61. The drive-stage power amplifier circuit 1D may be similarly formed on or in the second member 120. The impedance matching circuit 2a may be similarly formed on or in the second member 120. The bias circuit B3 may be similarly formed on or in the second member 120.

Figure 63:
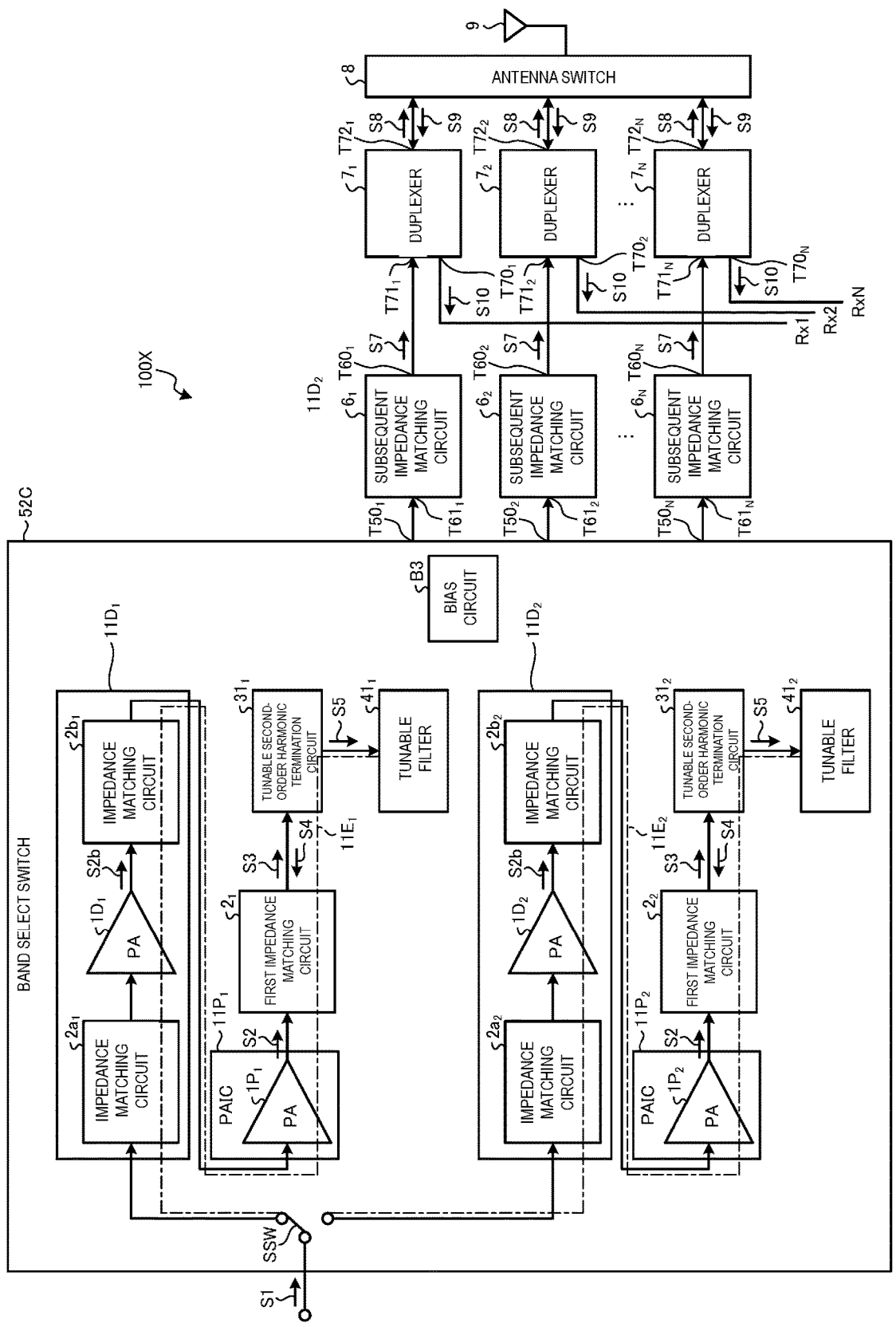
FIG. 63 is a diagram that shows the configuration of a power amplifier unit according to a twenty-fourth embodiment.

FIG. 63 is a diagram that shows the configuration of a power amplifier unit 100X according to a twenty-fourth embodiment. As shown in FIG. 63, the power amplifier unit 100X according to the twenty-fourth embodiment includes a band select switch 52C, a selector switch SSW, two paths $11E_1$, $11E_2$, and a bias circuit B3. The power amplifier unit 100X is able to input a first radio-frequency signal S1 to any one of the path $11E_1$ and the path $11E_2$ by switching the selector switch SSW. The selector switch SSW inputs a first radio-frequency signal S1 to any one of the path $11E_1$ and the path $11E_2$ in accordance with a signal from the control circuit (not shown).

The path $11E_1$ that is a first path includes an IC $11D_1$. The IC $11D_1$ includes a power amplifier circuit $1D_1$ and impedance matching circuits $2a_1$, $2b_1$. These components have similar functions to the components described with reference to FIG. 62, so the detailed description is omitted.

The path $11E_1$ includes the power amplifier circuit $1D_1$, the impedance matching circuits $2a_1$, $2b_1$, a PAIC $11P_1$, a first impedance matching circuit 21, a tunable second-order harmonic termination circuit $31_1$, and a tunable filter $41_1$. These components have similar functions to the components described with reference to FIG. 62, so the detailed description is omitted.

The path $11E_2$ that is a second path includes an IC $11D_2$. The IC $11D_2$ includes a power amplifier circuit $1D_2$ and impedance matching circuits $2a_2$, $2b_2$. These components have similar functions to the components described with reference to FIG. 62, so the detailed description is omitted.

The path $11E_2$ includes the power amplifier circuit $1D_2$, the impedance matching circuits $2a_2$, $2b_2$, a PAIC $11P_2$, a first impedance matching circuit 22, a tunable second-order harmonic termination circuit $31_2$, and a tunable filter $41_2$. These components have similar functions to the components described with reference to FIG. 62, so the detailed description is omitted.

The power amplifier unit 100X shown in FIG. 63, as in the case of the power amplifier unit 100W according to the twenty-third embodiment, is divided into the drive-stage power amplifier circuit $1D_1$ and a power-stage power amplifier circuit $1P_1$, and is divided into the drive-stage power amplifier circuit $1D_2$ and a power-stage power amplifier circuit $1P_2$.

The power amplifier unit 100X is able to input a first radio-frequency signal S1 to any one of the path $11E_1$ and the path $11E_2$ by switching the selector switch SSW. In other words, the path $11E_1$ and the path $11E_2$ are able to be selectively used. Thus, it is possible to select an appropriate path in accordance with a power mode and a frequency band. Therefore, the power amplifier unit 100X is able to achieve broadband and low power consumption by selecting an appropriate path.

The power amplifier unit 100X is implemented by the first member 110 and the second member 120 described with reference to FIGS. 57A to 61. In this case, the band select switch 52C, the first impedance matching circuit 2, the tunable second-order harmonic termination circuit 31, the tunable filter 41, the impedance matching circuit 2b, the drive-stage power amplifier circuit 1D, the impedance matching circuit 2a, and the bias circuit B3 in the power amplifier unit 100X are, for example, formed on or in the first member 110. The power-stage PAIC 11P in the power amplifier unit 100X is, for example, formed on or in the second member 120.

Figure 64:
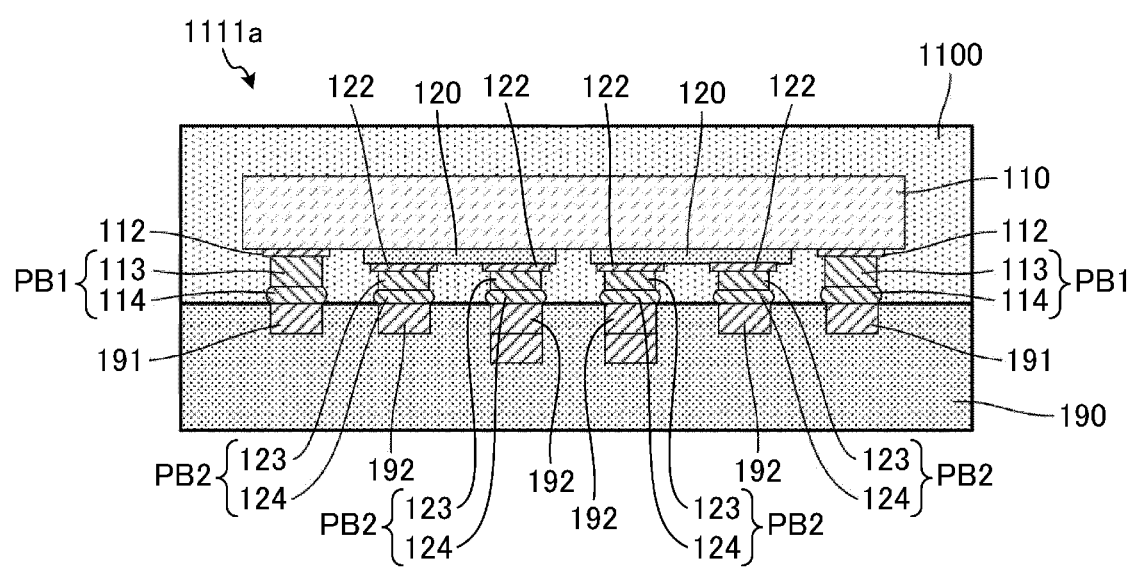
FIG. 64 is a view that shows an implementation example of the power amplifier unit shown in FIG. 63.

Here, the second member 120 may be one as described with reference to FIG. 57B or may be divided into multiple pieces. FIG. 64 is a view that shows an implementation example of the power amplifier unit 100X shown in FIG. 63. As shown in FIG. 64, in a module 1111a, two second members 120 are connected to the first member 110. In the power amplifier unit 100X, since the second member 120 is mounted in two separate areas, the flexibility of layout increases. With an increase in the flexibility of layout, an area in which the second member 120 is mounted is able to be reduced, with the result that the module 1111a is able to be implemented with a smaller size. Thus, it is possible to reduce a manufacturing cost.

The impedance matching circuit $2a_1$ in the path $11E_1$ may be formed on or in the second member 120. The impedance matching circuit $2a_2$ in the path $11E_2$ may be formed on or in the second member 120. The impedance matching circuit $2b_1$ in the path $11E_1$ may be formed on or in the second member 120. The impedance matching circuit $2b_2$ in the path $11E_2$ may be formed on or in the second member 120. The power amplifier circuit $1D_1$ in the path $11E_1$ may be formed on or in the second member 120. The power amplifier circuit $1D_2$ in the path $11E_2$ may be formed on or in the second member 120. The bias circuit B3 may be similarly formed on or in the second member 120. The elements in each of the two paths may be formed in the single second member 120. With this configuration, a manufacturing cost is reduced.

In the power amplifier unit 100X described with reference to FIG. 63, two paths $11E_1$, $11E_2$ are provided, and these are selectively used. Alternatively, three or more paths may be provided, and those may be selectively used. By preparing a larger number of types of paths and selecting a further appropriate path, it is possible to achieve broadband and low power consumption.

Figure 65:
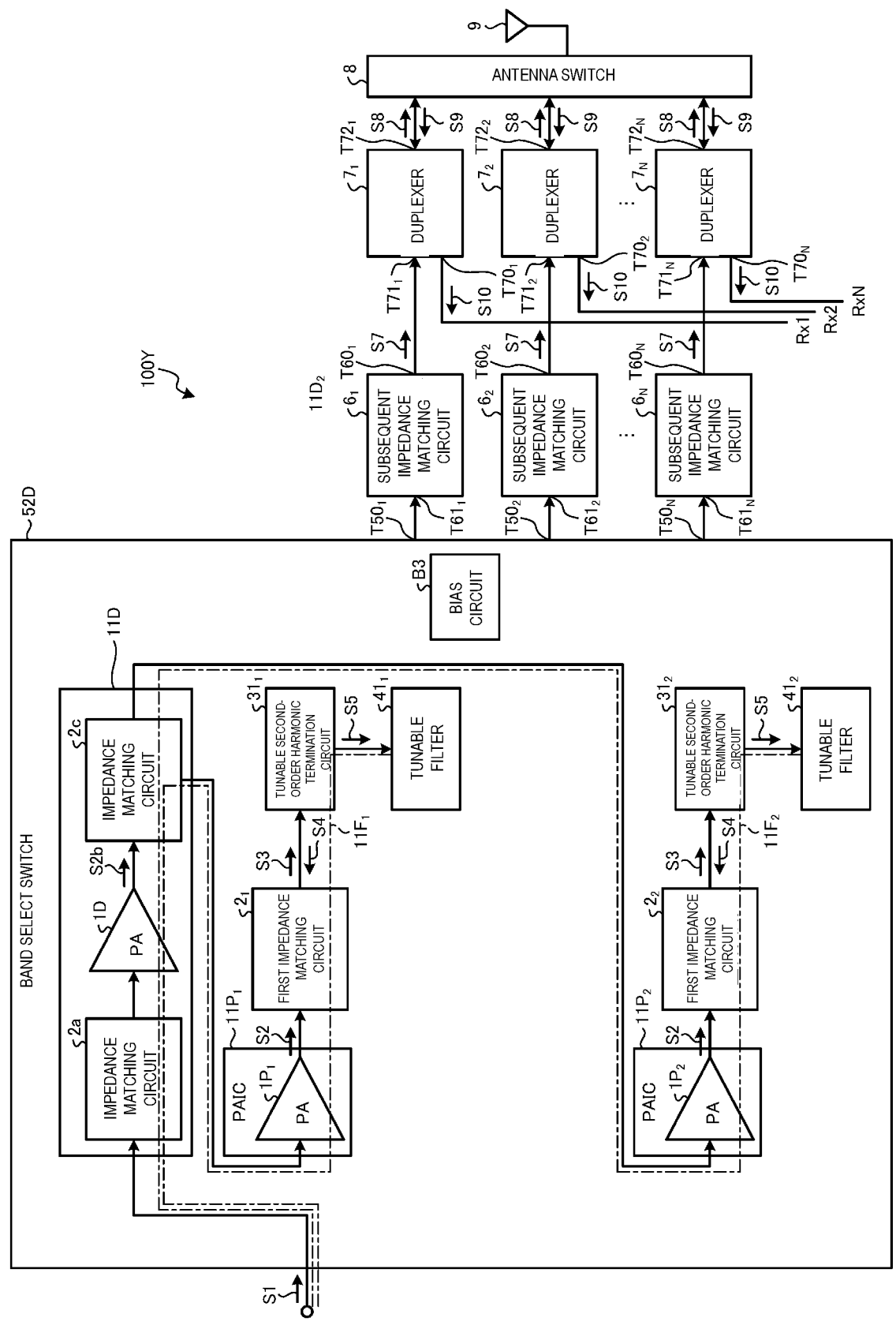
FIG. 65 is a diagram that shows the configuration of a power amplifier unit according to a twenty-fifth embodiment.

FIG. 65 is a diagram that shows the configuration of a power amplifier unit 100Y according to a twenty-fifth embodiment. As shown in FIG. 65, the power amplifier unit 100Y according to the twenty-fifth embodiment includes an IC 11D, a band select switch 52D and a bias circuit B3. The power amplifier unit 100Y according to the twenty-fifth embodiment has two paths $11F_1$, $11F_2$. An IC 11D is included in each of the two paths $11F_1$, $11F_2$. The IC 11D includes the power amplifier circuit 1D and impedance matching circuits 2a, 2c. The power amplifier circuit 1D and the impedance matching circuit 2a have similar functions to the components described with reference to FIG. 62, so the detailed description is omitted. By performing switching in the impedance matching circuit 2c, the IC 11D that generates a signal to be input to the power-stage power amplifier circuits $1P_1$, $1P_2$ is able to be integrated. Therefore, the same signal is able to be input to the power amplifier circuits $1P_1$, $1P_2$.

The path $11F_1$ includes a PAIC $11P_1$, a first impedance matching circuit $2_1$, a tunable second-order harmonic termination circuit $31_1$, and a tunable filter $41_1$. These components have similar functions to the components described with reference to FIG. 62, so the detailed description is omitted.

The path $11F_2$ includes a PAIC $11P_2$, a first impedance matching circuit $2_2$, a tunable second-order harmonic termination circuit $31_2$, and a tunable filter $41_2$. These components have similar functions to the components described with reference to FIG. 62, so the detailed description is omitted.

The power amplifier unit 100Y shown in FIG. 65 includes the integrated drive-stage power amplifier circuit 1D and the divided power-stage power amplifier circuits $1P_1$, $1P_2$.

With the power amplifier unit 100Y, one of the path $11F_1$ and the path $11F_2$ is able to be selected. A path is selected by operating any one of the PAIC $11P_1$ and the PAIC $11P_2$ through application of a bias current to an intended one of the PAIC $11P_1$ and the PAIC $11P_2$. Thus, the elements of one of the two paths $11F_1$, $11F_2$ are able to be operated. The impedance matching circuit 2c may include a single pole N-through (SPnT) switch (not shown) connected to the power amplifier circuit $1P_1$ of the PAIC $11P_1$ and the power amplifier circuit $1P_2$ of the PAIC $11P_2$. By selecting a path including an intended PAIC with the switch, any one of the PAICs is operated. Thus, the elements of one of the two paths $11F_1$, $11F_2$ are able to be operated.

The power amplifier unit 100Y is implemented by the first member 110 and the second member 120 described with reference to FIGS. 57A to 61. In this case, the band select switch 52D, the first impedance matching circuits $2_1$, $2_2$, the tunable second-order harmonic termination circuits $31_1$, $31_2$, the tunable filters $41_1$, $41_2$, the impedance matching circuits 2c, the drive-stage power amplifier circuits 1D, the impedance matching circuits 2a, and the bias circuit B3 in the power amplifier unit 100Y are, for example, formed on or in the first member 110. The power-stage PAIC 11P in the power amplifier unit 100Y is, for example, formed on or in the second member 120.

Here, the second member 120 may be one as described with reference to FIG. 57B or may be divided into multiple pieces as described with reference to FIG. 64. When the second member 120 is mounted in two separate areas, the flexibility of layout increases. With an increase in the flexibility of layout, an area in which the second member 120 is mounted is able to be reduced, with the result that the module is able to be implemented with a smaller size. Thus, it is possible to reduce a manufacturing cost.

The impedance matching circuit 2a in the path $11F_1$ may be formed on or in the second member 120. The impedance matching circuit 2a in the path $11F_2$ may be formed on or in the second member 120. The impedance matching circuit 2c in the path $11F_1$ may be formed on or in the second member 120. The impedance matching circuit 2, in the path $11E_2$ may be formed on or in the second member 120. The power amplifier circuit 1D in the path $11F_1$ may be formed on or in the second member 120. The power amplifier circuit 1D in the path $11F_2$ may be formed on or in the second member 120. The bias circuit B3 may be similarly formed on or in the second member 120.

In the power amplifier unit 100Y described with reference to FIG. 65, two paths $11F_1$, $11F_2$ are provided, and these are selectively used. Alternatively, three or more paths may be provided, and those may be selectively used. By preparing a larger number of types of paths and selecting a further appropriate path, it is possible to achieve broadband and low power consumption.

What is claimed is:

1. A power amplifier unit comprising:
  a power amplifier circuit that has a first input terminal and a first output terminal, the power amplifier circuit being configured to amplify a first radio-frequency signal containing a fundamental and input to the first input terminal and being configured to output a second radio-frequency signal containing a fundamental, an even-ordered harmonic, and an odd-ordered harmonic from the first output terminal;
  a first impedance matching circuit that has a second input terminal and a second output terminal, the second input terminal being connected to the first output terminal of the power amplifier circuit, and the first impedance matching circuit being configured to output the second radio-frequency signal, input to the second input terminal, from the second output terminal as a third radio-frequency signal and convert an impedance between the second input terminal and the second output terminal;

a tunable harmonic termination circuit that has a third input terminal and a third output terminal, the third input terminal being connected to the second output terminal of the first impedance matching circuit, and the tunable harmonic termination circuit being configured to reflect at least part of the even-ordered harmonic and the odd-ordered harmonic contained in the third radio-frequency signal input to the third input terminal to output the at least part of the even-ordered harmonic and the odd-ordered harmonic from the third input terminal as a fourth radio-frequency signal and output a fifth radio-frequency signal, containing the fundamental and the remainder of the even-ordered harmonic and the odd-ordered harmonic, from the third output terminal such that the tunable harmonic termination circuit is configured to change the first phase or the second phase in accordance with the frequency of the fundamental;

a tunable filter that has a fourth input terminal and a fourth output terminal, the fourth input terminal being connected to the third output terminal of the tunable harmonic termination circuit, the tunable filter being configured to attenuate the at least part of the even-ordered harmonic and the odd-ordered harmonic contained in the fifth radio-frequency signal input to the fourth input terminal and output a sixth radio-frequency signal, containing the fundamental and the remainder of the even-ordered harmonic and the odd-ordered harmonic, from the fourth output terminal, and the tunable filter having frequency characteristics including a first frequency range in which part of the fifth radio-frequency signal is allowed to pass to the fourth output terminal, and a second frequency range in which part of the fifth radio-frequency signal input to the fourth input terminal is attenuated, and being configured to change between the first frequency range and the second frequency range in accordance with the fundamental;

a band select switch that has a fifth input terminal and a plurality of fifth output terminals, the fifth input terminal being connected to the fourth output terminal of the tunable filter, and the band select switch being configured to select a propagation path of a radio-frequency signal by connecting the fifth input terminal with at least one of the fifth output terminals in accordance with the frequency of the fundamental;

a plurality of second impedance matching circuits respectively in association with the plurality of fifth output terminals of the band select switch, each of the second impedance matching circuits having a sixth input terminal and a sixth output terminal, the sixth input terminal being connected to an associated one of the fifth output terminals, and each of the plurality of second impedance matching circuits being configured to convert an impedance between the sixth input terminal and the sixth output terminal; and a plurality of duplexers respectively in association with the plurality of second impedance matching circuits, each of the duplexers having a seventh input terminal, a seventh output terminal, and an input/output terminal, the seventh input terminal being connected to the sixth output terminal of an associated one of the second impedance matching circuits, an eighth radio-frequency signal being output from the input/output terminal in accordance with the frequency of a seventh radio-frequency signal input to the seventh input terminal, and a tenth radio-frequency signal being output from the seventh output terminal in accordance with the frequency of a ninth radio-frequency signal input to the input/output terminal, wherein the fourth radio-frequency signal contains at least a second-order harmonic, the second-order harmonic reaches the first output terminal of the power amplifier circuit with a first phase via the first impedance matching circuit, and the eighth radio-frequency signal or the tenth radio-frequency signal is output via the second impedance matching circuit and the duplexer that are connected to the propagation path selected by the band select switch.

2. The power amplifier unit according to claim 1, wherein the first impedance matching circuit includes a transmission line transformer, the transmission line transformer includes
a first transmission line and a second transmission line disposed at different locations in a thickness direction of a substrate and connected in series, and
a third transmission line disposed between the first transmission line and the second transmission line in the thickness direction of the substrate, wherein a first end portion that is one end portion of the third transmission line is connected to one end portion of the first transmission line, and a second end portion that is the other end portion of the third transmission line is grounded, and the first transmission line and the second transmission line are electromagnetically coupled to the third transmission line.

3. The power amplifier unit according to claim 1, wherein at least part of the power amplifier circuit and at least part of the first impedance matching circuit are in the same integrated circuit.

4. The power amplifier unit according to claim 1, wherein at least part of the tunable filter and at least part of the tunable harmonic termination circuit are in the same integrated circuit.

5. The power amplifier unit according to claim 1, wherein the band select switch includes at least part of the first impedance matching circuit.

6. The power amplifier unit according to claim 1, wherein the band select switch includes at least part of the tunable filter.

7. The power amplifier unit according to claim 1, wherein the tunable harmonic termination circuit further incudes a first terminal and a second terminal between the third input terminal and the third output terminal, at least one series resonant circuit or at least one parallel resonant circuit, which includes a capacitor and an inductor between the first terminal and the second terminal, one end of the resonant circuit is connected to a reference potential, and the other end of the resonant circuit is connected to both the third input terminal and the third output terminal of the tunable harmonic termination circuit, and at least part of the even-ordered harmonic and the odd-ordered harmonic contained in the third radio-frequency signal input to the third input terminal of the tunable harmonic termination circuit is reflected by resonance between the capacitor and the inductor.

8. The power amplifier unit according to claim 1, wherein
the tunable filter is between the fourth input terminal and the fourth output terminal and includes N-stage cascaded unit filter circuits, N being a natural number,
each of the unit filter circuits includes
a first terminal,
a second terminal,
a series resonant circuit or a parallel resonant circuit,
in the N-stage cascaded unit filter circuits,
the first terminal of the first-stage unit filter circuit is connected to the fourth input terminal,
the second terminal of the last-stage unit filter circuit is connected to the fourth output terminal, and
at least part of the even-ordered harmonic and the odd-ordered harmonic contained in the fifth radio-frequency signal input to the fourth input terminal of the tunable filter is attenuated by resonance between the capacitor and the inductor included in the resonant circuit.

9. The power amplifier unit according to claim 7, further comprising:
at least one of a first switch that is configured to select one from among a plurality of capacitor elements having different capacitance values and a second switch that is configured to select one from among a plurality of inductor elements having different inductance values, and
the capacitor element selected by the first switch is used as the capacitor or the inductor element selected by the second switch is used as the inductor.

10. The power amplifier unit according to claim 1, further comprising:
a first substrate having a first circuit including at least the band select switch; and
a second substrate having a second circuit including at least the power amplifier circuit, wherein
the second substrate is mounted on the first substrate,
the first substrate and the second substrate each have a circuit-to-circuit connection wire that electrically connects the first circuit and the second circuit,
the first substrate has a first conductor pillar bump, and
the second substrate has a second conductor pillar bump.

11. A power amplifier unit comprising:
a power amplifier circuit that has a first input terminal and a first output terminal, the power amplifier circuit being configured to amplify a first radio-frequency signal containing a fundamental and input to the first input terminal and output a second radio-frequency signal containing a fundamental, an even-ordered harmonic, and an odd-ordered harmonic from the first output terminal;
a first impedance matching circuit that has a second input terminal and a second output terminal, the second input terminal being connected to the first output terminal of the power amplifier circuit, and the first impedance matching circuit being configured to output the second radio-frequency signal, input to the second input terminal, from the second output terminal as a third radio-frequency signal and converts an impedance between the second input terminal and the second output terminal;
a band select switch that has a fifth input terminal and a plurality of fifth output terminals, the fifth input terminal being connected to an output terminal of the first impedance matching circuit, and the band select switch being configured to select a propagation path of the third radio-frequency signal by connecting the fifth input terminal to at least one of the fifth output terminals in accordance with the frequency of the fundamental contained in the third radio-frequency signal;
a plurality of harmonic termination circuits respectively in association with the plurality of fifth output terminals of the band select switch, each of the plurality of harmonic termination circuits having a third input terminal and a third output terminal, the third input terminal being connected to an associated one of the third output terminals, each of the plurality of harmonic termination circuits being configured to reflect at least part of the even-ordered harmonic and the odd-ordered harmonic contained in the third radio-frequency signal input to the fifth input terminal to output the at least part of the even-ordered harmonic and the odd-ordered harmonic from the third input terminal as a fourth radio-frequency signal and outputs a fifth radio-frequency signal, containing the fundamental and the remainder of the even-ordered harmonic and the odd-ordered harmonic, from the third output terminal;
a plurality of filters respectively in association with the plurality of harmonic termination circuits, each of the plurality of filters having a fourth input terminal and a fourth output terminal, the fourth input terminal being connected to the third output terminal of an associated one of the harmonic termination circuits, each of the plurality of filters being configured to attenuate at least part of the even-ordered harmonic and the odd-ordered harmonic input to the fourth input terminal and contained in the fifth radio-frequency signal and outputs a sixth radio-frequency signal, containing the fundamental and the remainder of the even-ordered harmonic and the odd-ordered harmonic, from the fourth output terminal; and
a plurality of duplexers respectively in association with the plurality of filters, each of the duplexers having a seventh input terminal, a seventh output terminal, and an input/output terminal, the seventh input terminal being connected to the fourth output terminal of an associated one of the second impedance matching circuits, an eighth radio-frequency signal being output from the input/output terminal in accordance with the frequency of the sixth radio-frequency signal input to the seventh input terminal, and a tenth radio-frequency signal being output from the seventh output terminal in accordance with the frequency of a ninth radio-frequency signal input to the input/output terminal,
wherein
the fourth radio-frequency signal contains at least a second-order harmonic,
the second-order harmonic reaches the first output terminal of the power amplifier circuit with a first phase via the first impedance matching circuit,
each of the plurality of harmonic termination circuits is configured to operate at a different frequency, and each of the plurality of filters is configured to operate at a different frequency, and
each of the plurality of duplexers is configured to operate at a different frequency.

12. The power amplifier unit according to claim 11, wherein
the first impedance matching circuit includes a transmission line transformer,
the transmission line transformer includes
a first transmission line and a second transmission line disposed at different locations in a thickness direction of a substrate and connected in series, and a third transmission line disposed between the first transmission line and the second transmission line in the thickness direction of the substrate, wherein a first end portion that is one end portion of the third transmission line is connected to one end portion of the first transmission line, and a second end portion that is the other end portion of the third transmission line is grounded, and the first transmission line and the second transmission line are electromagnetically coupled to the third transmission line.

13. The power amplifier unit according to claim 11, wherein
at least part of the power amplifier circuit and at least part of the first impedance matching circuit are in the same integrated circuit.

14. The power amplifier unit according to claim 11, wherein
at least part of the filter and at least part of the harmonic termination circuit are in the same integrated circuit.

15. The power amplifier unit according to claim 11, wherein
the band select switch includes at least part of the first impedance matching circuit.

16. The power amplifier unit according to claim 11, wherein
the band select switch includes at least part of the tunable filter.

17. The power amplifier unit according to claim 11, wherein
the harmonic termination circuit further incudes a first terminal and a second terminal between the third input terminal and the third output terminal,
at least one series resonant circuit or at least one parallel resonant circuit, which includes a capacitor and an inductor between the first terminal and the second terminal, one end of the resonant circuit is connected to a reference potential, and the other end of the resonant circuit is connected to both the third input terminal and the third output terminal of the harmonic termination circuit, and
at least part of the even-ordered harmonic and the odd-ordered harmonic contained in the third radio-frequency signal input to the third input terminal of the harmonic termination circuit is reflected by resonance between the capacitor and the inductor.

18. The power amplifier unit according to claim 11, wherein
the filter is between the fourth input terminal and the fourth output terminal and includes N-stage cascaded unit filter circuits, N being a natural number,
each of the unit filter circuits includes
a first terminal,
a second terminal,
a series resonant circuit or a parallel resonant circuit,
in the N-stage cascaded unit filter circuits,
the first terminal of the first-stage unit filter circuit is connected to the fourth input terminal,
the second terminal of the last-stage unit filter circuit is connected to the fourth output terminal, and
at least part of the even-ordered harmonic and the odd-ordered harmonic contained in the fifth radio-frequency signal input to the fourth input terminal of the filter is attenuated by resonance between the capacitor and the inductor included in the resonant circuit.

19. The power amplifier unit according to claim 17, further comprising:
at least one of a first switch that is configured to select one from among a plurality of capacitor elements having different capacitance values and a second switch that is configured to select one from among a plurality of inductor elements having different inductance values, and
the capacitor element selected by the first switch is used as the capacitor or the inductor element selected by the second switch is used as the inductor.

20. The power amplifier unit according to claim 11, further comprising:
a first substrate having a first circuit including at least the band select switch; and
a second substrate having a second circuit including at least the power amplifier circuit, wherein
the second substrate is mounted on the first substrate,
the first substrate and the second substrate each have a circuit-to-circuit connection wire that electrically connects the first circuit and the second circuit,
the first substrate has a first conductor pillar bump, and
the second substrate has a second conductor pillar bump.

* * * * *